(12) United States Patent
Yoshikawa

(10) Patent No.: US 8,809,911 B2
(45) Date of Patent: Aug. 19, 2014

(54) SEMICONDUCTOR DEVICE

(75) Inventor: Koh Yoshikawa, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 166 days.

(21) Appl. No.: 13/583,666

(22) PCT Filed: Oct. 19, 2011

(86) PCT No.: PCT/JP2011/074081
§ 371 (c)(1),
(2), (4) Date: Sep. 10, 2012

(87) PCT Pub. No.: WO2012/073609
PCT Pub. Date: Jun. 7, 2012

(65) Prior Publication Data
US 2013/0001638 A1  Jan. 3, 2013

(30) Foreign Application Priority Data
Nov. 30, 2010 (JP) ................... 2010-265920

(51) Int. Cl.
*H01L 29/66* (2006.01)

(52) U.S. Cl.
USPC ...... 257/197; 257/47; 257/205; 257/E29.197; 257/E29.198; 257/E29.2; 257/E29.201

(58) Field of Classification Search
CPC .......................... H01L 29/7393; H01L 29/783
USPC ............ 257/47, 197, 205, E29.197, E29.198, 257/E29.2, E29.201
See application file for complete search history.

(56) References Cited

U.S. PATENT DOCUMENTS 6,380,586 B1   4/2002  Yoshikawa
(Continued)

FOREIGN PATENT DOCUMENTS

| JP | 61-156882 A | 7/1986 |
|----|-------------|--------|
| JP | 2000-228519 A | 8/2000 |

(Continued)

OTHER PUBLICATIONS

ISR issued Jan. 10, 2012 for parent PCT/JP2011/74081.

*Primary Examiner* — Matthew W Such
*Assistant Examiner* — Samuel Lair
(74) *Attorney, Agent, or Firm* — Rossi, Kimms & McDowell LLP

(57) ABSTRACT

Plural gate trenches are formed in the surface of an n-type drift region. A gate electrode is formed across a gate oxide film on the inner walls of the gate trenches. P-type base regions are selectively formed so as to neighbor each other in the gate trench longitudinal direction between neighboring gate trenches. An n-type emitter region is formed in contact with the gate trench in a surface layer of the p-type base regions. Also, a p-type contact region with a concentration higher than that of the p-type base region is formed in the surface layer of the p-type base region so as to be in contact with the gate trench side of the n-type emitter region. An edge portion on the gate trench side of the n-type emitter region terminates inside the p-type contact region.

11 Claims, 40 Drawing Sheets

| 11 ··· | n-TYPE DRIFT REGION |
| 12a ··· | p-TYPE BASE REGION |
| 13,13a,13b ··· | GATE TRENCH |
| 14 ··· | GATE OXIDE FILM |
| 15 ··· | GATE ELECTRODE |
| 16a ··· | n-TYPE EMITTER REGION |
| 17a ··· | p-TYPE CONTACT REGION |
| 47 ··· | MESA REGION |

(56) References Cited

U.S. PATENT DOCUMENTS

| | | | |
|---|---|---|---|
| 7,205,628 B2 * | 4/2007 | Yoshimochi | 257/490 |
| 7,250,345 B2 * | 7/2007 | Nakamura et al. | 438/272 |
| 7,268,390 B2 * | 9/2007 | Ogura et al. | 257/330 |
| 8,143,124 B2 * | 3/2012 | Challa et al. | 438/270 |
| 2006/0163649 A1 | 7/2006 | Otsuki | |
| 2007/0040213 A1 * | 2/2007 | Hotta et al. | 257/330 |
| 2007/0215938 A1 * | 9/2007 | Yanagida et al. | 257/330 |
| 2008/0308839 A1 | 12/2008 | Okada | |
| 2010/0025759 A1 | 2/2010 | Yoshimochi | |
| 2012/0181575 A1 * | 7/2012 | Pfirsch | 257/139 |

FOREIGN PATENT DOCUMENTS

| | | |
|---|---|---|
| JP | 2001-274400 A | 10/2001 |
| JP | 2003-197912 A | 7/2003 |
| JP | 2005-183547 A | 7/2005 |
| JP | 2006-210547 A | 8/2006 |
| JP | 2007-221012 A | 8/2007 |
| JP | 2008-027945 A | 2/2008 |
| JP | 2008-135522 A | 6/2008 |
| JP | 2008-205500 A | 9/2008 |
| JP | 2008-311301 A | 12/2008 |
| JP | 2010-034285 | 2/2010 |

* cited by examiner

| 11 | ... | n-TYPE DRIFT REGION |
| 12a | ... | p-TYPE BASE REGION |
| 13,13a,13b | ... | GATE TRENCH |
| 14 | ... | GATE OXIDE FILM |
| 15 | ... | GATE ELECTRODE |
| 16a | ... | n-TYPE EMITTER REGION |
| 17a | ... | p-TYPE CONTACT REGION |
| 47 | ... | MESA REGION |

| 11 · · · | n-TYPE DRIFT REGION | 40,40a · · · | HOLE CURRENT FLOW |
| --- | --- | --- | --- |
| 12a,12b · · · | p-TYPE BASE REGION | 41 · · · | REGION IN WHICH HOLE CURRENTS COLLECT |
| 13,13a,13b · · · | GATE TRENCH | 47 · · · | MESA REGION |
| 14 · · · | GATE OXIDE FILM | | |
| 15 · · · | GATE ELECTRODE | | |
| 16a,16b · · · | n-TYPE EMITTER REGION | | |
| 17a,17b · · · | p-TYPE CONTACT REGION | | |

(a)          (b)

| 11 | · · · | n-TYPE DRIFT REGION |
| 12a,12b | · · · | p-TYPE BASE REGION |
| 13,13a,13b | · · · | GATE TRENCH |
| 14 | · · · | GATE OXIDE FILM |
| 15 | · · · | GATE ELECTRODE |
| 16a,16b | · · · | n-TYPE EMITTER REGION |
| 17a,17b | · · · | p-TYPE CONTACT REGION |

| 40,40a | · · · | HOLE CURRENT FLOW |
| 41 | · · · | REGION IN WHICH HOLE CURRENTS COLLECT |
| 47 | · · · | MESA REGION |

FIG. 11
(a)
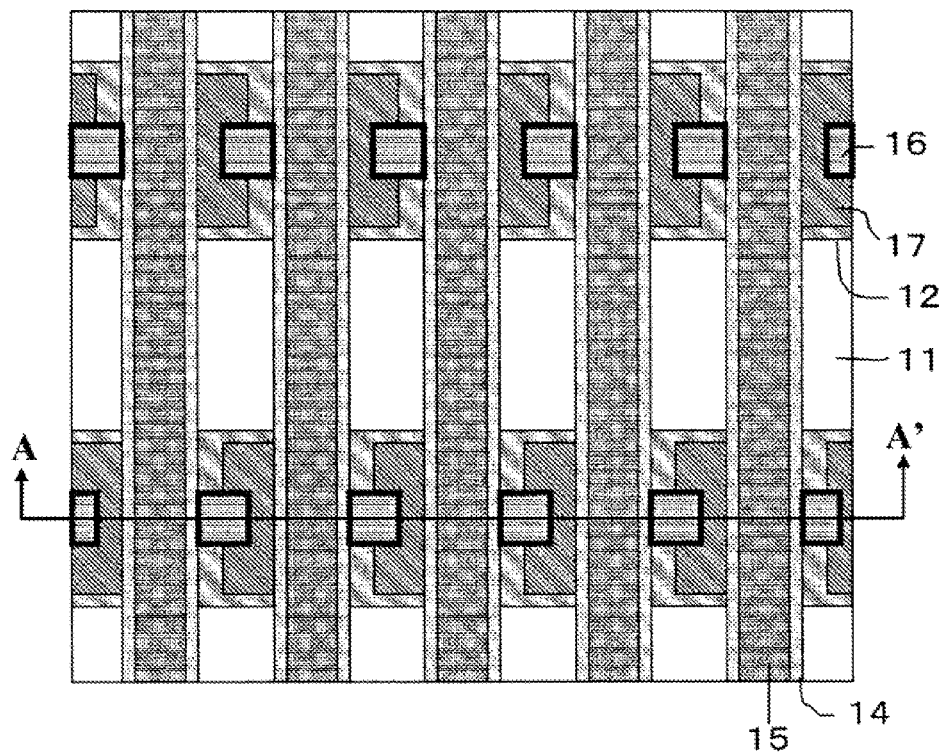
(b)
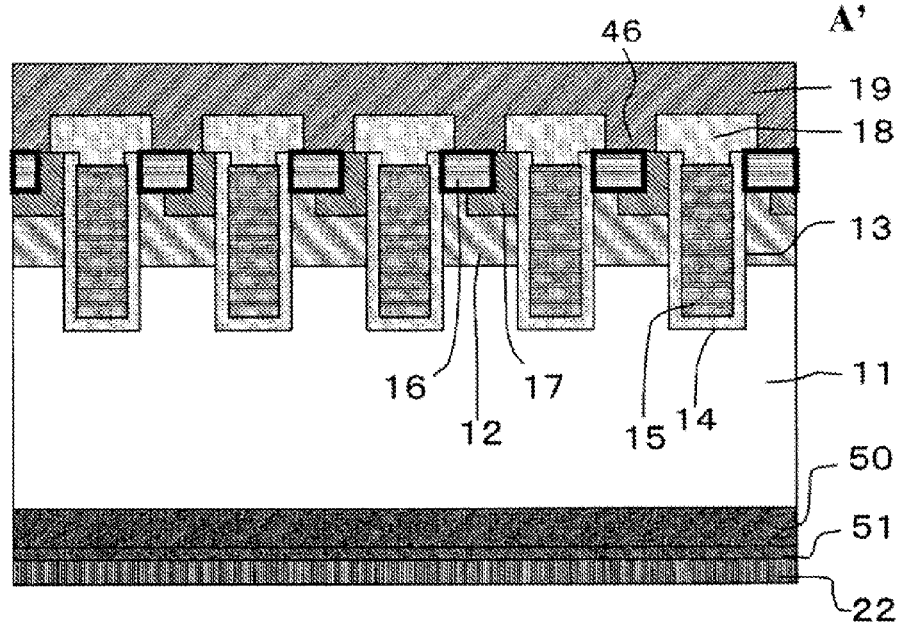

(a) (b)

SEMICONDUCTOR DEVICE

This application is a U.S. National Phase Application of PCT International Application PCT/JP2011/074081 filed on Oct. 19, 2011 which is based on and claims priority from JP 2010-265920 filed on Nov. 30, 2010 the contents of which is incorporated in its entirety by reference.

TECHNICAL FIELD

The present invention relates to the structure of a semiconductor device, particularly an insulated gate semiconductor device (IGBT) used in a power conversion device, or the like.

BACKGROUND ART

In response to a demand for miniaturization and increased performance of power source instruments in the field of power electronics in recent years, efforts are being centered on increasing breakdown voltage and increasing current in power semiconductor devices, as well as improving performance with regard to reducing loss, increasing damage tolerance, and increasing speed. Then, a vertical trench MOS (metal/oxide/semiconductor) gate power device is used as a power semiconductor device with which increased current and reduced loss are possible.

An MOS power device, in particular an IGBT, is driven by an MOS gate, and two kinds of structure are widely known—a planar structure wherein a plate-like gate electrode is provided across an insulating film on a semiconductor substrate, and a trench structure wherein a gate electrode is embedded across an insulating film inside a semiconductor substrate. Among recent vertical devices, a structure wherein a gate electrode is embedded inside a trench—a so-called trench gate type—is attracting attention. With a trench gate type vertical device, it is structurally easy to obtain a low on-resistance characteristic.

A typical structure of this kind of trench gate type IGBT is a structure wherein a p-type base region and an n-type drift region with a concentration lower than that of the base region appear alternately in the longitudinal direction of a gate trench in which a gate electrode is embedded across an insulating film (for example, refer to Patent Document 1 below). The vertical trench gate type IGBT is commonly known as an IGBT with which low on-resistance and high breakdown voltage can be simultaneously realized. In the following description, a device means a vertical type unless particularly stated otherwise.

A description will be given, while referring to FIGS. 33 to 35, of a structure of the trench gate type IGBT and operations thereof. FIG. 33 is a plan view schematically showing main portions of a heretofore known semiconductor device. Also, FIG. 34 is an explanatory diagram schematically showing main portions of the heretofore known semiconductor device. FIG. 35 is a sectional view schematically showing main portions of the heretofore known semiconductor device. FIG. 33(a) shows a planar structure of the heretofore known trench gate type IGBT shown in FIG. 34(a). FIG. 34(a) is a perspective view showing the structure of the heretofore known trench gate type IGBT. Then, FIGS. 33(b), 34(b), 35(a), and 35(b) show current paths of the heretofore known trench gate type IGBT shown in FIG. 34(b).

As shown in FIG. 34(a), a p-type base region 12 is selectively provided on one main surface (hereafter referred to as the front surface) of a semiconductor substrate, which is an n-type drift region 11. The p-type base region 12 and n-type drift region 11 are alternately exposed on the front surface of the semiconductor substrate. Also, a large number of gate trenches 13 are provided intersecting the p-type base region 12 on the front surface of the semiconductor substrate. The gate trench 13 is formed penetrating the p-base region 12 to a depth reaching the n-type drift region 11. A gate oxide film 14 is formed on the inner wall of the gate trench 13, and furthermore, a gate electrode 15 formed of poly-crystalline silicon (Si), or the like, is formed buried in the interior of the gate oxide film 14.

Then, a p-type contact region 17 is disposed between neighboring gate trenches 13, distanced from the gate trenches 13, in a surface layer of the p-type base region 12. Also, an n-type emitter region 16 is provided, adjacent to each of the p-type contact region 17 and gate trench 13, in the surface layer of the p-type base region 12. An n-type field stop region 50 and a p-type collector region 51 are provided on the other main surface (hereafter referred to as the rear surface) of the semiconductor substrate. The n-type field stop region 50 is provided between the n-type drift region 11 and p-type collector region 51. A collector electrode 22 is in contact with the p-type collector region 51.

FIG. 34(b) is a sectional view along a cross-section A of the trench gate type IGBT shown in FIG. 34(a). FIG. 34(b) schematically shows current paths in the cross-section A. The cross-section A is a cross-section that intersects the lateral direction of the gate trench 13. As shown in FIG. 34(b), an insulating film 18 is provided on the front surface (hereafter referred to as the top surface) of the gate electrode 15. An emitter electrode 19 formed of, for example, aluminum (Al), or the like, is formed over the whole of an active region on the front surface of the semiconductor substrate. The emitter electrode 19 is in ohmic contact with the n-type emitter region 16 and p-type contact region 17. Also, the emitter electrode 19 and gate electrode 15 are dielectrically isolated by the insulating film 18.

In the heretofore known trench gate type IGBT, an n-type inversion layer is formed in a region of the p-type base region 12 along the trench by applying a voltage of a predetermined threshold value or higher to the gate electrode 15, and a current path passing through the n-type inversion layer is formed, as shown in FIG. 34(b). Because of this, there is an on-condition between the emitter and collector of the trench gate type IGBT. Meanwhile, by reducing the voltage of the gate electrode 15 to the threshold value or lower, the n-type inversion layer of the p-type base region 12 disappears, and there is an off-condition between the emitter and collector of the trench gate type IGBT.

FIG. 35(a) is a sectional view along a cross-section B of the trench gate type IGBT shown in FIG. 34(a). Also, FIG. 35(b) is a sectional view along a cross-section C of the trench gate type IGBT shown in FIG. 34(a). FIGS. 35(a) and 35(b) schematically show current paths in the cross-sections B and C respectively. The cross-section B is a cross-section along a side wall in the longitudinal direction of the gate trench 13. The cross-section C is a cross-section that intersects the p-type base region 12 between neighboring gate trenches 13 parallel to the gate trench longitudinal direction.

As shown in FIGS. 35(a) and 35(b), according to the heretofore known trench gate type IGBT, trench type (FIG. 35(a)) and planar type (FIG. 35(b)) current paths are formed in the longitudinal direction of the gate trench 13. Because of this, the area of the current paths increases dramatically in comparison with a heretofore known planar type or trench type vertical IGBT. Furthermore, an accumulation of minority carriers occurs in a region in which the n-type semiconductor substrate is exposed between gate trenches 13 on the front surface side of the semiconductor substrate, and there arises an advantage in that it is possible to reduce on-resistance.

A planar structure of one portion of the heretofore known trench gate type IGBT shown in FIG. 34(a) is shown in configuration units in FIG. 33(a). As shown in FIG. 33(a), the p-type base region 12 is disposed in a mesa region 47 between neighboring gate trenches 13 so as to be in contact with each gate trench 13. The n-type emitter region 16 forming an H-shape is provided in the p-type base region 12 so as to be in contact with each of the neighboring gate trenches 13. Also, the p-type contact region 17 is disposed in an approximate central portion of the p-type base region 12 in order to prevent a latch-up of a parasitic thyristor portion. Herein, the n-type emitter region 16 is formed so as to straddle the top surface of the p-type contact region 17. That is, an edge portion of the n-type emitter region 16 does not terminate inside the p-type contact region 17.

In this type of heretofore known trench gate type IGBT, a hole current flows in the following way. FIG. 33(b) is a plan view wherein a hole (also called positive hole) current flow 40 when a current is flowing through the IGBT with the gate of the IGBT in an on-condition, and a region 41 in which hole currents collect, are schematically shown in the plan view of the heretofore known IGBT shown in FIG. 33(a). When the gate of the IGBT is in an on-condition, as heretofore described, electrons are implanted from the MOS gate into the n-type drift region 11. The electrons implanted into the n-type drift region 11 reach a p-type collector region of the IGBT omitted from the drawing. Then, holes are implanted from the p-type collector region into the n-type drift region 11, and flow toward the p-type base region 12 of the front surface of the IGBT following an electrostatic potential distribution.

At this time, the holes are attracted toward the electrons by coulomb force, and flow toward an electron inversion layer (also called a channel, or inversion layer channel) formed in a region of the p-type base region 12 in contact with a side wall of the gate trench 13. That is, as indicated by arrows in FIG. 33(b), the hole current flows 40 mainly concentrate in the region of the p-type base region 12 in contact with a side wall of the gate trench 13. Because of this, the hole current is such that there are sufficiently few components of the hole current that pass from the n-type drift region 11 through the p-type contact region 17 after passing directly through the p-type base region 12.

Also, as another example of the trench gate type IGBT, there is disclosed an IGBT wherein the disposition of a contact aperture portion is innovated in an IGBT with a structure similar to that of Patent Document 1 below (for example, refer to Patent Document 2 below). A description will be given, referring to FIGS. 36 to 38, of the IGBT wherein the disposition of the contact aperture portion is innovated. FIGS. 36 to 38 are plan views schematically showing main portions of another example of the heretofore known semiconductor device. FIG. 37 shows the hole current flow and the region 41 in which hole currents collect in the heretofore known trench gate type IGBT shown in FIG. 36.

FIG. 38 shows a planar structure of a minimum unit in a surface portion in the heretofore known trench gate type IGBT shown in FIG. 36. As shown in FIG. 38, a contact aperture 46 longer in the longitudinal direction (vertically in the plane of the drawing) of the gate trench 13 than the n-type emitter region 16 is formed in order to improve the latch-up capability of the IGBT. Also, as shown in FIGS. 36 and 37, plural p-type base regions 12 formed between two gate trenches 13 are disposed in like a check pattern.

Furthermore, as another example of the trench gate type IGBT, there is disclosed an IGBT wherein the disposition of the n-type emitter region 16 is innovated (for example, refer to Patent Document 3 below). A description will be given, referring to FIG. 39, of the IGBT wherein the disposition of the n-type emitter region 16 is innovated. FIG. 39 is a perspective view schematically showing main portions of another example of the heretofore known semiconductor device. As shown in FIG. 39, the n-type emitter region 16 in contact with only one gate trench 13 in a region between two neighboring gate trenches 13 is disposed so as to be in contact with the two gate trenches 13 alternately. By the n-type emitter region 16 being disposed in this way, the latch-up capability is improved.

Also, as another example of the trench gate type IGBT, there is disclosed a structure wherein a contact trench with an object of contact with the emitter electrode is formed in a mesa region between two gate trenches, and a desired region (n-type emitter region, p-type contact region, contact portion, or the like) is formed in accordance with the form of the contact trench (for example, refer to Patent Document 4 below). By this kind of contact trench being formed, the width of a contact region formed between two gate trenches is made one region smaller, enabling a miniaturization of a surface pattern.

RELATED ART DOCUMENTS

Patent Documents

Patent Document 1: JP-A-2000-228519 (FIGS. 6 and 7)
Patent Document 2: JP-A-2008-27945
Patent Document 3: JP-A-2008-205500
Patent Document 4: JP-A-2005-183547 (FIG. 1)

OUTLINE OF THE INVENTION

Problems to be Solved by the Invention

However, the following kinds of problem occur with the technologies shown in Patent Documents 1 to 4. Firstly, a description will be given of a degree of collection of hole currents and a planar distribution thereof, and problems regarding these and an IE (injection enhancement) effect. The IE effect, as is well known, refers to an effect that promotes an injection of electrons from the MOS gate, and a resultant injection of holes injected from the p-type collector region, by innovating the structure of the trench gate. FIG. 37 is a plan view showing the same kind of hole current flow 40 as in FIG. 33(b), the region 41 in which hole currents collect, and a region 43 in which the hole current is sparse, schematically shown in the plan view of the heretofore known IGBT shown in FIG. 36.

First, attention will be focused on a certain p-base region 12 and the vicinity thereof. Herein, the vicinity of the p-base region 12 refers to, for example, a circular region when having a radius of a length in the region of that of the p-type base region 12. When holes flow toward the inversion layer channel of the trench side wall, the region 43 in which the hole current is comparatively sparse is formed in the mesa region 47 between p-type base regions 12 neighboring each other in the longitudinal direction of the gate trench 13.

As the top surface of the region 43 in which the hole current is sparse is covered by the unshown insulating film 18, holes themselves are accumulated. However, as the collection of the hole current is sparse, it is not always the case that the augmentation of the IE effect is sufficient. Furthermore, the same also applies to the central portion of the p-type base region 12. That is, a p-n junction, omitted from the drawing, between the p-type base region 12 and n-type drift region 11 is formed in the central portion of the p-type base region 12, and the p-n junction is constantly in a reverse biased condition. Because of this, carriers do not accumulate in the vicinity of the p-n junction between the p-type base region 12 and n-type drift region 11.

Next, attention will be focused on a region wider than the vicinity of the p-type base region 12, as shown in FIG. 36. Firstly, the gate trench 13 and p-type base region 12 are taken as a unit structure (the region bounded by dashed lines in FIG. 36). The unit structure is cyclically, repeatedly disposed in the lateral direction (a horizontal direction in the plane of the drawing) of the gate trench 13, forming the active region of the IGBT. This cyclically structured unit structure is referred to as a unit cell 42. Next, to schematically show the hole current flowing with the gate in an on-condition, the hole current flow 40 flows into the region of the p-type base region 12 in contact with the gate trench 13, as indicated by arrows in FIG. 37. As can be seen from FIG. 37, the region 41 in which hole currents collect and the region 43 in which the hole current is sparse are distributed in a stripe form at the same pitch (cycle) as the lateral direction of the gate trench 13.

As the hole current flows like the hole current flow 40, the region 41 in which hole currents collect concentrates in the gate trench 13, and is formed continuously in the longitudinal direction of the gate trench 13. Meanwhile, as the region 41 in which hole currents collect is not distributed continuously in the lateral direction of the gate trench 13, the p-type base region 12 and hole current are divided by the region 43 in which the hole current is sparse. The reason for this is that, as the central portion of the p-type base region 12 is distanced from each of the gate trenches 13 on either side by an amount equivalent to the n-type emitter region 16, it is a place in which it is difficult for hole currents to collect.

Furthermore, as a central portion of the n-type drift region 11 between p-type base regions 12 neighboring each other in the lateral direction of the gate trench 13 is distanced from the hole current flow 40, it is also a place in which it is difficult for hole currents to collect. Consequently, as the region 41 in which hole currents collect is not formed continuously in the lateral direction of the gate trench 13, it is divided. As the region 41 in which hole currents collect is divided in the lateral direction of the gate trench 13 in this way, the IE effect itself is strong with the heretofore known trench gate type IGBT, but there is a limit to the strength.

In order to augment the IE effect in the trench gate type IGBT shown in FIG. 36, further reducing the on-voltage, there is a method whereby the pitch (the unit length of the repeated cycle, the distance between neighboring gate trenches 13) in the lateral direction of the gate trench 13 is shortened. In order to shorten the pitch in the lateral direction of the gate trench 13, it is necessary to shorten the width of the mesa region 47 with respect to the width in the lateral direction of the gate trench 13. However, the minimum linear width (deign rule) that can be processed is determined by the manufacturing device of the manufacturing process.

Because of this, the widths of the n-type emitter region 16, p-type contact region 17, and contact aperture portion formed in the surface of the p-type base region 12 are also inevitably determined by the manufacturing device of the manufacturing process. Then, even assuming that the mask width of the gate trench 13 is practically the minimum linear width, the width of the p-type base region 12 is determined by the widths of other regions formed in the surface of the p-type base region 12. Consequently, in the case of the trench gate type IGBT shown in FIG. 36, the width of the p-type base region 12 is approximately 3 times to several times the width of the gate trench 13. That is, as it is not possible to further reduce the width ratio of the width of the p-type base region 12 with respect to the gate trench 13, there is also a limit to the reduction of the pitch of the gate trench 13.

Meanwhile, there is also a structure wherein the n-type emitter region 16 is provided so as to be in contact with only one gate trench 13, of two gate trenches 13 in contact with the mesa region 47, in the surface layer of the p-type base region 12 uniformly formed in the longitudinal direction of the gate trench 13, as in the trench gate type IGBT shown in FIG. 39. With a trench gate type IGBT having this kind of structure, it is possible to reduce the width of the mesa region 47 further than with the trench gate type IGBT shown in FIG. 33 or FIG. 36.

However, when adopting a structure wherein the n-type emitter region 16 is formed in only one gate trench 13, as in the trench gate type IGBT shown in FIG. 39, the density of an electron channel formed in the side wall of the gate trench 13 decreases, and the electron injection efficiency also decreases commensurately. Because of this, even assuming that the pitch of the gate trench 13 is reduced, the augmentation of the IE effect is limited.

Furthermore, a method whereby the width of the mesa region is reduced by forming a contact trench, as in the trench gate type IGBT shown in Patent Document 4, is also conceivable, but the formation of the contact trench has a high degree of technical difficulty, and also, the number of steps involved in trench etching increases. Because of this, processing cost increases, leading to an increase in chip cost.

Next, a description will be given, using FIG. 38, of problems with hole path and latch-up. In a trench gate type IGBT with the structure shown in FIG. 38, the contact aperture portion 46 of a length greater than the length of the n-type emitter region 16 in the longitudinal direction of the gate trench 13 is provided in order to improve the latch-up capability. With this kind of structure, it is possible to a certain degree to cause holes liable to collect in an electron channel (inversion layer) formed between the p-type base region 12 and side wall of the gate trench 13 to disperse to the contact aperture portion 46.

However, holes also collect in a channel formed in the p-type base region adjacent across the gate trench 13. That is, as holes are liable to collect in the gate trench 13 sandwiched by neighboring p-type base regions 12, the collected holes eventually pass under the n-type emitter region 16, and pass out into the p-type contact region 17 from the p-type base region 12. As a result of this, the possibility of parasitic thyristor latch-up still remains in the trench gate type IGBT shown in FIG. 38 too. Consequently, it is necessary to further reduce hole currents collected in the vicinity of the n-type emitter region 16.

Next, a description will be given of a place in which hole currents gather and the problem of an increase in electrical field strength in the vicinity thereof. In the case of a trench gate type IGBT with the structure described in Patent Document 2, holes flowing from the p-type collector region, omitted from the drawing, on the rear surface of the substrate toward the front surface of the substrate, collect in a lower portion of the gate trench 13 in accordance with the hole current flow 40, and the region 41 in which hole currents collect is formed, as shown in FIG. 37. That is, holes concentrate in the gate trench 13. This kind of hole concentration also occurs in Patent Document 1, in which the p-type base region 12 is distributed in a stripe form.

Meanwhile, the gate trench 13 is formed so as to penetrate the p-type base region 12, and protrude into the n-type drift region 11, as also shown in FIG. 34(a). Because of this, in a condition in which a high voltage is applied when turning off, the electrical field strength in the vicinity of the bottom portion of the gate trench 13 protruding into the n-type drift region 11 increases markedly. Holes accumulated when the gate is on collect in the portion in which the electrical field strength increases. Because of this, the spatial gradient of the electrical field increases when turning off, and the electrical field strength increases further.

Then, when the electrical field strength reaches a critical electrical field strength, holes are generated due to avalanche breakdown, and hole currents concentrate in the bottom portion of the gate trench 13. The hole currents caused by the avalanche breakdown cause a further augmentation of the electrical field strength in the bottom portion of the gate trench 13, and positive feedback of hole concentration and electrical field strength occurs. As a result of this, in a condition in which, for example, a current several times larger than the rated current is turned off at a high voltage near the rated voltage, there is an increased possibility of destruction occurring in the bottom portion of the gate trench 13.

Next, a description will be given of the mirror capacitance of the IGBT, and problems with the effect on a turn-off operation. In the trench gate type IGBTs shown in Patent Documents 1 and 2, there is a reduction of mirror capacitance (gate-collector capacitance). However, in the trench gate type IGBTs shown in Patent Documents 1 and 2 too, there still remains scope for reducing the mirror capacitance. In the trench gate type IGBTs shown in Patent Documents 1 and 2, the mirror capacitance increases particularly when turning on, shifting from an off-condition to an on-condition, and it has been confirmed by the inventor that a reduction in turn-on loss is impeded.

Specifically, as the trench gate type IGBTs shown in Patent Documents 1 and 2 operate in the following way, the turn-on loss increases. In a preventive condition before turning on, the mirror capacitance is of a sufficiently low value, because a sufficiently high voltage is applied between the collector and emitter, and no carriers exist in the bottom portion of the gate trench 13. However, when turn-on is started, the width of the depletion region decreases, and carriers are injected. In particular, as the area of an end portion of the depletion region also increases, and the width of the depletion region also decreases, when the collector-emitter voltage becomes sufficiently low, the mirror capacitance increases. As a result of this, the fall (the point at which an increase starts) of the collector-emitter voltage is slightly delayed, leading to an increase in turn-on loss.

In addition, when the total channel length (or channel density) is constant (a measure for obtaining a constant saturation current value when there is a short circuit) in the trench gate type IGBTs shown in Patent Documents 1 and 2, the ratio between the area of the gate trench 13 in contact with the p-type base region 12 and the area of the electron channel increases. Because of this, it is also clear that a problem occurs in that the turn-on time increases. Furthermore, as a result of this, a problem in that the surge current increases (a hard recovery of an opposing arm side diode occurs at an inverter bride connection) is also found.

The invention, in order to eliminate the heretofore described problems with the heretofore known technology, has an object of providing a semiconductor device in which on-voltage is low, it is difficult for latch-up to occur, and it is possible to suppress an increase in electrical field strength when turning off. Also, the invention, in order to eliminate the heretofore described problems with the heretofore known technology, has an object of providing a semiconductor device in which it is possible to reduce mirror capacitance.

Means for Solving the Problems

In order to solve the heretofore described problems, thus achieving the objects of the invention, a semiconductor device according to the invention has the following characteristics. The semiconductor device includes a first semiconductor layer formed of a first conductivity type semiconductor substrate, at least two trenches, formed in one main surface of the first semiconductor layer, disposed parallel to each other in stripe form, a gate electrode formed across an insulating film in the trenches, plural second conductivity type second semiconductor layers selectively formed in the longitudinal direction of the trench of the surface layer of the first semiconductor layer sandwiched between the trenches, a first conductivity type third semiconductor layer selectively formed in the surface layer of the second semiconductor layer, a second conductivity type fourth semiconductor layer, with an impurity concentration higher than that of the second semiconductor layer, selectively formed in the surface layer of the second semiconductor layer, an emitter electrode, formed on the one main surface of the first semiconductor substrate, in contact with the third semiconductor layer, a second conductivity type fifth semiconductor layer provided on the other main surface of the first semiconductor substrate, and a collector electrode in contact with the fifth semiconductor layer. Then, the third semiconductor layer is in contact with one trench of neighboring trenches, and distanced from the other trench. At least one portion of the edge portion on the other trench side of the third semiconductor layer terminates inside the fourth semiconductor layer. The length of the fourth semiconductor layer in the longitudinal direction of the trench is greater than the length of the third semiconductor layer in the longitudinal direction of the trench.

The characteristics of the semiconductor device according to the invention are as shown in the following (1) to (3). (1) The first conductivity type third semiconductor region (third semiconductor layer) is formed so as to be in contact with a first trench, and distanced from a second trench, in the surface of the second semiconductor region (second semiconductor layer). That is, the third semiconductor region is in contact with only one of the trenches in contact with the second semiconductor region. (2) The whole or one portion of the edge portion on the second trench side of the third semiconductor region terminates inside the fourth semiconductor region (fourth semiconductor layer). (3) The length of the fourth semiconductor region in the longitudinal direction of the first trench is greater than the length of the third semiconductor region in the longitudinal direction of the first trench. According to the heretofore described characteristics (1) to (3), the semiconductor device according to the invention has the following operations.

The first operation is an augmentation of the injection enhancement effect (IE effect) of minority carriers. The third semiconductor region is caused to be in contact with only one trench of two trenches in contact with the second semiconductor region, and the edge on the other trench side of the third semiconductor region terminates inside the fourth semiconductor region (Patent Documents (1) and (2)). Because of this, of minority carriers injected from the fifth semiconductor region formed on the other main surface of the semiconductor substrate, minority carriers headed toward the other trench pass through the second semiconductor region, without passing through a lower portion of the third semiconductor region, and flow into the fourth semiconductor region.

Also, as will be described hereafter, the width of the first semiconductor region sandwiched between two trenches is small in comparison with that of the heretofore known technology shown in the heretofore described patent documents. Because of this, the kind of portion, seen in the heretofore known structure shown in the heretofore described patent documents, in the central portion of the second semiconductor region in which the collection of minority carriers is sparse is eliminated. As it is possible for the planar distribution of the minority carriers to be even as a result of this, it is possible to eliminate the region with little current. As a result of this, the IE effect is augmented overall, and the on-voltage decreases.

In particular, when adopting the structure wherein the third semiconductor region is in contact with only one of two trenches adjoining the second semiconductor region, as in characteristic (1), the area of the carrier inversion layer channel formed by the MOS gate decreases. Because of this, the on-voltage normally increases in the heretofore known semiconductor devices shown in the patent documents. As opposed to this, with the semiconductor device according to the invention, against the tendency exhibited by the heretofore known trench gate type IGBT, it is instead possible to augment the IE effect owing to the evening of the planar distribution of the minority carrier current.

The second operation is suppression of the latch-up of the parasitic thyristor portion. According to the characteristics (1) to (3), minority carriers pass through the second semiconductor region, without passing through the lower portion of the third semiconductor region, and flow into the fourth semiconductor region, in the same way as with the first operation. Because of this, the proportion of the minority carrier current passing through the lower portion of the third semiconductor region decreases, and a voltage drop in the second semiconductor region is smaller. Because of this, it becomes difficult for latch-up to occur in the parasitic thyristor configured of the third semiconductor region, second semiconductor region, first semiconductor region, and fifth semiconductor region.

In particular, a characteristic seen only in the invention is that minority carriers flowing into another second semiconductor region most closely adjacent to the second semiconductor region across one of two trenches can also be collected in the second semiconductor region itself. Minority carriers injected from the fifth semiconductor region collect headed toward the MOS gate inversion layer channel formed in one of the trenches.

That is, the minority carriers collect headed toward the trench. As a trench distanced from the third semiconductor region exists in the second semiconductor region in the semiconductor device according to the invention, one portion of the minority carriers headed toward the other adjacent second semiconductor region can also flow into the second semiconductor region other than this. As a result of this, minority carriers collected in the vicinity of the trench are dispersed, and it is difficult for parasitic thyristor latch-up to occur.

The third operation is a reduction of the strength of an electrical field concentrated in the second semiconductor region and bottom portion of the first trench or second trench when the IGBT is turned off. Generally, when turning off an IGBT, a space charge region spreads from the p-n junction between the first semiconductor region and second semiconductor region to the inside of the first semiconductor region in accordance with a voltage applied. At this time, as the electrical field is proportional to the spatial gradient of the space charge density, the strength of the electrical field increases in the vicinity of the second semiconductor region p-n junction and the vicinity of the bottom portion of the trench on the semiconductor substrate internal side.

Furthermore, when turning off, minority carriers accumulated inside the first semiconductor region rush down through the space charge region, following the electrostatic potential gradient, and concentrate headed toward the second semiconductor region. The minority carriers (for example, holes) cause the value of the spatial gradient of the electrical field strength to increase. Because of this, the strength of the electrical field in the vicinity of the second semiconductor region p-n junction and the bottom portion of the trench adjacent to the second semiconductor region is increased by the existence of the minority carriers.

However, in the semiconductor device according to the invention, the planar distribution of the minority carrier current is evened by the heretofore described first operation, and the minority carriers collected in the vicinity of the trench are dispersed by the second operation. Because of this, it is possible to suppress the increase caused by the minority carriers of the strength of the electrical field when turning off. As a result of this, the previously described kind of positive feedback of the electrical field strength is also suppressed, and it is possible to reduce the possibility of destruction occurring in the trench bottom portion due to a current higher than the rating and to turning off at a high voltage.

Furthermore, as a supplement to the third operation, it is necessary that one portion or all of the edge portion on the side not in contact with the trench of the third semiconductor region formed in the surface of the second semiconductor region terminates inside the adjacent fourth semiconductor region. Provisionally, in the event that the third semiconductor region and the fourth semiconductor region are distanced from each other, the portion by which the third semiconductor region and the fourth semiconductor region are distanced from each other, that is, between the third semiconductor region and fourth semiconductor region, becomes the second semiconductor region. As the impurity concentration of the second semiconductor region is lower than that of the fourth semiconductor region, the portion by which the third semiconductor region and fourth semiconductor region are distanced from each other is a high resistance region. Because of this, it is difficult for holes to collect in the fourth semiconductor region when turning off. As a result of this, the heretofore described advantage of dispersing the holes (minority carriers) is weakened. Because of this, it is necessary that the third semiconductor region terminates inside the fourth semiconductor region.

Furthermore, a description will be given of main means among more preferable means of the invention. Other means will be described in a mode for carrying out the invention. The semiconductor according to the invention is characterized in that, in the heretofore described invention, each of the third semiconductor layers formed in each of the second semiconductor layers neighboring each other in the longitudinal direction of the trench between the neighboring trenches is in contact with a differing one of the neighboring trenches.

The invention is characterized in that each of the third semiconductor regions (third semiconductor layers) formed in the surface of second semiconductor regions (second semiconductor layers) neighboring each other in the longitudinal direction of the trench is in contact with a differing one of the neighboring trenches. That is, in the invention, in plural second semiconductor regions neighboring each other in the longitudinal direction of the trench, the third semiconductor region is alternately in contact with two trenches disposed in a stripe form parallel to each other.

According to the invention, a MOS gate inversion layer channel is formed in the side walls of the trenches in contact with the second semiconductor region on both sides. Provisionally, in the event that the third semiconductor region in all neighboring second semiconductor regions is in contact with only one of the two trenches in contact with the second semiconductor region, no inversion layer channel is formed in the side wall of the other trench. Meanwhile, when the minority carriers are taken to be, for example, holes, the holes are attracted toward the electrons by coulomb force. Because of this, the distribution of hole concentration between the two trenches is such that a large number of holes are distributed to the one trench with which the third semiconductor region is in contact, while the hole concentration in the other trench is relatively small. Consequently, as heretofore described, by the third semiconductor region being formed alternately with respect to the two trenches, an inversion layer channel is formed in the side wall of both trenches. As a result of this, it is possible for the holes to be distributed evenly between the two trenches, and it is possible to increase the concentration of the holes.

Also, by the plural second semiconductor region being disposed cyclically over virtually the whole of a region (hereafter, an active region) in the semiconductor device through which it is possible to cause current to flow, it is possible for the carrier concentration in the active region, and the planar distribution of the current, to be even. As the holes and electrons are attracted toward each other by coulomb force, it is possible to increase the concentration more when the carrier concentration in the active region, and the planar distribution of the current, are even than when they are uneven. As a result of this, for example, it is possible to increase the IE effect to the maximum, and it is also possible to sufficiently suppress the previously described kind of positive feedback of the electrical field strength when turning off.

Furthermore, it is preferable that the second semiconductor region disposed cyclically over virtually the whole of the active region, as previously described, is disposed in like a check pattern without being caused to be adjacent across a trench. That is, with respect to an intermediate point of two second semiconductor regions, neighboring each other in the longitudinal direction of the trench, formed between two trenches, another second semiconductor region is disposed in a region adjacent to the intermediate point across the trench. By so doing, it is possible for the minority carrier concentration and the planar distribution of the current to be even inside the active region.

Advantage of the Invention

According to the semiconductor device according to the invention, advantages are achieved in that on-voltage is low, it is difficult for latch-up to occur, and it is possible to suppress an increase in electrical field strength when turning off. Also, according to the semiconductor device according to the invention, an advantage is achieved in that it is possible to reduce mirror capacitance when turning off.

BRIEF DESCRIPTION OF THE DRAWINGS

FIG. 11 is an explanatory diagram showing main portions of the semiconductor device according to Working Example 3 of the invention.

BEST MODE FOR CARRYING OUT THE INVENTION

Figure 1:
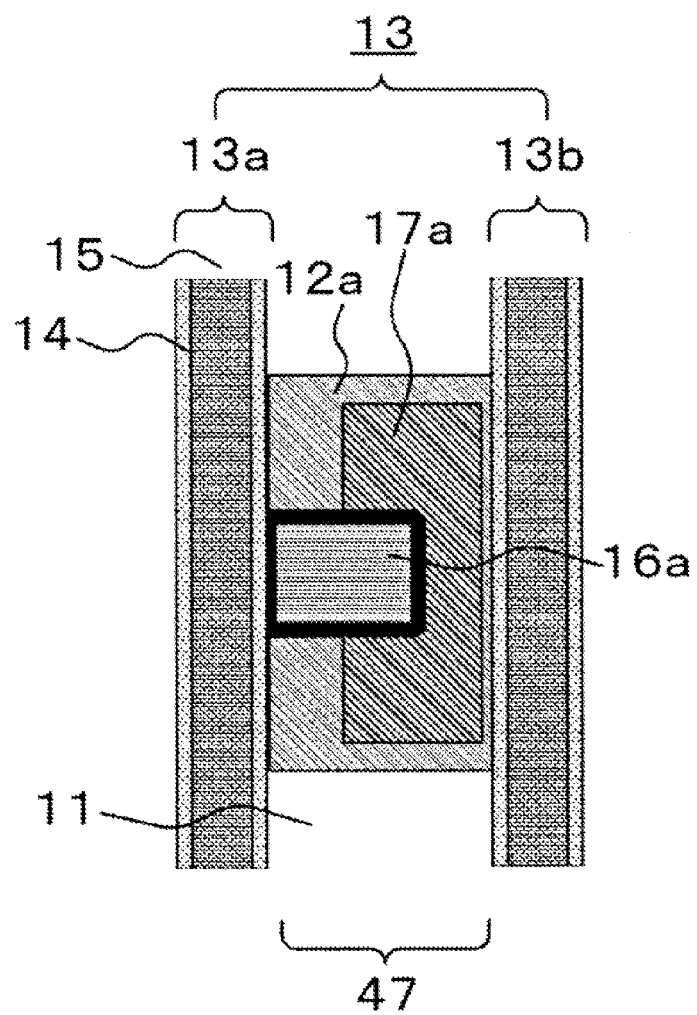
FIG. 1 is a plan view showing a basic structural portion of a semiconductor device according to an embodiment of the invention.

Hereafter, referring to the attached drawings, a detailed description will be given of a preferred embodiment of a semiconductor device according to the invention. In the specification and attached drawings, a layer or region being prefixed by n or p means that a electrons or holes respectively are majority carriers. Also, + or − being affixed to n or p means that there is a higher impurity concentration or lower impurity concentration respectively than in a layer or region to which + or − is not added. In the following description of the embodiment and the attached drawings, the same reference numerals and signs are given to identical configurations, and a redundant description is omitted.

Embodiment

A description will be given of a semiconductor device according to an embodiment of the invention, with an insulated gate bipolar transistor (IGBT) as an example. The semiconductor device according to the embodiment, not being limited to an IGBT, can also be applied to an insulated gate transistor (MOSFET), which is a heretofore known unipolar device. Also, in the embodiment, a description is given assuming a first conductivity type to be an n-type and a second conductivity type to be a p-type, but it is possible to operate in the same way even when interchanging the n-type and p-type. Also, in the embodiment and working examples of the invention, the expressions device, element, chip, or semiconductor chip are also used for the semiconductor device, but they all indicate the same object.

Also, a wafer in the embodiment and working examples of the invention is a silicon substrate (semiconductor substrate) before being cut into chips. An "active region" in a semiconductor chip is a region in which, for example, an IGBT emitter electrode is formed, and through which it is possible to cause a current to flow. A "termination structure region", being a region from an end portion of the active region to an outer periphery side end portion of the chip, is a structural portion that reduces the strength of a chip surface electrical field generated when voltage is applied to the element. Firstly, a description will be given of a basic structure of the semiconductor device according to the embodiment of the invention.

(Basic Structure)

FIG. 1 is a plan view showing a main portion (hereafter referred to as a basic structural portion) of a planar structure of the semiconductor device according to the embodiment of the invention. The basic structure of the invention is as follows. As shown in FIG. 1, a gate trench 13 is formed in a stripe form in one main surface (corresponding to the plane of the drawing, and hereafter called the front surface) of a wafer that forms an n-type drift region 11. In FIG. 1, two neighboring gate trenches 13, of the plural gate trench 13 disposed in a stripe form, are shown as a gate trench 13a and a gate trench 13b.

A gate oxide film 14 is formed on an inner wall of the gate trench 13a and gate trench 13b, and furthermore, a conductive gate electrode 15 is formed on the inner side of the gate oxide film 14. A p-type base region 12a is formed between the neighboring gate trenches 13. The p-type base region 12a is disposed so as to come into contact with the gate oxide film 14 formed on each of a side wall of the gate trench 13a and a side wall of the gate trench 13b.

An n-type emitter region 16a is formed, so as to come into contact with the gate trench 13a, in a surface layer of the p-type base region 12a. End portions of the n-type emitter region 16a in the longitudinal direction of the gate trench 13a are disposed so as to be housed on the inner side of the p-type base region 12a. Also, a p-type contact region 17a with a concentration higher than that of the p-type base region 12a is formed so as to be distanced from the gate trench 13a in the surface layer of the p-type base region 12a. The n-type emitter region 16a is disposed so that an edge portion on the side opposite to an edge portion in contact with the gate trench 13a terminates inside the p-type contact region 17a.

A description will be given of a configuration necessary to configure the semiconductor device according to the embodiment of the invention (hereafter assumed to be the IGBT according to the invention). An insulating film is formed on a surface of the p-type base region 12a and n-type drift region 11. The n-type emitter region 16a and p-type contact region 17a are isolated from the gate electrode 15 by the insulating film. Then, a contact aperture portion is formed in the insulating film in order to bring the n-type emitter region 16a and p-type contact region 17a into contact with an emitter electrode.

A p-type collector region is formed in the other main surface (corresponding to the rear side of the plane of the drawing, and hereafter called the rear surface) of the wafer that forms the n-type drift region 11. An n-type field stop region, in contact with the n-type drift region 11 and p-type collector region, is formed between the n-type drift region 11 and p-type collector region. Then, a collector electrode in contact with the p-type collector region is formed on the rear surface of the wafer. The insulating film, emitter electrode, p-type collector region, n-type field stop region, and collector electrode are omitted from FIG. 1.

(Operational Advantages of Basic Structure of Invention)

Next, a description will be given of characteristics of the basic structure of the invention, and of resultant operational advantages. The characteristics of the basic structure of the invention shown in FIG. 1 are shown in (1) to (3) below. (1) The n-type emitter region 16a is in contact with only the one gate trench 13a of the two gate trenches 13a and 13b in contact with the p-type base region 12a. (2) The whole or one portion of the edge portion of the n-type emitter region 16a on the side of the other gate trench 13b terminates inside the p-type contact region 17a. (3) The length of the p-type contact region 17a in the longitudinal direction of the gate trench 13a is greater than the length of the n-type emitter region 16a. Owing to the heretofore described three characteristics (1) to (3), there are the following four operational advantages.

The first operational advantage is an augmentation of the injection enhancement effect (IE effect) of minority carriers. Firstly, as in the heretofore described characteristic (1), the n-type emitter region 16a is disposed so as to be in contact with only the one gate trench 13a. Then, as in the heretofore described characteristic (2), it is arranged that the edge portion of the n-type emitter region 16a on the side of the other gate trench 13b terminates inside the p-type contact region 17a. An operation when the gate electrode of the IGBT having these kinds of characteristic (1) to (3) is in an on condition, and a current is caused to flow, will be described, contrasted with that of a heretofore known IGBT (hereafter referred to as the heretofore known IGBT) shown in each of heretofore described Patent Documents.

Holes injected from the p-type collector region flow toward the gate trench 13a and gate trench 13b. At this time, in the heretofore known IGBT, the holes flowing toward the gate trench 13b pass from the p-type base region 12a through a lower portion of the n-type emitter region 16a. Meanwhile, in the IGBT according to the invention, the holes not only pass through the lower portion of the n-type emitter region 16a, but also flow from the p-type base region 12a directly to the p-type contact region 17a.

Also, as will be described hereafter, the width of the n-type drift region 11 in the lateral direction of the gate trench 13a is small in comparison with the width of an n-type drift region in the heretofore known IGBT. Because of this, a portion in which there is little collection of hole current (a region in which the hole current is sparse) is eliminated from a central portion of the p-type base region 12a. As it is possible for the planar distribution of the hole current to be even as a result of this, and the IE effect is augmented overall, the on-voltage decreases.

Important points in the heretofore described operation are that it is possible for the area of an MOS gate inversion layer channel to be smaller than that in the heretofore known IGBT, and that it is possible to augment the IE effect. When the n-type emitter region 16a is in contact with only the one gate trench 13a of the two gate trenches 13a and 13b, as in the heretofore described characteristic (1) of the IGBT according to the invention, the area of the carrier inversion layer channel formed by the MOS gate decreases in the heretofore known IGBT, as described in the heretofore described problems.

Because of this, it is normal in the heretofore known IGBT that the total channel length (or channel density) in the whole of the active region surface decreases, and the on-voltage increases. As opposed to this, in the IGBT according to the invention, as a result of the total channel length decreasing owing to the evening of the planar distribution of the minority carrier current, the total channel length decreases, and it is possible to augment the IE effect. By the total channel length decreasing, an advantage is achieved in that it is possible to realize a reduction in saturation current and a resultant improvement in short circuit capability, as will be described hereafter.

The second operational advantage is suppression of a latch-up of a parasitic thyristor portion. The parasitic thyristor of the IGBT is configured of the n-type emitter region 16a, the p-type base region 12a, the n-type drift region 11, and the p-type collector region. As heretofore described, holes injected into the n-type drift region 11 flow through the p-type base region 12a to the p-type contact region 17a more than through the lower portion of the n-type emitter region 16a. Because of this, the hole current passing through the lower portion of the n-type emitter region 16a decreases, and a voltage drop in the p-type base region 12a is smaller. For this reason, the parasitic thyristor is not turned on, and latch-up is considerably suppressed.

The third operational advantage is a reduction of the strength of an electrical field concentrated in the p-type base region and a gate trench bottom portion when the IGBT is turned off. Firstly, a simple description will be given of a change in the condition inside the element when turning off a common IGBT. Next, a description will be given of how the change is improved with the structure of the IGBT according to the invention. Generally, when turning off an IGBT, a space charge region spreads from a p-n junction between the n-type drift region and p-type base region to the inside of the n-type drift region. At this time, as the strength of the electrical field is proportional to the spatial gradient of the space charge density, the strength of the electrical field increases in the vicinity of the p-type base region p-n junction and the vicinity of the bottom portion of the gate trench on the n-type drift region side.

Furthermore, when turning off a common IGBT, holes accumulated in the n-type drift region rush down through the space charge region toward the p-type base region, following the electrostatic potential gradient. At this time, in accordance with a Poisson expression known in electromagnetics, the spatial gradient of the electrical field strength increases in a region in which the hole density is high. That is, the holes augment the strength of the electrical field in the vicinity of the p-type base region p-n junction and the bottom portion of the gate trench adjacent to the p-type base region.

Meanwhile, in the IGBT according to the invention, the planar distribution of the hole current is evened by the heretofore described first operation, and the minority carriers collected in the vicinity of the gate trench side wall inversion layer channel are dispersed toward the p-type contact region by the second operation. That is, it is possible to reduce the hole current density in the vicinity of the p-type base region p-n junction and the bottom portion of the gate trench adjacent to the p-type base region. As a result of this, it is possible to suppress the augmentation by the holes of the strength of the electrical field. Furthermore, as the positive feedback of the electrical field strength seen to be a problem with, for example, the heretofore known IGBT is also suppressed, it is possible to reduce the possibility of destruction occurring in the trench bottom portion due to a current higher than the rating and to turning off at a high voltage.

The fourth operational advantage is a reduction of mirror capacitance. There is a close relationship between the reduction of mirror capacitance and the saturation current. As the IGBT according to the invention is of a structure wherein the n-type emitter region 16a is in contact with only the side wall portion of the one gate trench 13a of the neighboring gate trenches 13a and 13b, the length of the side wall portion of the gate trench 13 with which the n-type emitter region 16a is in contact is one half in comparison with that in the heretofore known IGBT.

Meanwhile, in order to maintain the short circuit capability of the IGBT, it is necessary that the total emitter length housed in a certain area (for example, the area of the whole active region) is the same as that of the heretofore known IGBT, and that the saturation current values are the same. As the pitch (repetition period length) in the lateral direction of the gate trench 13 is approximately half in the case of the IGBT according to the invention, the area of the n-type emitter region 16a (approximately equal to the area of the inversion layer channel) in the whole active region is twice that in the heretofore known IGBT.

By the length of the n-type emitter region 16a increasing twofold in this way, the ratio between the area of contact between the p-type base region 12a and side wall portion of the gate trench 13 and the area of contact between the p-type base region 12a and side wall of the gate trench 13 is approximately twice that in the heretofore known IGBT. As a result of this, the ratio (Cies/Cres) between input capacitance (Cies) and feedback capacitance (Cres) is approximately twice that in the heretofore known IGBT, and it is effectively possible to achieve an advantage equivalent to reducing Cres by half. As a result of the mirror capacitance reduction, a turn-on waveform and turn-off power loss are improved.

At an initial turning on stage, the Cres element of the IGBT generates a displacement current with respect to the gate electrode in a direction such as to increase the gate voltage. When the Cies/Cres ratio is small, the gate voltage rises considerably because of the displacement current, while when the Cies/Cres ratio is large, the rise of the gate voltage is smaller. As the rise in gate voltage at the initial turning on stage induces an increase in turn-on peak current, it is desirable when thinking in terms of soft switching that the Cies/Cres ratio is on the large side.

Hence, in the IGBT according to the invention, it is possible to increase the Cies/Cres ratio approximately twofold with respect to the heretofore known IGBT, and thus possible to realize soft switching during turn on. Furthermore, a so-called mirror period when turning on becomes shorter owing to the advantage of reducing Cres, and it is possible to finish the turning on swiftly.

At this point, using FIG. 1, two points will be added to the characteristics (2) and (3) of the IGBT according to the invention. The first addition to the characteristics (2) and (3) of the IGBT according to the invention is the positional relationship between the n-type emitter region 16a and p-type contact region 17a. Of the n-type emitter region 16a formed in the surface of the p-type base region 12a, it is necessary that one portion or all of the edge portion not in contact with the gate trench 13b terminates inside the adjacent p-type contact region 17a.

Provisionally, in the event that the n-type emitter region 16a and p-type contact region 17a are distanced from each other, the p-type base region 12a is exposed on the wafer surface in a portion by which the n-type emitter region 16a and p-type contact region 17a are distanced from each other (between the n-type emitter region 16a and p-type contact region 17a). As the impurity concentration of the p-type base region 12a is lower than that of the p-type contact region 17a, the portion by which the n-type emitter region 16a and p-type contact region 17a are distanced from each other is a high resistance region. Because of this, it is difficult for holes to collect in the p-type contact region 17a during the turning off process. As the heretofore described advantage of dispersing the holes is weakened as a result of this, it is necessary that the n-type emitter region 16a terminates inside the p-type contact region 17a.

The second addition to the characteristics (2) and (3) of the IGBT according to the invention is the interrelationship between the length of the n-type emitter region 16a and the length of the p-type contact region 17a in the longitudinal direction of the gate trench 13. Specifically, it is preferable that the length of the n-type emitter region 16a in the longitudinal direction of the gate trench 13 is less than the length of the p-type contact region 17a. The reason for this is as follows. In the IGBT according to the invention, holes flow along two paths (hereafter referred to as a first path and a second path). This is because, by the length of the n-type emitter region 16a being less than the length of the p-type contact region 17a, it is possible to even more efficiently withdraw the holes using the two paths.

The first path of the holes is a path from the lower portion of the p-type base region 12a and a path from the n-type drift region 11 and lower portion of the gate trench 13a adjacent to the p-type base region 12a, collecting headed toward the MOS gate inversion layer channel. Hereafter, the p-type base region 12a in whose lower portion the first path is formed is referred to as the main p-type base region 12a. The second path is a path that passes out from the p-type contact region 17a formed in the p-type base region in the neighborhood of the main p-type base region 12a to the emitter electrode (not shown). In order to even more efficiently withdraw the holes using the second path of the holes, it is good to shift the holes flowing along the first path of the main p-type base region 12a so that they flow through the p-type contact region 17a.

In order to do this, it is sufficient to arrange so that holes approaching the inversion layer channel pass through the p-type base region 12a without passing below the n-type emitter region 16a, and pass out into the p-type contact region 17a. At this time, in the event, provisionally, that the length of the n-type emitter region 16a in the longitudinal direction of the gate trench 13 is greater than the length of the p-type contact region 17a, holes approaching the inversion layer channel can never pass out into the p-type contact region 17a unless they pass below the n-type emitter region 16a.

Meanwhile, when the length of the n-type emitter region 16a in the longitudinal direction of the gate trench 13 is less than the length of the p-type contact region 17a, the ratio of holes that do not pass through the lower portion of the n-type emitter region 16a increases. As a result of this, it is possible to withdraw even more holes using the second path of the holes, and thus possible to increase the advantage of dispersing the holes. Consequently, by the length of the n-type emitter region 16a being less than the length of the p-type contact region 17a, it is possible to withdraw holes even more efficiently using the second path.

Next, a description will be given of an IGBT having a structure wherein two of the basic structure of the invention are disposed in parallel in the longitudinal direction of the gate trench. When the p-type base regions configuring the basic structure of the invention are disposed so as to neighbor each other in the longitudinal direction of the gate trench, for example, the n-type emitter regions configuring the basic structure of the invention may be disposed with respect to the two gate trenches in such a way that each is in contact with a differing gate trench, or the n-type emitter regions configuring the basic structure of the invention may be disposed in such a way as to be in contact with only one gate trench of the two gate trenches.

(N-type Emitter Region Alternating Disposition Structure)

Figure 2:
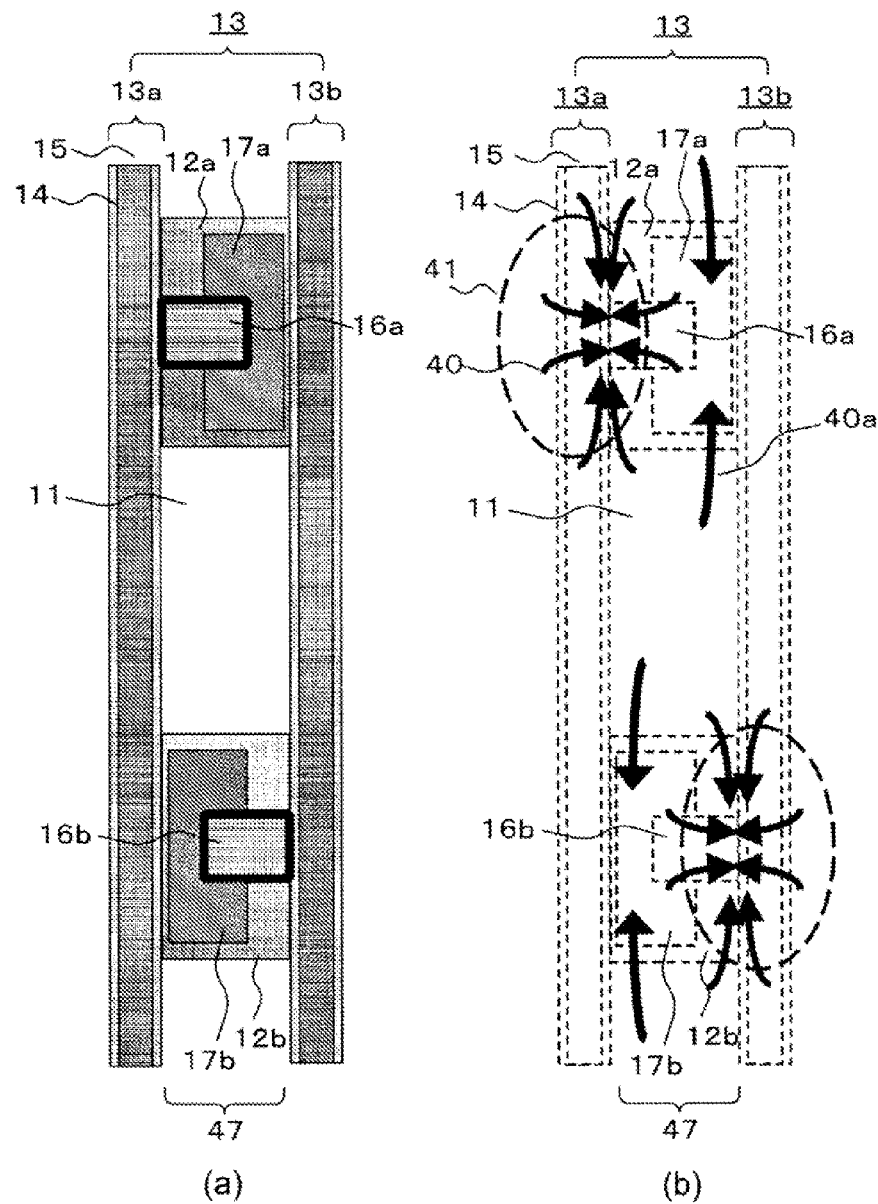
FIG. 2 is a plan view showing the basic structural portion and current paths of the semiconductor device according to the embodiment of the invention.

Firstly, a description will be given of a structure wherein each n-type emitter region configuring the basic structure of the invention is disposed in such a way as to be in contact with a different gate trench (hereafter referred to as an n-type emitter region alternating disposition structure). FIG. 2 is a plan view showing the basic structural portion and current paths of the semiconductor device according to the embodiment of the invention. FIG. 2(a), being a plan view of basic structures of the invention shown in FIG. 1 disposed aligned in the longitudinal direction of the gate trench 13, is the structure of the IGBT according to Working Example 1, to be described hereafter. Points added to the basic structure of the invention shown in FIG. 1 are as follows.

Firstly, a p-type base region 12b is disposed so as to neighbor the p-type base region 12a across the n-type drift region 11 in the longitudinal direction of the gate trench 13. The p-type base region 12b configures another basic structure of the invention neighboring, in the longitudinal direction of the gate trench 13, the one basic structure of the invention having the kind of p-type base region 12a shown in FIG. 1 as a component. An n-type emitter region 16b and a p-type contact region 17b are formed in the p-type base region 12b, in the same way as in the p-type base region 12a.

In the semiconductor device according to Working Example 1 of the invention (hereafter referred to as the IGBT according to Working Example 1. The semiconductor device according to other working examples of the invention will also be referred to, in the same way, as the IGBT according to the working example), to be described hereafter, the n-type emitter region 16b is brought into contact with the gate oxide film 14 provided on a side wall of the gate trench 13b. That is, the n-type emitter region 16b is disposed with respect to the gate trench 13a and gate trench 13b adjacent to the p-type base region 12a and p-type base region 12b so as to be in contact with the gate trench on the side opposite to the gate trench with which the n-type emitter region 16a is in contact.

This kind of disposition of the n-type emitter regions 16a and 16b can be said to be a structure wherein n-type emitter regions are disposed so as to be "alternately" in contact with opposing side walls of the neighboring gate trenches 13a and 13b. Hereafter, the structure of the IGBT shown in FIG. 2(a) will be referred to as an "alternating disposition structure". By alternately disposing the n-type emitter regions in this way, an inversion layer channel is formed in each of the side walls of the gate trench 13a and gate trench 13b in contact with the p-type base regions 12a and 12b.

FIG. 2(b) is a plan view wherein a hole current flow 40 and a region 41 in which hole currents collect are schematically shown in the plan view of the IGBT having the alternating disposition structure of the invention shown in FIG. 2(a). In the IGBT having the alternating disposition structure, holes flowing from the rear surface p-type collector region into the n-type drift region 11 when turning off, and heading toward, for example, a certain p-type base region 12a, normally flow toward the main p-type base region 12a of that p-type base region 12a, and are withdrawn into the p-type base region 12a, as shown in FIG. 2(b). This withdrawal mechanism is obviously also established in the other p-type base region 12b.

(N-type Emitter Region One Side Disposition Structure)

Figure 3:
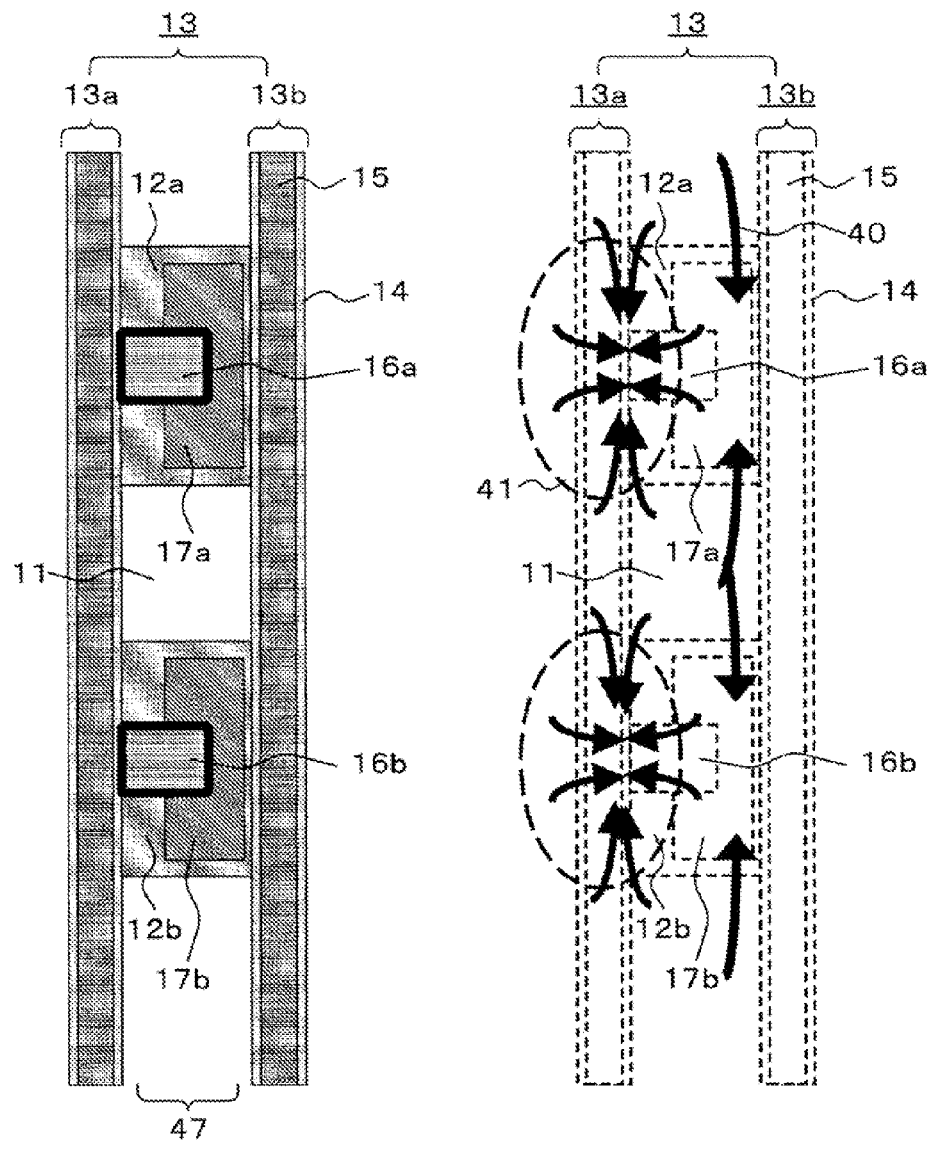
FIG. 3 is a plan view showing the basic structural portion and current paths of the semiconductor device according to the embodiment of the invention.

Next, a description will be given of a structure wherein n-type emitter regions are disposed in such a way as to be in contact with only one (one side) gate trench of the neighboring gate trenches (a one side disposition structure). FIG. 3 is a plan view showing the basic structural portion and current paths of the semiconductor device according to the embodiment of the invention. FIG. 3(a) is a plan view showing a basic structure of the IGBT according to Working Example 5, to be described hereafter. The n-type emitter region 16a and n-type emitter region 16b are in contact with only the one, same gate trench 13a. That is, in one mesa region 47, the n-type emitter region 16a is disposed in only the one side gate trench 13a of the neighboring gate trenches 13a and 13b. Hereafter, the structure of the IGBT shown in FIG. 3(a) will be referred to as a "one side disposition structure".

By the n-type emitter regions being disposed so as to be in contact with only one gate trench, an inversion layer channel is formed in only a region of the p-type base region 12a in contact with the side wall of the one gate trench 13a. FIG. 3(b) is a plan view wherein the flow 40 of a hole current flowing in a condition in which the gate electrode is on, and the region 41 in which hole currents collect, are schematically shown in the plan view of the IGBT having the one side disposition structure of the invention shown in FIG. 3(a). As shown in FIG. 3(b), the IGBT having the one side disposition structure is such that, unlike the previously described IGBT having the alternating disposition structure, the region 41 in which hole currents collect is formed in only the one gate trench 13a.

(Interaction with Nearest Basic Structure)

Figure 4:
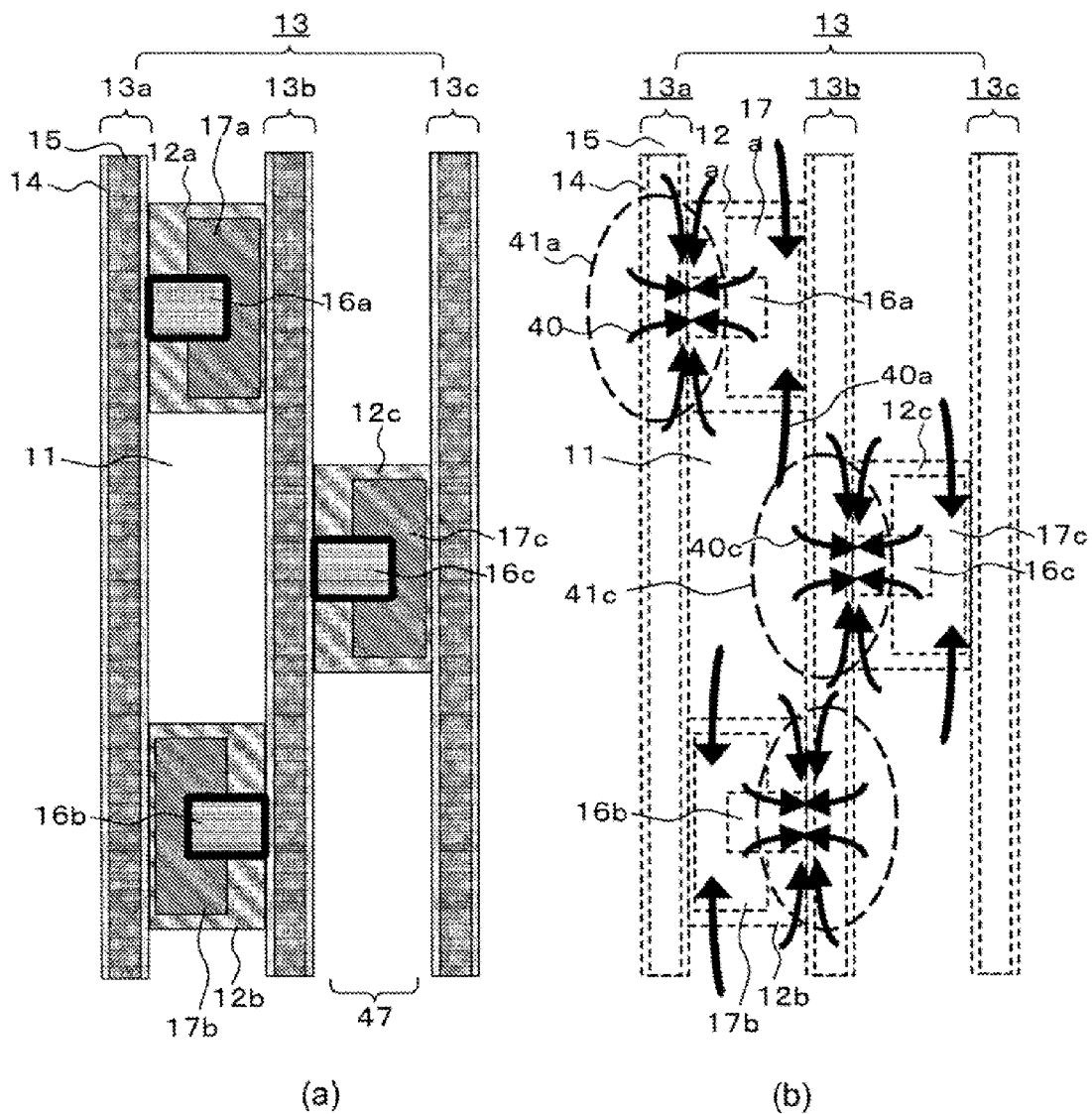
FIG. 4 is a plan view showing the basic structural portion and current paths of the semiconductor device according to the embodiment of the invention.

With the structure of the invention, not only the heretofore described operational advantages, but also a new advantage seen only in the invention is achieved using the basic structure of FIG. 1, FIG. 2, or FIG. 3, or by regularly disposing the plural basic disposition structures. FIG. 4 is a plan view showing the basic structural portion and current paths of the semiconductor device according to the embodiment of the invention. FIG. 4(a) is a plan view showing the IGBT having the alternating disposition structure shown in FIG. 2(a) extending as far as the mesa region 47 neighboring the p-type base region 12a across the gate trench 13b. The p-type base region 12c disposed in a certain mesa region 47 is disposed so as to neighbor the n-type drift region 11 between the p-type base region 12a and p-type base region 12b of the mesa region 47 neighboring the mesa region 47 across the gate trench 13 (hereafter referred to as a check pattern).

FIG. 4(b) is a plan view wherein the flow 40 of a hole current flowing in a condition in which the gate is on, and the region 41 in which hole currents collect, are schematically shown in the plan view of the basic structure of the invention shown in FIG. 4(a). As shown in FIG. 4(b), in the case of the IGBT according to the invention, holes headed toward a nearby p-type base region 12c can also be withdrawn from the p-type contact region 17a provided in the main p-type base region 12a. Being near means as follows. Firstly, the main p-type base region 12a will be considered. Being near refers to a region, of plural p-type base regions (p-type base regions other than the p-type base region 12c are omitted from the drawing) in the neighboring mesa region 47 across the gate trench 13b with which the main p-type base region 12a is in contact, in a range of the distance from the main p-type base region 12a to the nearest p-type base region 12c.

Figure 33:
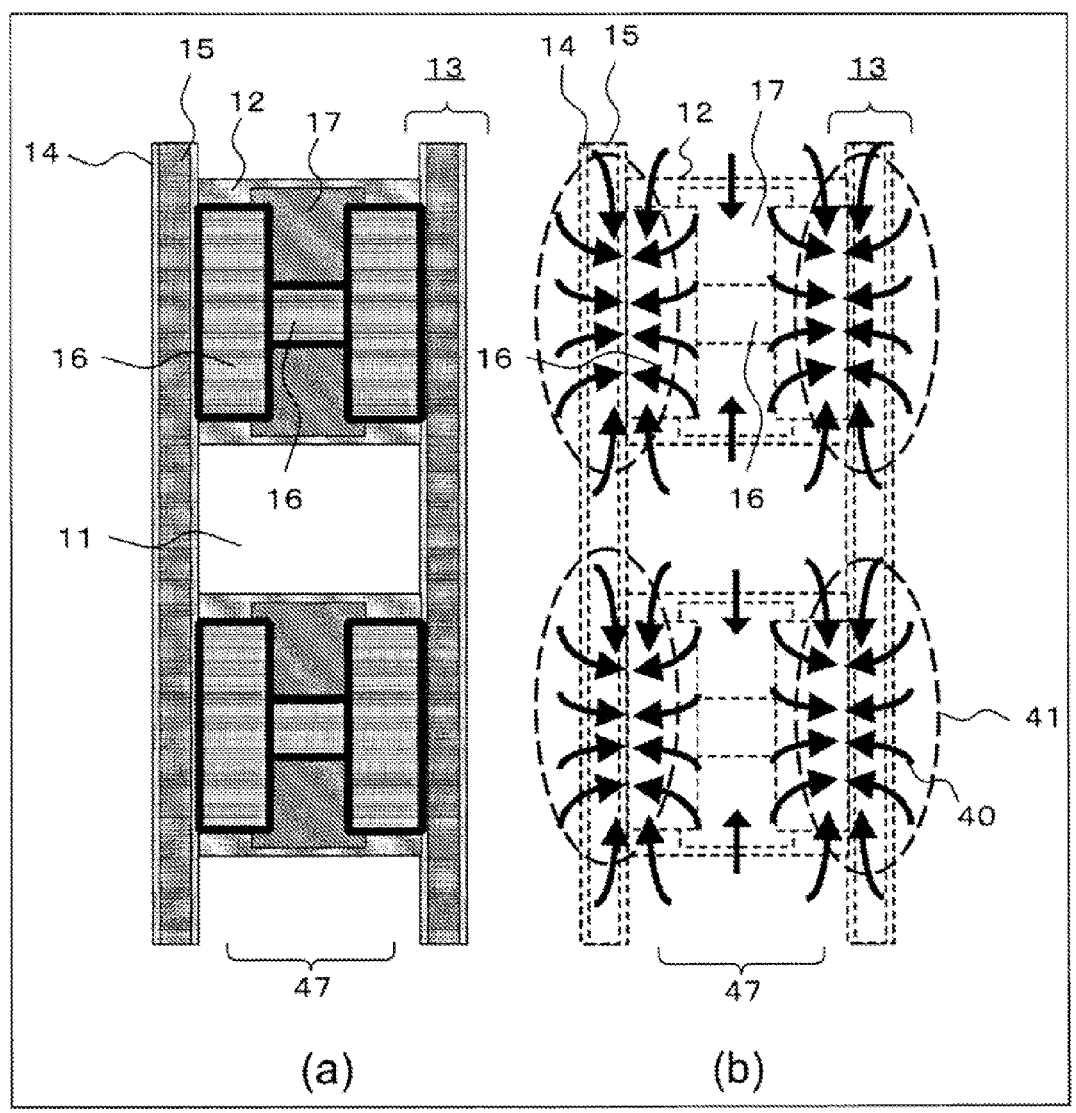
FIG. 33 is a plan view schematically showing main portions of a heretofore known semiconductor device.
Figure 34:
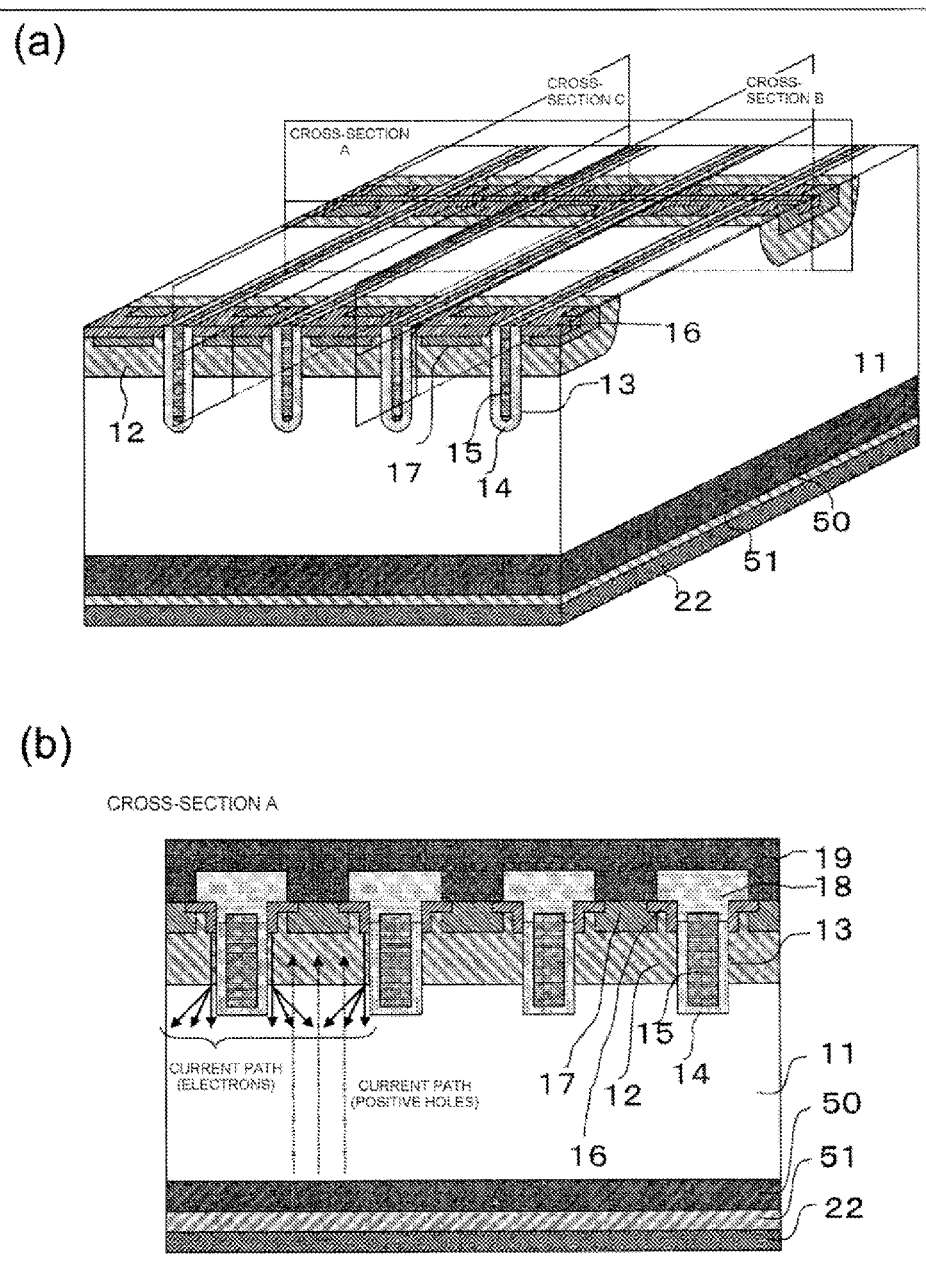
FIG. 34 is an explanatory diagram schematically showing main portions of the heretofore known semiconductor device.
Figure 35:
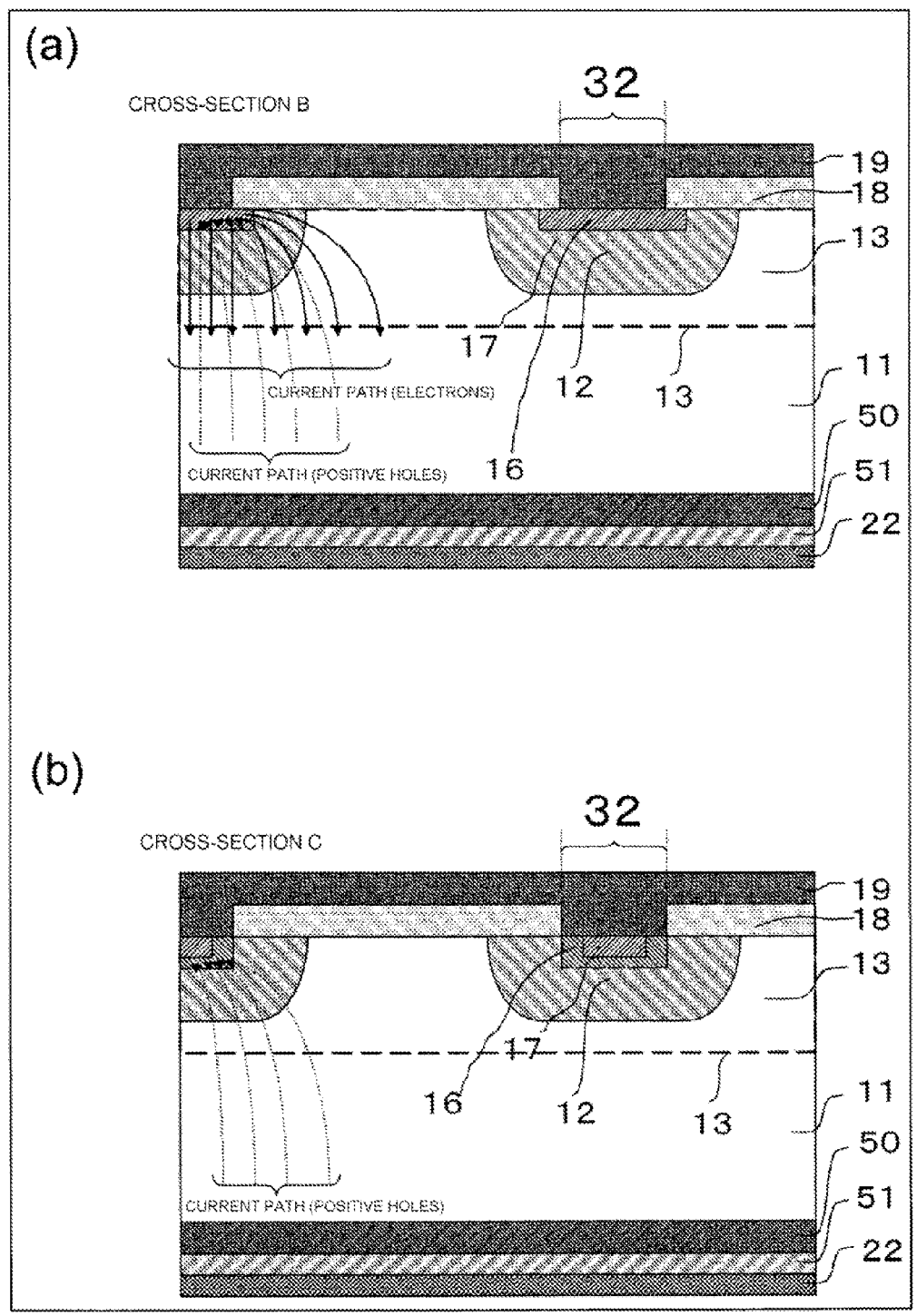
FIG. 35 is a sectional view schematically showing main portions of the heretofore known semiconductor device.
Figure 36:
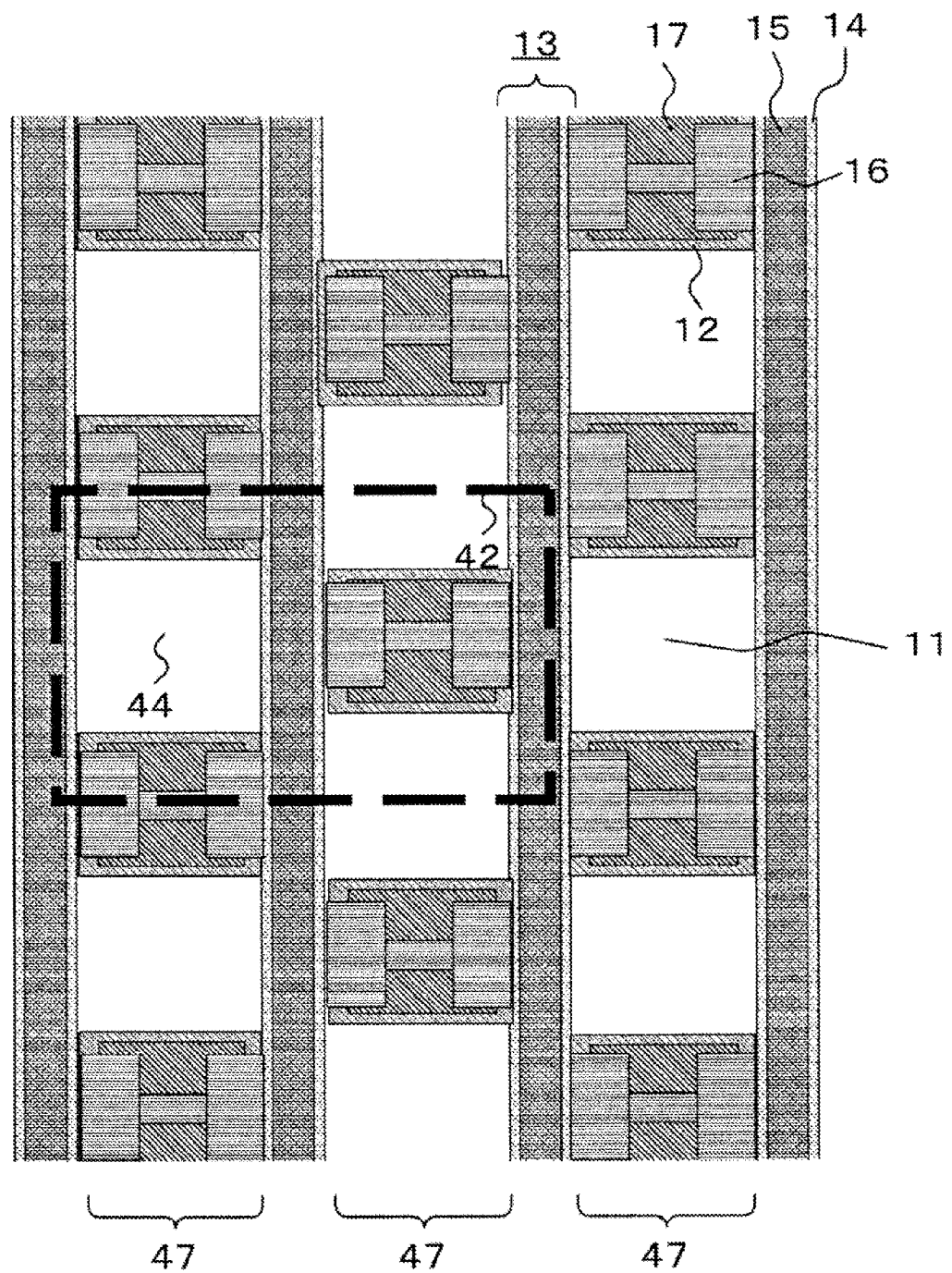
FIG. 36 is a plan view schematically showing main portions of another example of the heretofore known semiconductor device.

A detailed description will be given, using FIG. 4 and FIG. 33, of this kind of operational advantage whereby one portion of holes collecting in the nearest or a nearby p-type base region 12c is also withdrawn from the main p-type base region 12a. As heretofore described, FIG. 33(a) is a plan view showing the heretofore known IGBT, while FIG. 33(b) is a plan view wherein the hole current flow 40 and the region 41 in which hole currents collect are schematically shown in the plan view of the heretofore known IGBT shown in FIG. 33(a). In the IGBT according to the invention, as heretofore described, there are mainly two paths (the first and second paths of the holes) by which holes injected from the p-type collector region into the n-type drift region 11 reach the p-type contact region 17a.

The first path of the holes is a path from the lower portion of the main p-type base region 12a and a path from the n-type drift region 11 and lower portion of the gate trench 13a adjacent to the p-type base region 12a, collecting headed toward the MOS gate inversion layer channel. The first path is the same as a hole path in a common trench gate type IGBT. In the case of the IGBT according to the invention, focusing on, for example, the main p-type base region 12a, the injected holes collect headed toward the side wall of the gate trench 13a in contact with the p-type base region 12a. A large number of the holes flow like the hole current flow 40 toward the bottom portion of the gate trench 13a, passing through the side wall of the p-type base region 12a in contact with the inversion layer channel.

Because of this, there is formed a region 41a in which hole currents collect. Holes collected in the region 41a in which hole currents collect flow into the p-type contact region 17a via the lower portion of the n-type emitter region 16a. Meanwhile, in the case of the heretofore known IGBT too, a large number of holes collect headed toward the bottom portion of the gate trench 13, passing through the side wall of a p-type base region 12 in contact with the inversion layer channel, as shown in FIG. 33(b). Because of this, there is formed the region 41 in which hole currents collect. The collected holes flow into a p-type contact region 17 via the lower portion of an n-type emitter region 16.

The second path of the holes is a path such that holes flowing into the p-type base region 12c pass out to the unshown emitter electrode from the p-type contact region 17a formed in the neighboring p-type base region 12a, rather than from the p-type base region 12c. The second path, being the path shown by a hole current flow 40a in FIG. 4(b), is a path obtained only with the IGBT according to the invention. The reasons for this are as follows. In the case of the heretofore known IGBT, a large number of holes are drawn toward the inversion layer channel, as heretofore described. Furthermore, in the case of the heretofore known IGBT, an n-type emitter region is formed on both of two side walls of the p-base region in contact with the gate trench 13. Because of this, in the heretofore known IGBT, extremely few holes are withdrawn via a path the same as the second path of the holes formed in the IGBT according to the invention, which is equivalent to the second path of the holes not being formed.

Meanwhile, in the IGBT according to the invention, the gate trench 13b distanced from the n-type emitter region 16a is in contact with the main p-type base region 12a, as shown in FIG. 4(b). No electron inversion layer channel is formed in the side wall of the gate trench 13b in contact with the p-type base region 12a. Because of this, the holes head toward an inversion layer channel formed in another nearest p-type base region 12c in contact with the gate trench 13b. This is because holes collected in the bottom portion of the gate trench 13b, after once being accumulated in the surface of the n-type drift region 11 adjacent to a gate trench 13c, flow not only into the nearest p-type base region 12c, but also into the main p-type base region 12a (the hole current flow 40a).

Then, the holes are withdrawn to the emitter electrode via the p-type contact region 17a. That is, holes collected in the vicinity of the gate trench 13b (a region 41c in which hole currents collect) are dispersed not only to the nearest p-type base region 12c (a hole current flow 40c), but also to the main p-type base region 12a. This kind of exchange (interaction) of holes between nearest or neighboring p-type base regions will hereafter be called a hole dispersion effect. The hole dispersion effect also occurs in all cyclically disposed p-type base regions.

As a result, holes collected in the lower portion of the n-emitter region are dispersed in any p-type base region. Because of this, it is difficult for latch-up of the parasitic thyristor to occur. It is clear that the hole dispersion effect is achieved in not only the IGBT having the alternating disposition structure shown in FIG. 4, but also in the IGBT having the one side disposition structure shown in FIG. 3. The reason for this is that, for example, even in the event that, provisionally, an n-type emitter region 16c of the IGBT having the alternating disposition structure shown in FIG. 4 is in contact with the gate trench 13a rather than with the gate trench 13b, the hole current flow 40a occurs in the same way as when the n-type emitter region 16c is in contact with the gate trench 13b.

Figure 12:
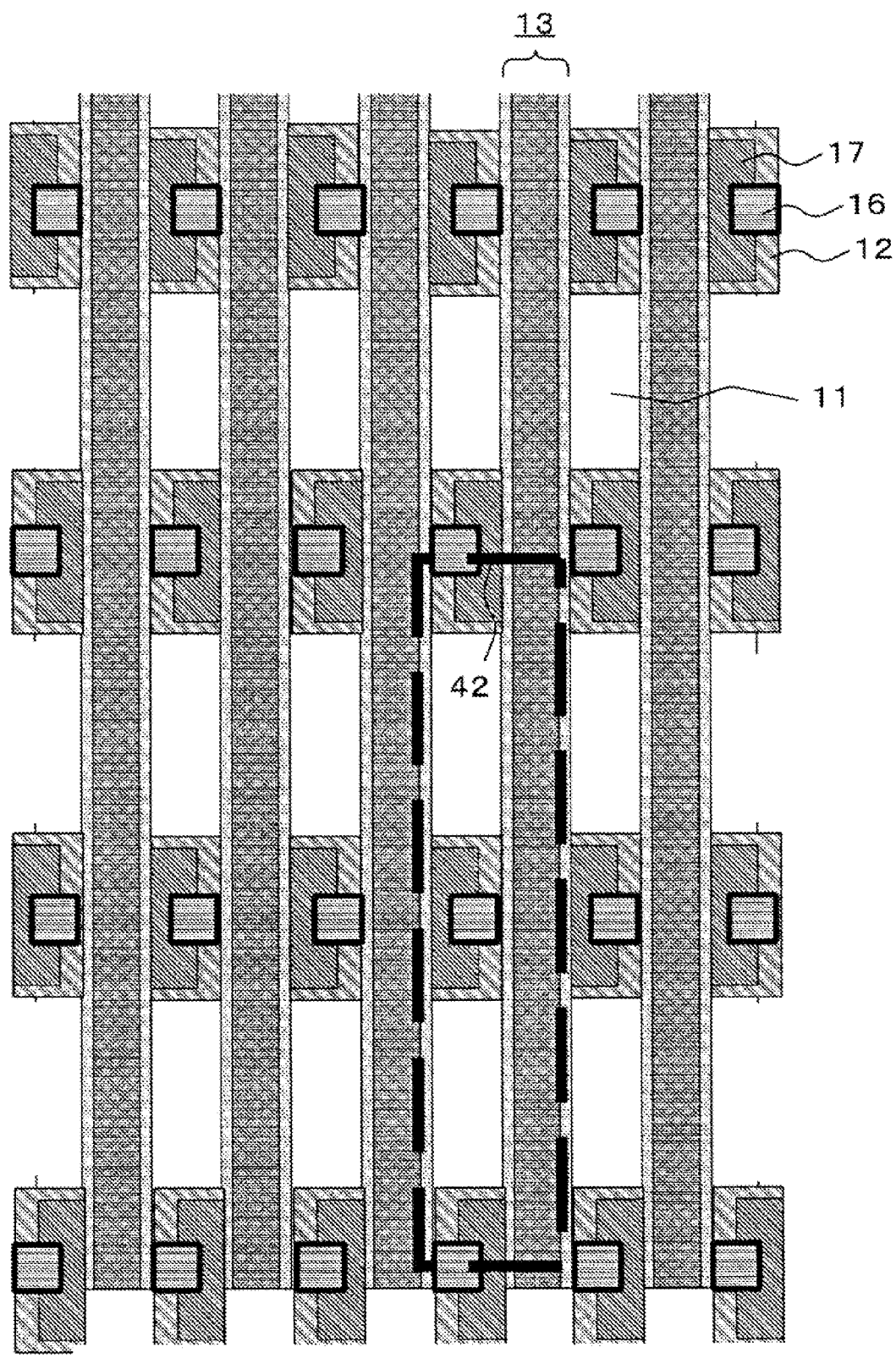
FIG. 12 is a plan view showing main portions of the planar structure of the semiconductor device shown in FIG. 11.

Furthermore, it is clear that the hole dispersion effect is also achieved in the same way when the p-type base region 12c is positioned between the p-type base region 12a and p-type base region 12b across the gate trench 13b (the IGBT shown in FIG. 4), as described hereafter, or also, when the p-type base region 12c is positioned adjacent to these p-type base regions (for example, an IGBT shown in FIG. 12, to be described hereafter). That is, as the nearby p-type base region 12c is sufficiently near (nearest) as seen from the main p-type base region 12a, holes headed toward the nearby p-type base region 12c can also be withdrawn by the main p-type base region 12a.

The heretofore described advantage, that is, the advantage whereby holes flowing toward the nearest p-type base region 12b can also be withdrawn from the main p-type base region 12a, is an advantage first found in the IGBT having the basic structure of the invention. In other words, the basic structure of the invention achieves an advantage that cannot be envisaged from any of the heretofore known IGBTs.

Working Example 1

Figure 5:
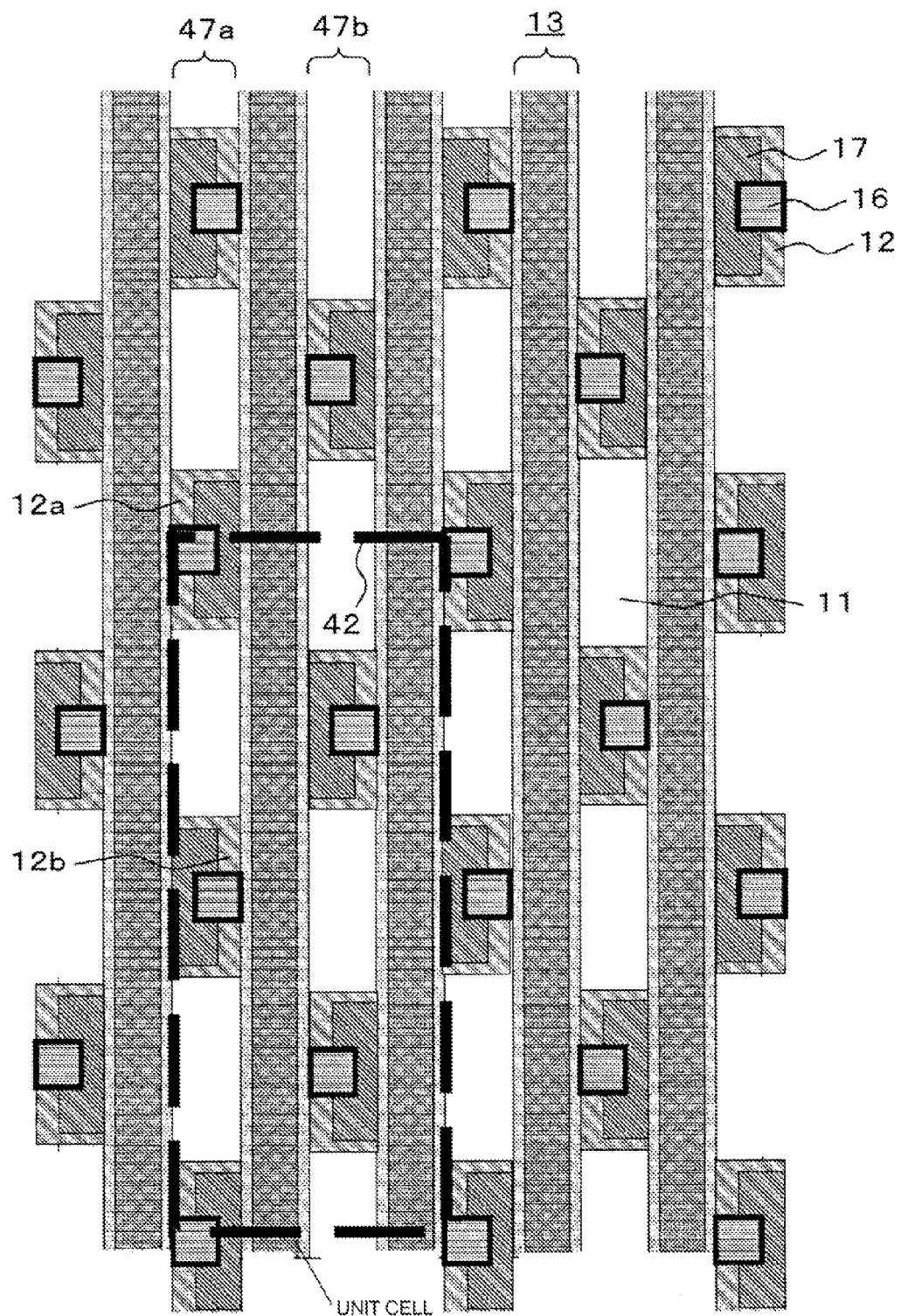
FIG. 5 is a plan view showing main portions of the semiconductor device according to Working Example 1 of the invention.

Next, a description will be given, using FIG. 5, of the IGBT according to Working Example 1 of the invention. FIG. 5 is a plan view showing main portions of the semiconductor device according to Working Example 1 of the invention. FIG. 5 is a plan view when the plural alternating disposition structure shown in FIG. 2(a) are cyclically disposed. The structure of the IGBT according to Working Example 1 is as follows. The gate trench 13 and a p-type base region 12 are taken to be a unit structure. The active region of the IGBT according to the invention is formed by cyclically, repeatedly disposing the unit structure in the lateral direction and longitudinal direction of the gate trench 13. As shown in FIG. 5, a predetermined number of the p-type base region 12 are regularly disposed in the unit structure (the region bounded by dashed lines in FIG. 5. Hereafter referred to as a unit cell) 42.

The p-base regions 12a and 12b are disposed in the unit cell 42 of the IGBT according to Working Example 1 so as to form the alternating disposition structure shown in FIG. 4(a). As the disposition of the p-base regions 12a and 12b differs between a mesa region 47a and a mesa region 47b neighboring each other across the gate trench 13, the length of the unit cell 42 of the IGBT according to Working Example 1 in the lateral direction (hereafter referred to as a short cycle) of the gate trench 13 is a dimension wherein the width of each of the mesa region 47a and mesa region 47b in the gate trench lateral direction, and double the width in the lateral direction of the gate trench 13, are added together. The short cycle of the unit cell 42 of the IGBT according to Working Example 1, being in the region of about 10 mm or less, may be, for example, 5 µm.

Then, the length of the unit cell 42 of the IGBT according to Working Example 1 in the longitudinal direction (hereafter referred to as a long cycle) of the gate trench 13 is a dimension wherein the length of each of the p-type base region 12a and p-type base region 12b in the gate trench longitudinal direction, and double the distance between the p-type base region 12a and p-type base region 12b neighboring each other in the gate trench longitudinal direction, are added together.

Because of this, a total of four p-type base regions 12—the two p-type base regions 12a and 12b, neighboring each other in the gate trench longitudinal direction, disposed in the mesa region 47a, a p-type base region in the mesa region 47b neighboring, across the gate trench 13, the n-type drift region 11 sandwiched by the two p-type base regions 12a and 12b in the mesa region 47a, and a p-type base region neighboring the p-type base region in the mesa region 47b in the gate trench longitudinal direction—are included in the unit cell 42 of the IGBT according to Working Example 1.

The length in the gate trench longitudinal direction of the p-type base region 12, being in the region of about 50 µm or less, may be, for example, 8 µm. The dimensions of the p-type base region 12 depend on the IGBT characteristics and design rules. The distance between the p-type base region 12a and p-type base region 12b neighboring each other in the gate trench longitudinal direction, being in the region of about 10 to 100 µm, may be, for example, 30 µm.

Although the broken lines indicating the unit cell 42 in FIG. 5 are shown in such a way as to intersect the p-type base region 12a in the mesa region 47a, a length wherein the lengths in the gate trench longitudinal direction of portions inside the unit cell 42 of p-type base regions neighboring the p-type base region 12b in the mesa region 47a on one end portion side and the other end portion side in the gate trench longitudinal direction are added together is the length in the gate trench longitudinal direction of the p-type base region 12a (hereafter, the lengths in the gate trench longitudinal direction of the p-type base regions 12 intersected by broken lines indicating the unit cells 42 shown in the unit cells shown in FIGS. 7, 9, 12, 23, 25, 27, and 29 are also the same).

Figure 6:
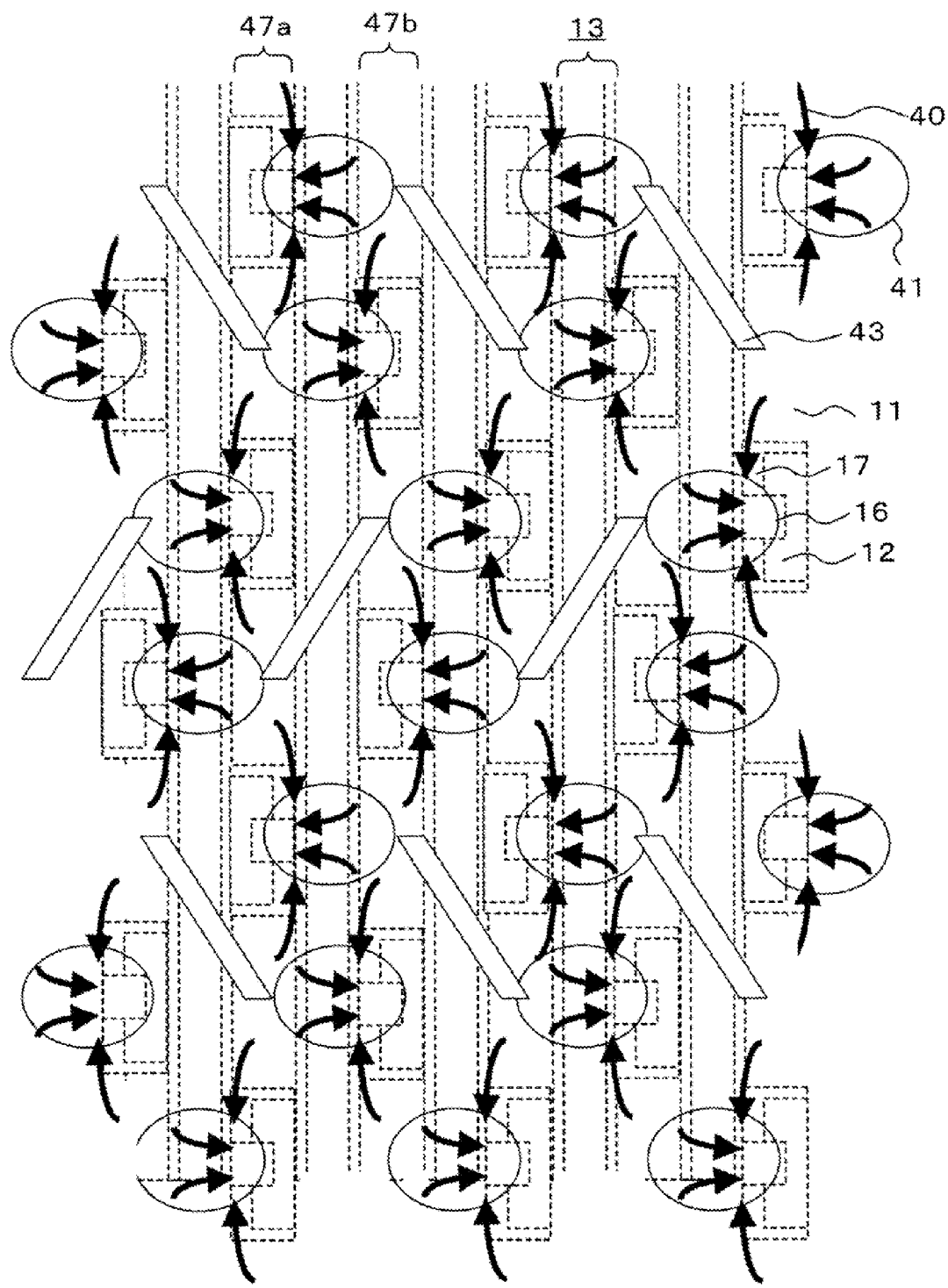
FIG. 6 is a plan view schematically showing current paths of the semiconductor device shown in FIG. 5.

There are two main points of the operational advantages of the IGBT according to Working Example 1. The main point of the first operational advantage of the IGBT according to Working Example 1 is the point that it is possible to evenly distribute the hole concentration and current density thereof between the two gate trenches 13. A description will be given, using FIG. 6 and FIG. 37, of the first operational advantage. FIG. 6 is a plan view schematically showing current paths of the semiconductor device shown in FIG. 5. FIG. 6 is a plan view wherein the flow 40 of a hole current flowing in a condition in which the gate is on, the region 41 in which hole currents collect, and a region 43 in which the hole current is sparse, are schematically shown in the plan view of the IGBT according to Working Example 1 shown in FIG. 5.

Figure 37:
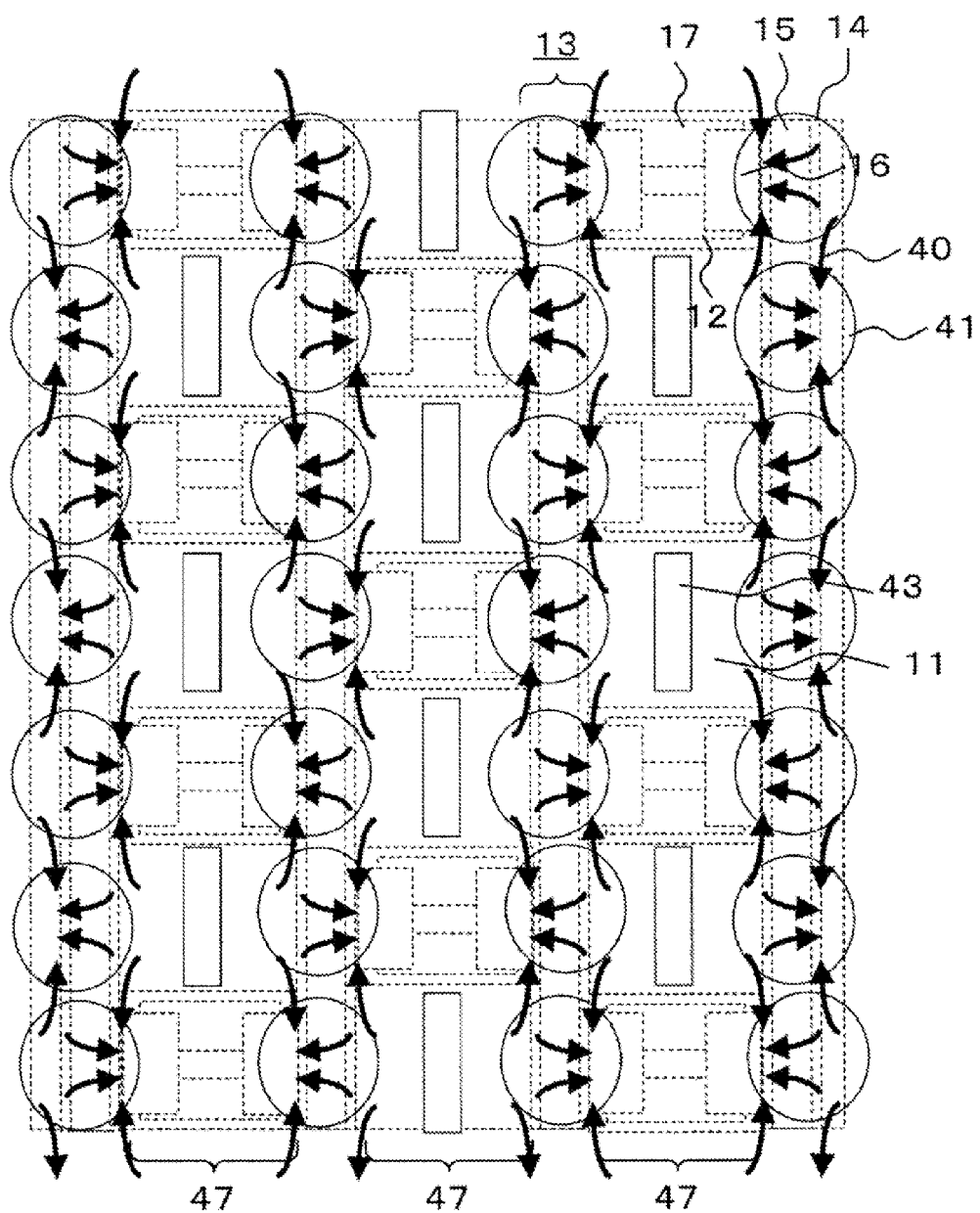
FIG. 37 is a plan view schematically showing main portions of another example of the heretofore known semiconductor device.
Figure 38:
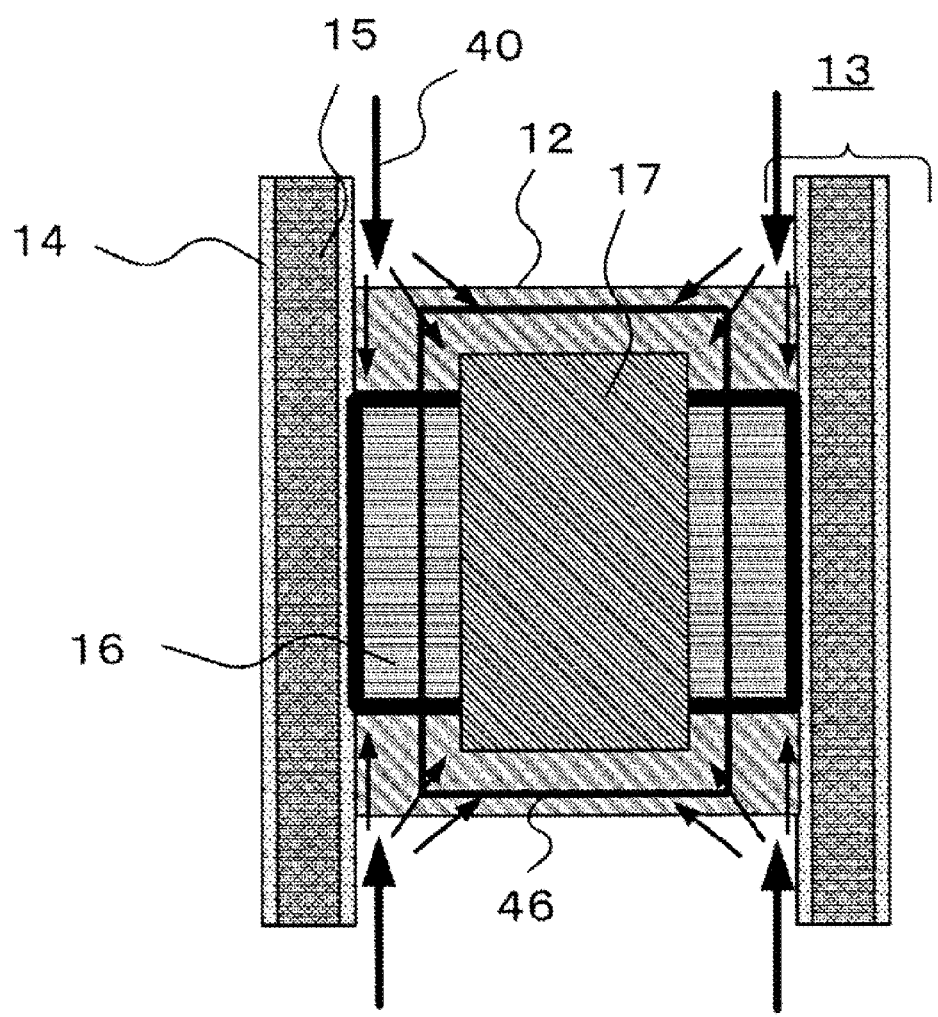
FIG. 38 is a plan view schematically showing main portions of another example of the heretofore known semiconductor device.
Figure 39:
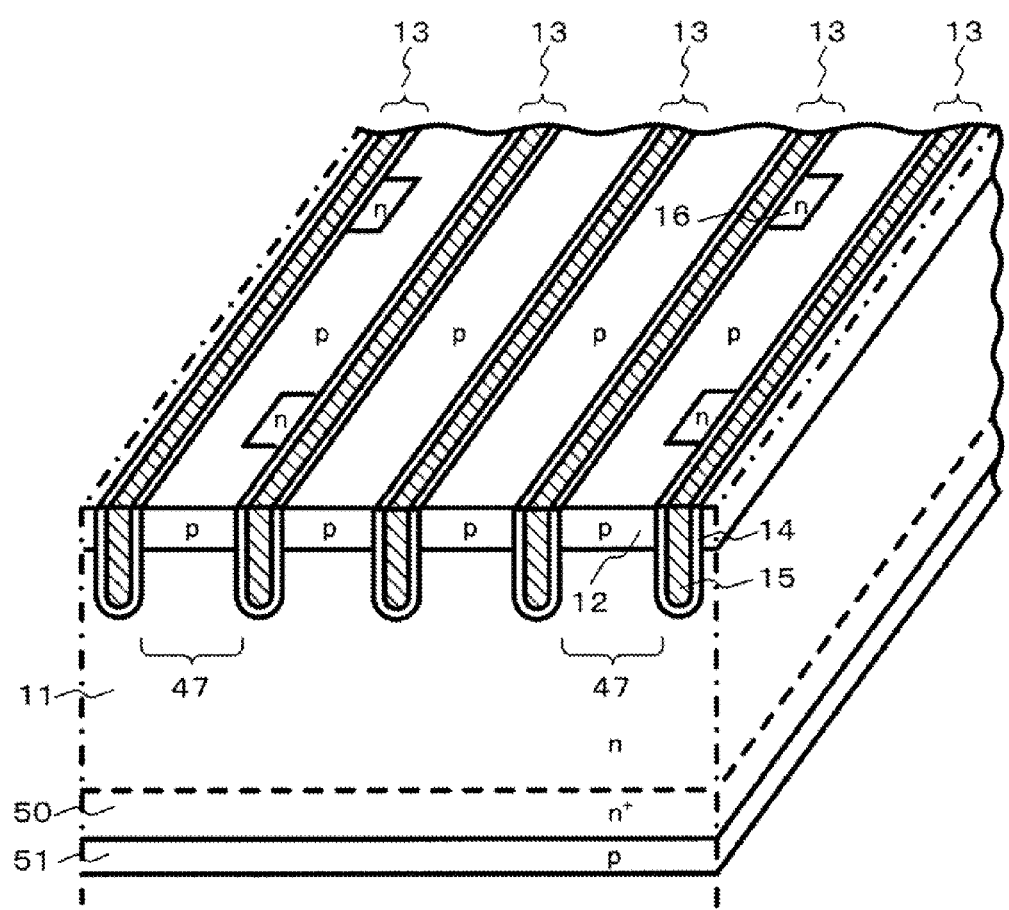
FIG. 39 is a perspective view schematically showing main portions of another example of the heretofore known semiconductor device.

In the case of the heretofore known IGBT shown in FIG. 37, the region 41 in which hole currents collect, not being continuously distributed in the lateral direction of the gate trench 13, is divided by the p-type base region 12 and the region 43 in which the hole current is sparse, as heretofore described. Meanwhile, in the case of the IGBT according to Working Example 1, the region 41 in which hole currents collect and the region 43 in which the hole current is sparse are dispersed in the active region, as shown in FIG. 6. That is, in the IGBT according to Working Example 1, the region 41 in which hole currents collect is not divided in the lateral direction of the gate trench 13 by the region 43 in which the hole current is sparse. In a certain mesa region 47a, the n-type emitter regions 16 formed in each p-type base region 12 are alternately in contact with the gate trenches 13 on either side. Because of this, inversion layer channels are also distributed alternately, in the same way as the disposition of the n-type emitter regions 16.

In this way, as the hole current flows like the hole current flow 40 indicated by arrows in FIG. 6, the region 41 in which hole currents collect is regularly dispersed in the IGBT according to Working Example 1. Also, the region 43 in which the hole current is sparse is also regularly dispersed, and is limited to a portion surrounded by regions 41 in which a total of six hole currents collect-regions 41 neighboring each other in the gate trench longitudinal direction in which two hole currents collect, and regions 41 neighboring each other in the gate trench lateral direction in which four hole currents collect.

That is, as the region 41 in which hole currents collect is not surrounded by the region 43 in which the hole current is sparse, the region 41 in which hole currents collect is continuously distributed in the lateral direction of the gate trench 13, without being divided by the region 43 in which the hole current is sparse. As a result of this, the IGBT according to Working Example 1 is such that, unlike the heretofore known IGBT, regions 41 in which hole currents collect neighboring each other across the gate trench 13 supply each other with holes, and the hole concentration increases. That is, it is possible to increase the IE effect to the maximum.

This kind of advantage whereby the region 41 in which hole currents collect is continuously distributed in the lateral direction of the gate trench 13 is an advantage that is not obtained from any of the heretofore known IGBTs. Also, the even distribution of the hole concentration and hole current density is also related to the heretofore described operational advantage of characteristic (2) of the basic structure of the invention. That is, by the second path along which a hole current also flows from the nearby p-type base region being formed in any p-type base region, a path is formed along which holes are supplied to and from the nearby p-type base region.

The main point of the second operational advantage of the IGBT according to Working Example 1 is a reduction in electrical field strength when turning off. With the heretofore known IGBT, as heretofore described, holes collect in the vicinity of the inversion layer channel when turning off, and the electrical field strength where the holes collect is augmented. That is, in the case of the heretofore known IGBT, the region 41 in which hole currents collect is formed concentrated and continuously in the longitudinal direction of the gate trench 13, as shown in FIG. 37. Because of this, the hole current density of the bottom portion of the gate trench 13 increases, and the electrical field strength is further augmented. Also, when the value of the increased electrical field strength reaches the region of a critical electrical field strength that causes an avalanche current, there is a possibility of an electrical field strength positive feedback also occurring due to an increase in holes.

Meanwhile, with the structure of the IGBT according to Working Example 1, the previously described hole dispersion effect is obtained by the n-type emitter region 16a having the alternating disposition structure, and by the plural alternating disposition structure being disposed cyclically. Furthermore, as shown in FIG. 6, it is possible to form a portion in the longitudinal direction of the gate trench 13 in which no region 41 in which hole currents collect is formed. As a result of this, as it is possible to disperse the region 41 in which hole currents collect in the nearby p-type base region, the density of the hole current concentrated in the bottom portion of the gate trench 13 is reduced. As heretofore described, with the IGBT according to Working Example 1, it is possible to sufficiently suppress an augmenting of electrical field strength caused by a concentration of hole current, and also to suppress a positive feedback thereof.

Next, a description will be given of other characteristics of the structure of the IGBT according to Working Example 1. The first of the characteristics is the method of disposing the plural p-type base regions 12. In FIG. 5, the mesa region 47a in which a certain p-type base region 12a and p-type base region 12b are formed, and the mesa region 47b neighboring the mesa region 47a across the gate trench 13, are considered. With respect to a region of the mesa region 47a in which the p-type base region 12a is formed, the n-type drift region 11 is formed in a region of the mesa region 47b neighboring the p-type base region 12a across the gate trench 13.

That is, it is preferable that the plural p-type base regions 12 are disposed like a check pattern, as shown in FIG. 5. By the p-type base regions 12 being disposed in a check pattern form in this way, the region 41 in which hole currents collect is continuously distributed in both the longitudinal direction and lateral direction of the gate trench 13, as shown in FIG. 6, without being divided by the region 43 in which the hole current is sparse. Because of this, it is possible to increase the IE effect to the maximum, and it is also possible to appropriately disperse the region 41 in which hole currents collect.

Working Example 2

Figure 7:
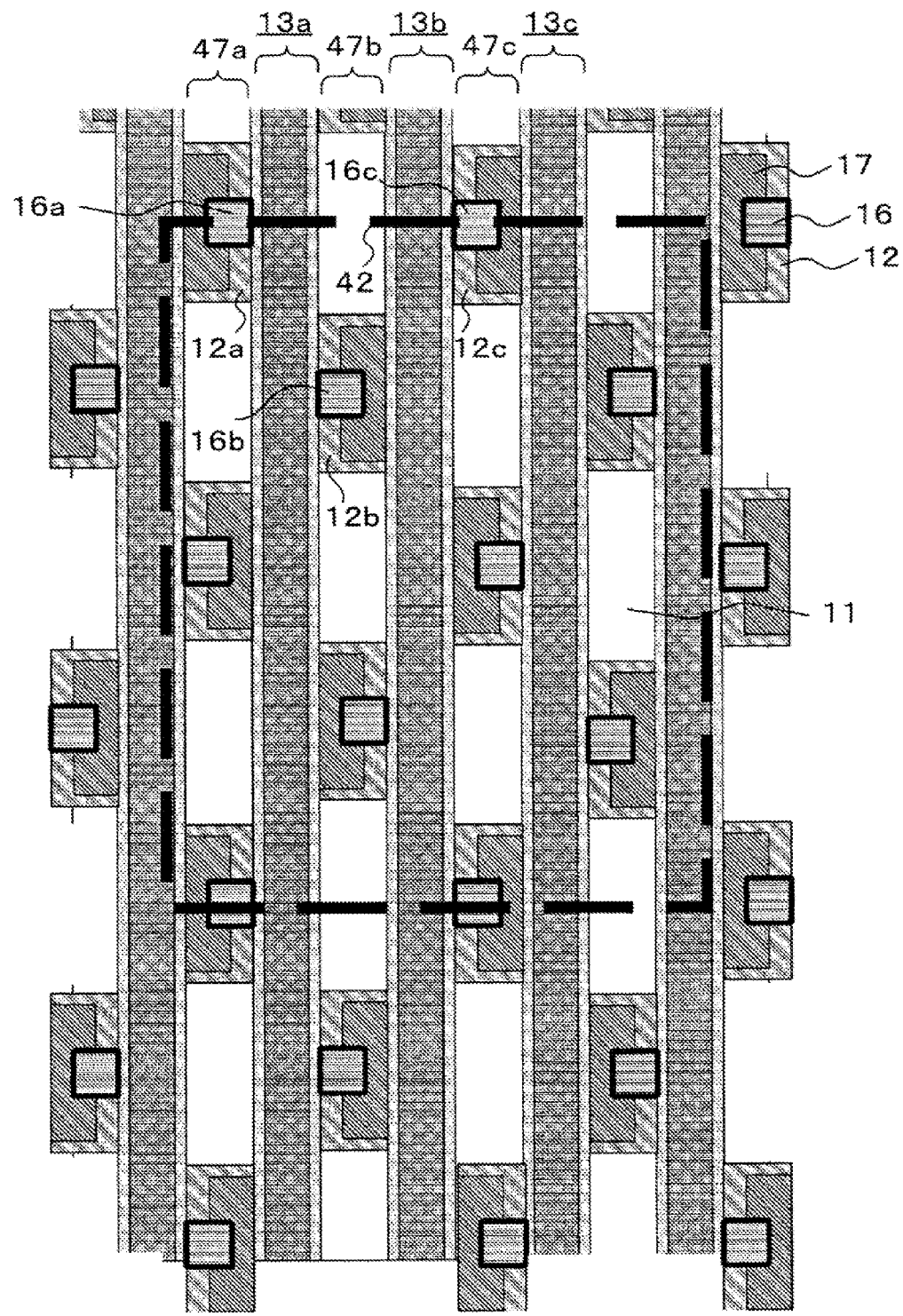
FIG. 7 is a plan view showing main portions of the semiconductor device according to Working Example 2 of the invention.

Next, a description will be given, using FIG. 7, of the IGBT according to Working Example 2 of the invention. FIG. 7 is a plan view showing main portions of the semiconductor device according to Working Example 2 of the invention. The structure of the IGBT according to Working Example 2 is as follows. A difference with respect to Working Example 1 of the IGBT according to Working Example 2 is the phase of the n-type emitter region in the next but one mesa region. The phase of the n-type emitter region 16 is the way of expressing the left and right order, in the longitudinal direction of the gate trench 13, of the gate trench 13 with which the n-type emitter region 16 is alternately and cyclically in contact.

A description will be given of a specific example of the left and right order of the phase of the n-type emitter region 16, taking a case in which the n-type emitter region 16 formed between two neighboring gate trenches 13 is in contact with one gate trench 13 neighboring on the right side in the plane of the drawing as a right side turn, and a case in which the n-type emitter region 16 is in contact with the other gate trench 13 neighboring on the left side in the plane of the drawing as a left side turn.

For example, it is taken that the left and right order of the gate trench 13 with which the n-type emitter region is in contact in a certain one mesa region 47a is that the right side is first, and the left side is next. At this time, in the event that the left and right order of the gate trench 13 with which the n-type emitter region is in contact in the adjacent mesa region 47b is also that the right side is first, and the left side is next, it is taken that the phase thereof is the same (same phase). Meanwhile, in the event that, conversely, the left side is first, and the right side is next, in the adjacent mesa region 47b, it is taken that the phase thereof is the opposite (opposite phase).

More specifically, with regard to the IGBT according to Working Example 2 shown in FIG. 7, it is taken that the n-type emitter region 16a in the p-type base region 12a in a certain mesa region 47a is in contact with, for example, the right side gate trench 13a. At this time, the n-type emitter region 16c of the p-type base region 12c in a mesa region 47c (next but one mesa region 47c), neighboring across the gate trench 13a, mesa region 47b, and gate trench 13b as seen from the mesa region 47a, is in contact with the left side gate trench 13b, the opposite of the n-type emitter region 16a.

In this case, the short cycle of the unit cell 42 of the IGBT according to Working Example 2 is longer than the short cycle of the unit cell of the IGBT according to Working Example 1 by a width wherein double each of the width in the gate trench lateral direction of the mesa region and the width of the gate trench in the lateral direction are added together. That is, the unit cell 42 of the IGBT according to Working Example 2 has, as a unit structure, a structure wherein two of the unit cell of the IGBT according to Working Example 1 are placed adjacent in the gate trench lateral direction. Because of this, eight p-type base regions 12 are included in the unit cell 42 of the IGBT according to Working Example 2.

Figure 8:
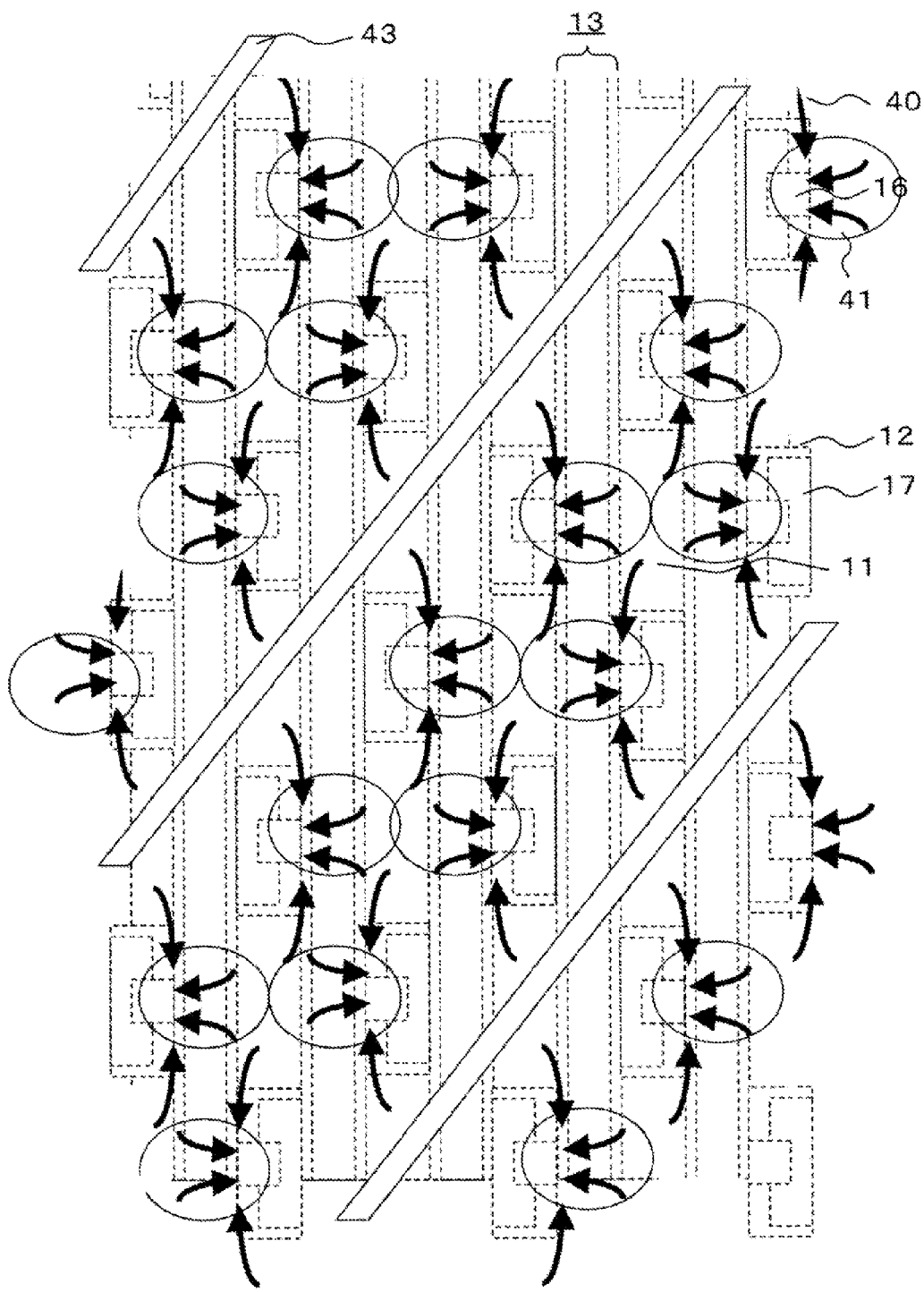
FIG. 8 is a plan view schematically showing current paths of the semiconductor device shown in FIG. 7.

A description will be given, using FIG. 8, of an operational advantage of the IGBT according to Working Example 2. FIG. 8 is a plan view schematically showing current paths of the semiconductor device shown in FIG. 7. FIG. 8 is a plan view wherein the flow 40 of a hole current flowing in a condition in which the gate is on, the region 41 in which hole currents collect, and the region 43 in which the hole current is sparse, are schematically shown in the plan view of the IGBT according to Working Example 2 shown in FIG. 7. A difference with respect to Working Example 1 (FIG. 4) of the IGBT according to Working Example 2 is that the region 41 in which hole currents collect and the region 43 in which the hole current is sparse are cyclically distributed in a condition in which they are diagonal with respect to the longitudinal direction of the gate trench 13.

The cycle in the lateral direction of the gate trench 13 of the region 43 in which the hole current is sparse is the same as the repeated cycle of the unit cell 42 shown in FIG. 7. Because of this, the IGBT according to Working Example 2 is such that, unlike the IGBT according to Working Example 1, the region 41 in which hole currents collect is divided by the region 43 in which the hole current is sparse. However, with the IGBT according to Working Example 2, as the cycle of the region 43 in which the hole current is sparse is long in comparison with that of the heretofore known IGBT, the same advantage as in Working Example 1 is obtained, even though the region 41 in which hole currents collect is divided.

Figure 9:
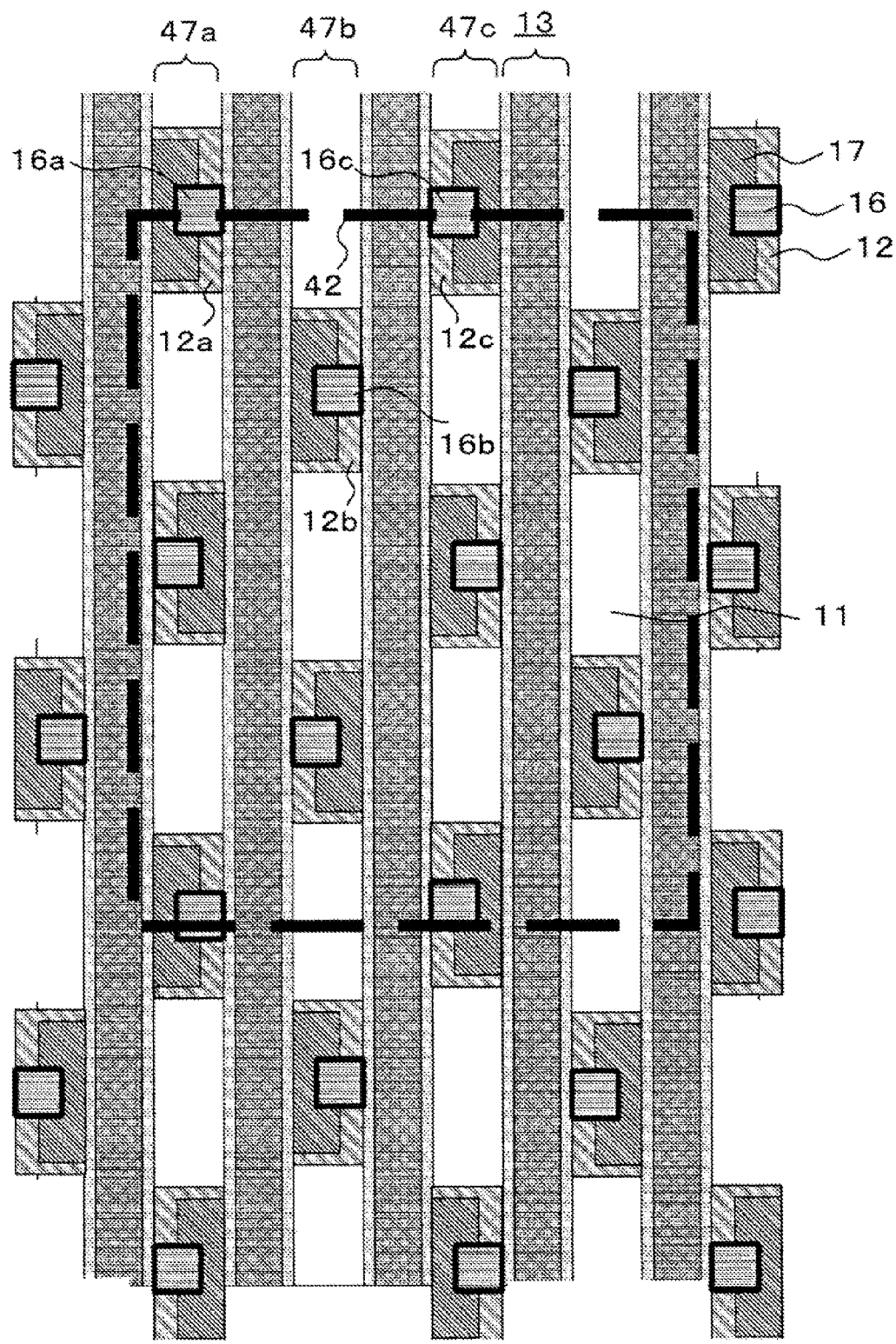
FIG. 9 is a plan view showing main portions of another example of the semiconductor device according to Working Example 2 of the invention.

FIG. 9 is a plan view showing main portions of another example of the semiconductor device according to Working Example 2 of the invention. The IGBT shown in FIG. 9 is a modification example having a structure equivalent to that of the IGBT shown in FIG. 7. The IGBT with the structure shown in FIG. 9 is also one example of the IGBT according to Working Example 2. A difference from the IGBT shown in FIG. 7 of the IGBT according to Working Example 2 shown in FIG. 9 is that the phase of the n-type emitter region 16b of the p-type base region 12b in the mesa region 47b adjacent to the p-type base region 12a is opposite to the phase of the n-type emitter region 16b of the p-type base region 12b shown in FIG. 7.

Figure 10:
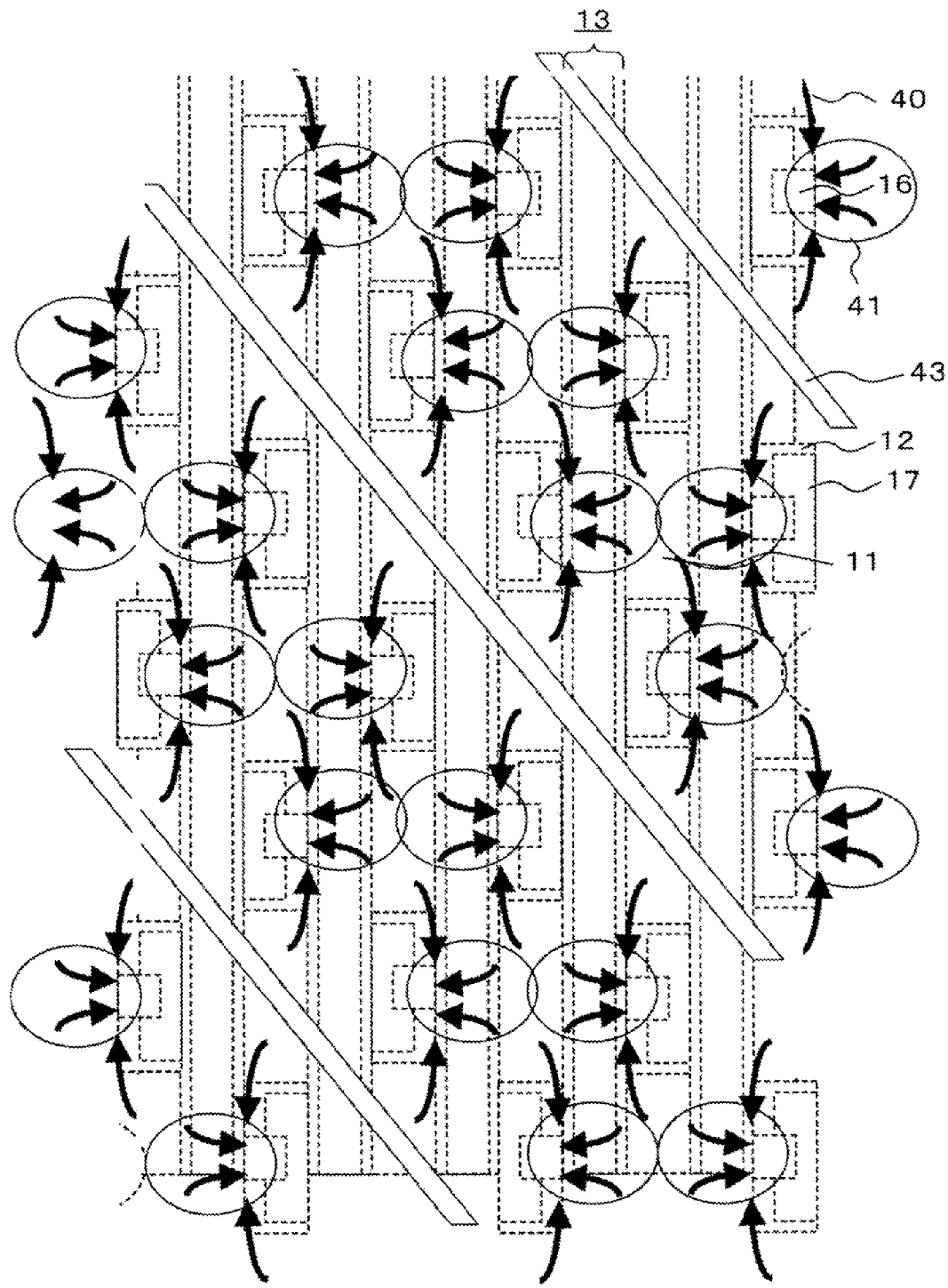
FIG. 10 is a plan view schematically showing current paths of the semiconductor device shown in FIG. 9.

A description will be given, using FIG. 10, of an operational advantage of the IGBT according to Working Example 2 shown in FIG. 9. FIG. 10 is a plan view showing current paths of the semiconductor device shown in FIG. 9. FIG. 10 is a plan view wherein the flow 40 of a hole current flowing in a condition in which the gate is on, the region 41 in which hole currents collect, and the region 43 in which the hole current is sparse, are schematically shown in the plan view of the modification example of the IGBT according to Working Example 2 shown in FIG. 9. A difference from the current paths of the IGBT shown in FIG. 8 of the current paths of the IGBT shown in FIG. 10 is that the region 41 in which hole currents collect and the region 43 in which the hole current is sparse are distributed axisymmetrically with respect to the longitudinal direction of the gate trench 13. The cycle in the lateral direction of the gate trench 13 of the region 43 in which the hole current is sparse is the same as in the case of the IGBT shown in FIG. 8. Because of this, the same advantage as with the IGBT shown in FIGS. 7 and 8 is obtained with the IGBT shown in FIGS. 9 and 10, and the IGBT shown in FIGS. 9 and 10 is structurally equivalent to the IGBT shown in FIGS. 7 and 8.

Working Example 3

Figure 13:
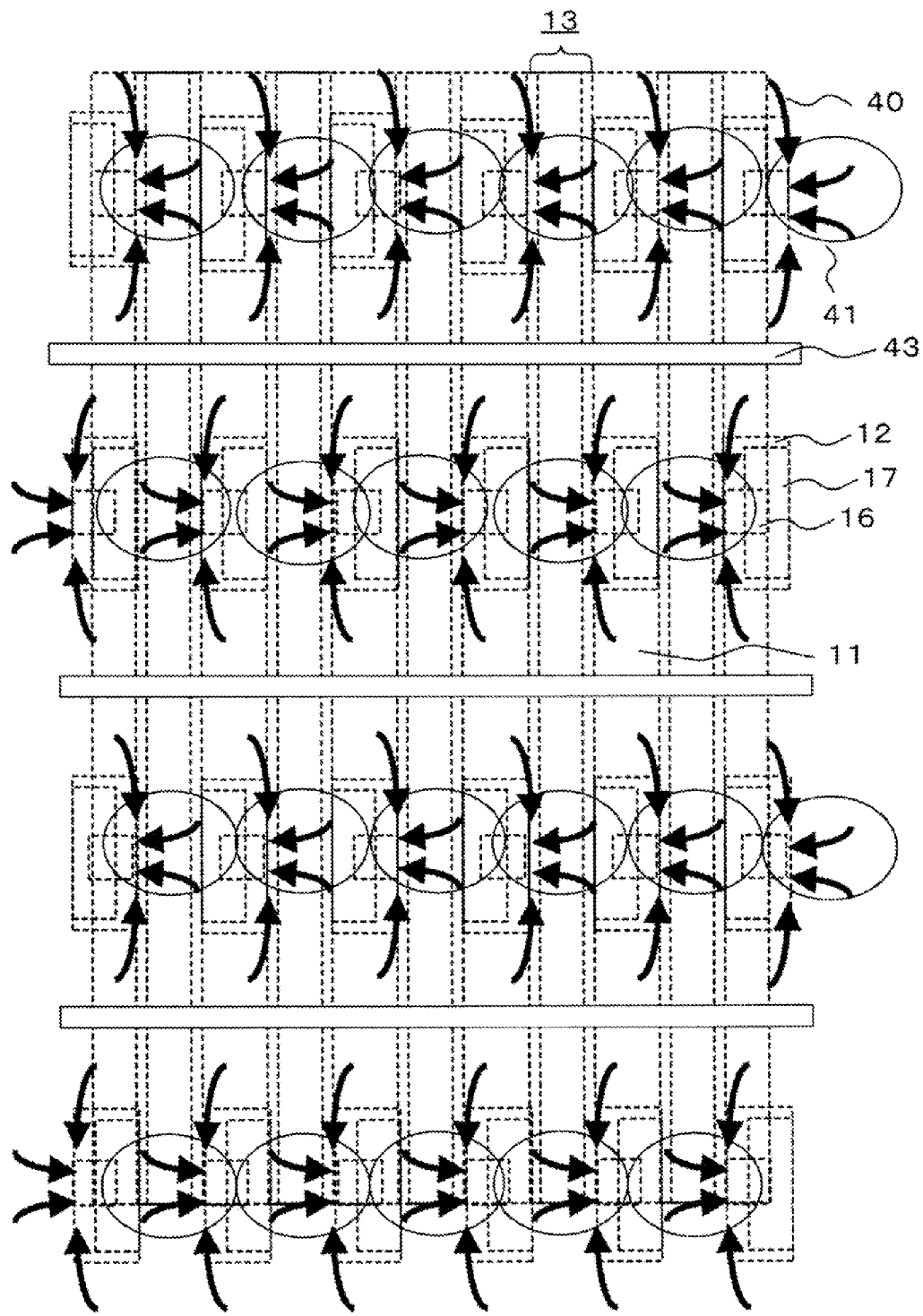
FIG. 13 is a plan view schematically showing current paths of the semiconductor device shown in FIG. 12.

Next, a description will be given, using FIG. 11, FIG. 12, and FIG. 13, of the IGBT according to Working Example 3 of the invention. FIG. 11 is an explanatory diagram showing main portions of the semiconductor device according to Working Example 3 of the invention. FIG. 11(*a*) is a plan view showing main portions of the semiconductor device according to Working Example 3 of the invention. FIG. 11(*b*) is a sectional view along a section line A-A' of FIG. 11(*a*). A difference with respect to Working Example 1 of the IGBT according to Working Example 3 is that the disposition of the p-type base region 12 is a stripe form rather than a check pattern form. That is, with the IGBT according to Working Example 3, the p-type base region 12, rather than the n-type drift region, is formed in the mesa region adjacent across the gate trench 13 as seen from a certain p-type base region 12.

As shown in FIG. 11(*b*), the p-type base region 12 is formed between all neighboring gate trenches 13 in a cross-section along the section line A-A' of FIG. 11(*a*). The gate oxide film 14 is formed on the inner wall of the gate trench 13, and furthermore, the gate electrode 15 (for example, conductive multi-crystalline silicon) is formed on the inner side of the gate oxide film 14. The p-type base region 12 is formed shallower than the gate trench 13 between neighboring gate trenches 13. The n-type emitter region 16 is formed so as to be in contact with only one gate trench 13 of neighboring gate trenches 13.

The side of the n-type emitter region 16 not in contact with the gate trench 13 terminates on the inner side of the p-type contact region 17. The n-type emitter region 16 is formed shallower than the p-type contact region 17. An insulating film 18 is formed on the upper surface of the gate trench 13 and the front surface of the semiconductor substrate, and opened by a contact aperture portion 46. An emitter electrode 19 is formed on the front surface of the semiconductor substrate and the upper surface of the insulating film 18, electrically connecting the p-type contact region 17 and n-type emitter region 16 via the contact aperture portion 46.

An n-type field stop region 50 in contact with the n-type drift region 11, and a p-type collector region 51 in contact with the n-type field stop region 50, are formed on the rear surface side (toward the bottom in the plane of the drawing) of the substrate that forms the n-type drift region 11. Then, a collector electrode 22 in contact with the p-type collector region 51 is formed on the rear surface of the substrate.

FIG. 12 is a plan view showing main portions of the planar structure of the semiconductor device shown in FIG. 11. FIG. 12 is a plan view wherein the planar structure of the semiconductor device shown in FIG. 11(*a*) is scaled down. As shown in FIG. 12, the p-type base region 12 is formed in a stripe form. The area of the unit cell 42 of the IGBT according to Working Example 3 is smaller than that of the unit cell of the IGBT according to Working Example 1 and Working Example 2. Specifically, the short cycle of the unit cell 42 of the IGBT according to Working Example 3 is a dimension wherein one each of the width in the gate trench lateral direction of the mesa region 47 and the width in the lateral direction of the gate trench 13 are added together. The long cycle of the unit cell 42 of the IGBT according to Working Example 3 is the same as the long cycle of the unit cell 42 of the IGBT according to Working Examples 1 and 2. Because of this, the two p-type base regions 12 neighboring each other in the gate trench longitudinal direction in one mesa region 47 being included in the unit cell 42 of the IGBT according to Working Example 3, the total number of p-type base regions 12 in the unit cell 42 of the IGBT according to Working Example 3 is two.

A description will be given, using FIG. 13, of an operational advantage of the IGBT according to Working Example 3 shown in FIG. 12. FIG. 13 is a plan view schematically showing current paths of the semiconductor device shown in FIG. 12. FIG. 13 is a plan view wherein the flow 40 of a hole current flowing in a condition in which the gate is on, the region 41 in which hole currents collect, and the region 43 in which the hole current is sparse, are schematically shown in the plan view of the IGBT according to Working Example 3 shown in FIG. 12.

A difference from the IGBT shown in FIG. 4 of the IGBT according to Working Example 3 shown in FIG. 12 is that, although the region 41 in which hole currents collect is distributed continuously in the lateral direction of the gate trench 13, the region 43 in which the hole current is sparse is also distributed continuously in the lateral direction in the same way. That is, the region 41 in which hole currents collect is divided in the longitudinal direction of the gate trench 13 by the region 43 in which the hole current is sparse. However, as the region 41 in which hole currents collect is continuous in the lateral direction of the gate trench, the IE effect is sufficiently strong with the IGBT according to Working Example 3 too. Also, with the IGBT according to Working Example 3, as the region 43 in which the hole current is sparse is formed in the gate trench 13, it is also possible to suppress the previously described kind of increase in electrical field strength when turning off.

(Manufacturing Method)

Figure 14:
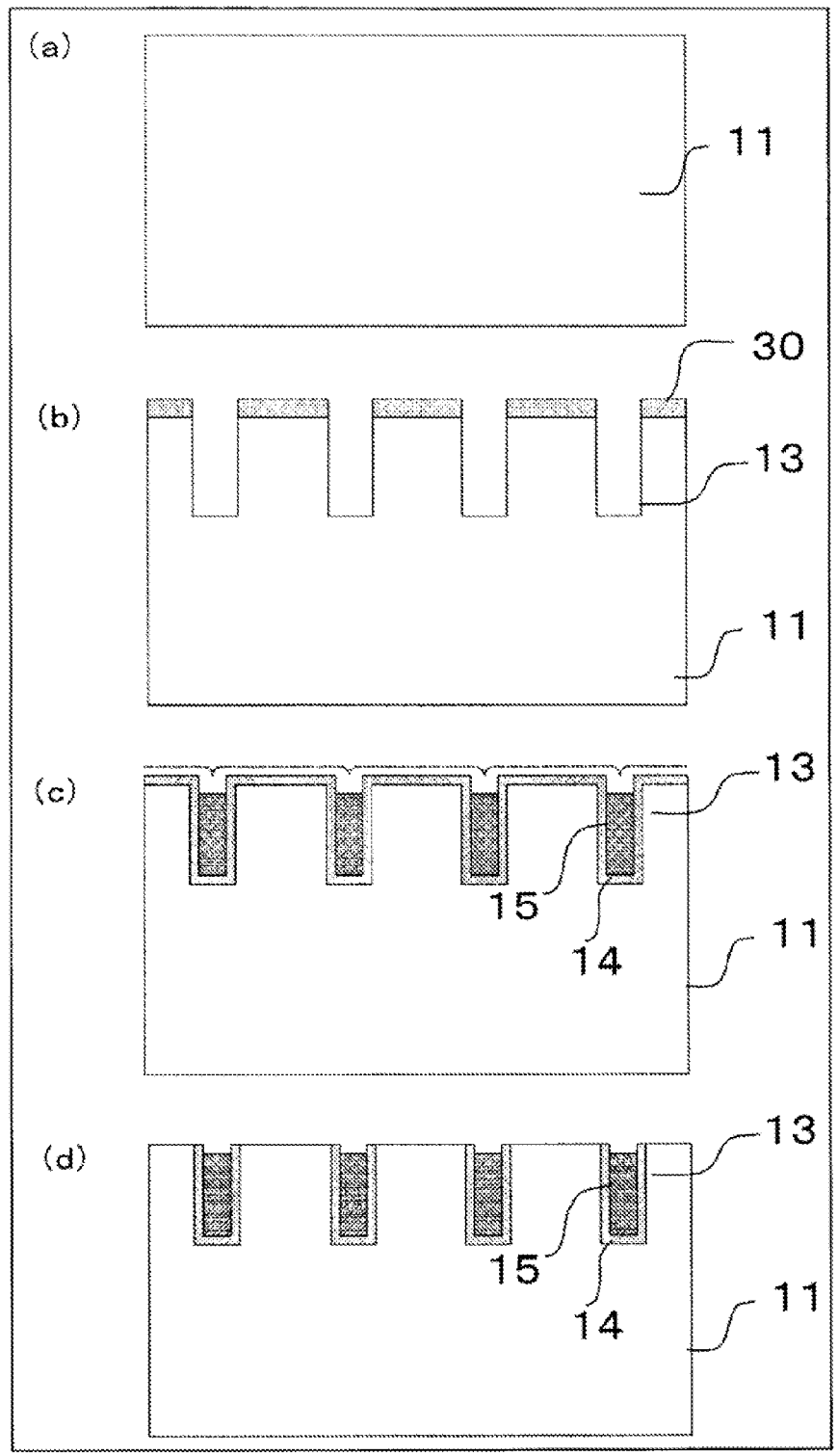
FIG. 14 is sectional views showing main portions of a sectional structure partway through the manufacturing of the semiconductor device according to Working Example 3 of the invention.
Figure 15:
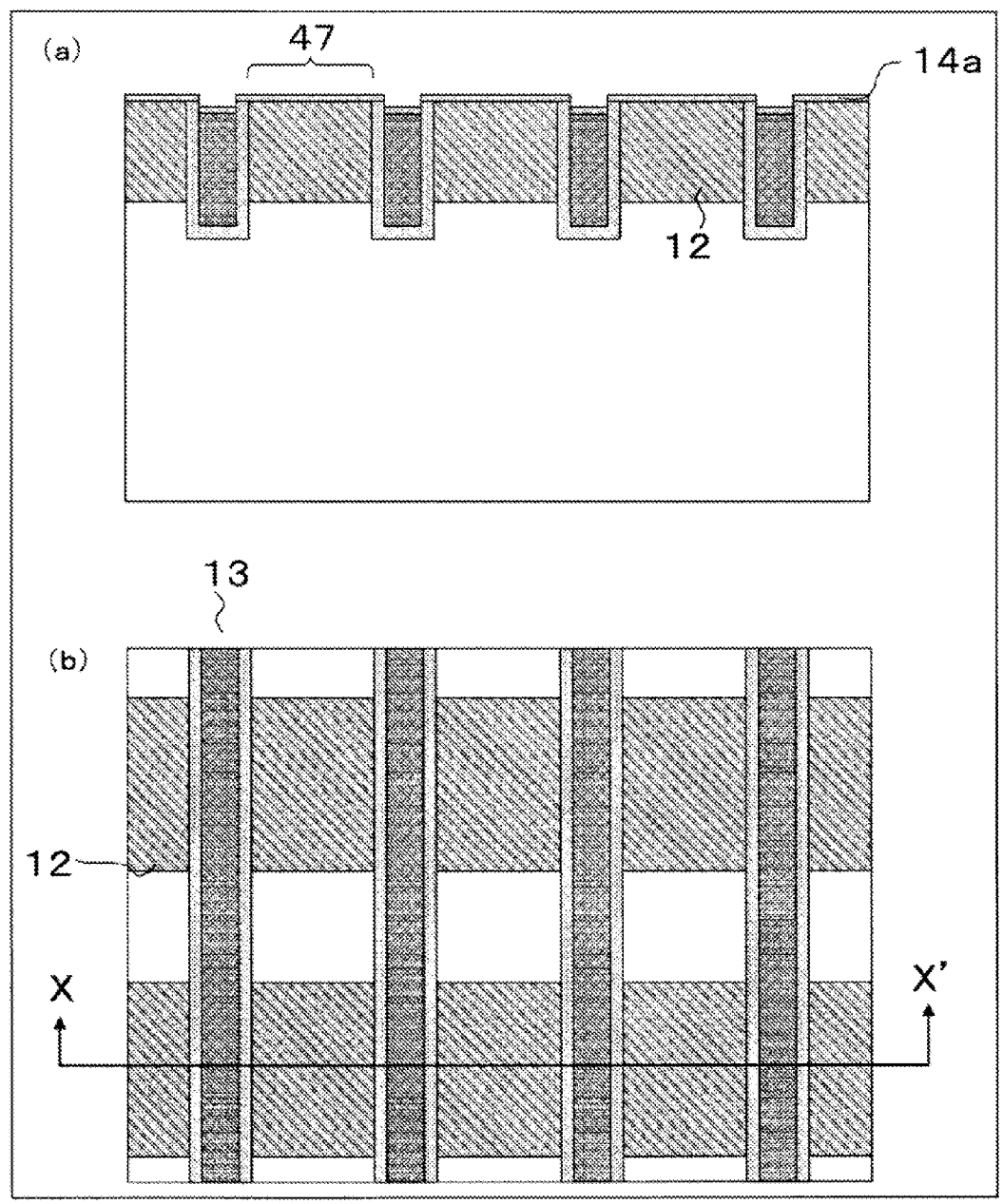
FIG. 15 is an explanatory diagram showing main portions of a sectional structure partway through the manufacturing of the semiconductor device according to Working Example 3 of the invention.
Figure 16:
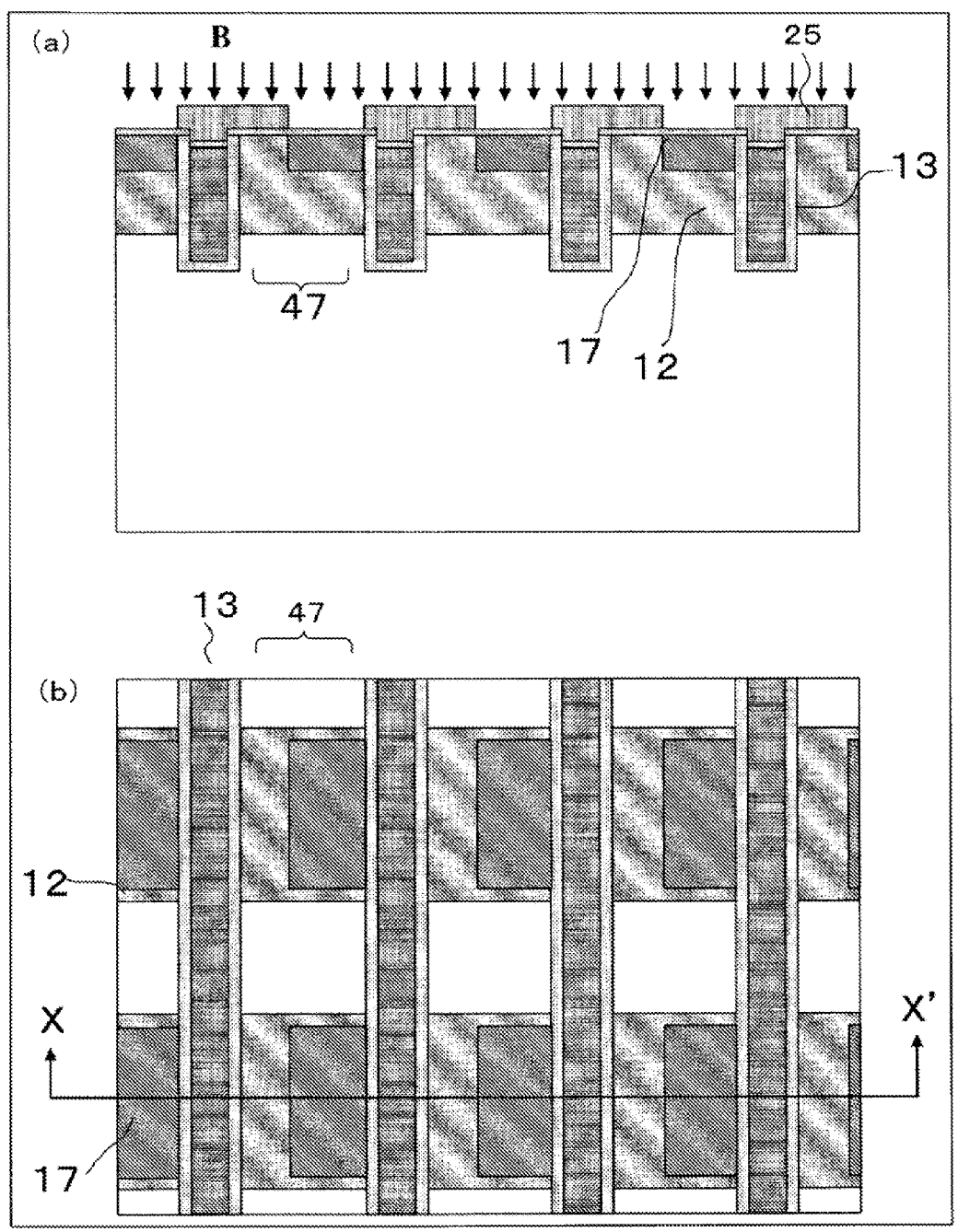
FIG. 16 is an explanatory diagram showing main portions of a sectional structure partway through the manufacturing of the semiconductor device according to Working Example 3 of the invention.
Figure 17:
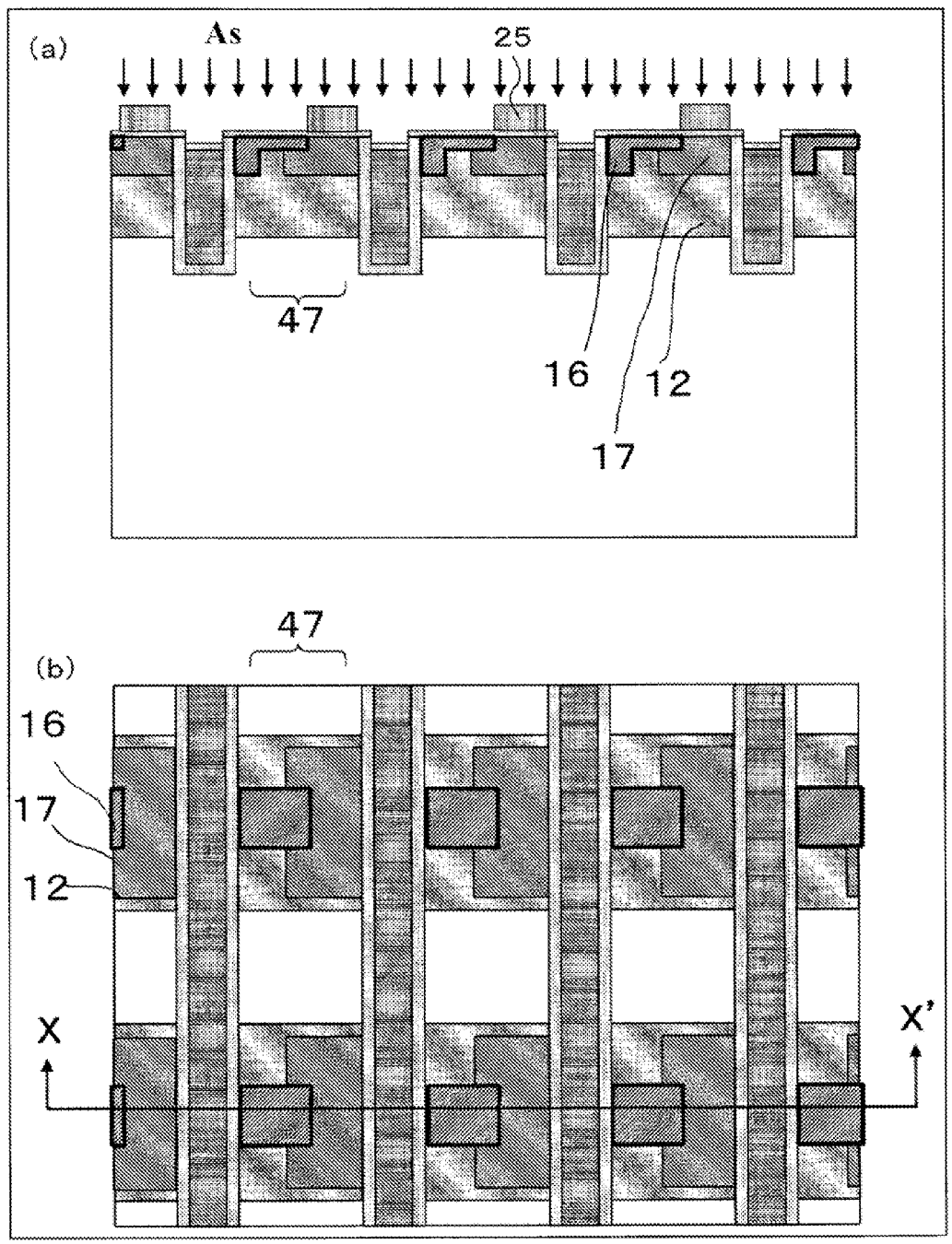
FIG. 17 is an explanatory diagram showing main portions of a sectional structure partway through the manufacturing of the semiconductor device according to Working Example 3 of the invention.
Figure 18:
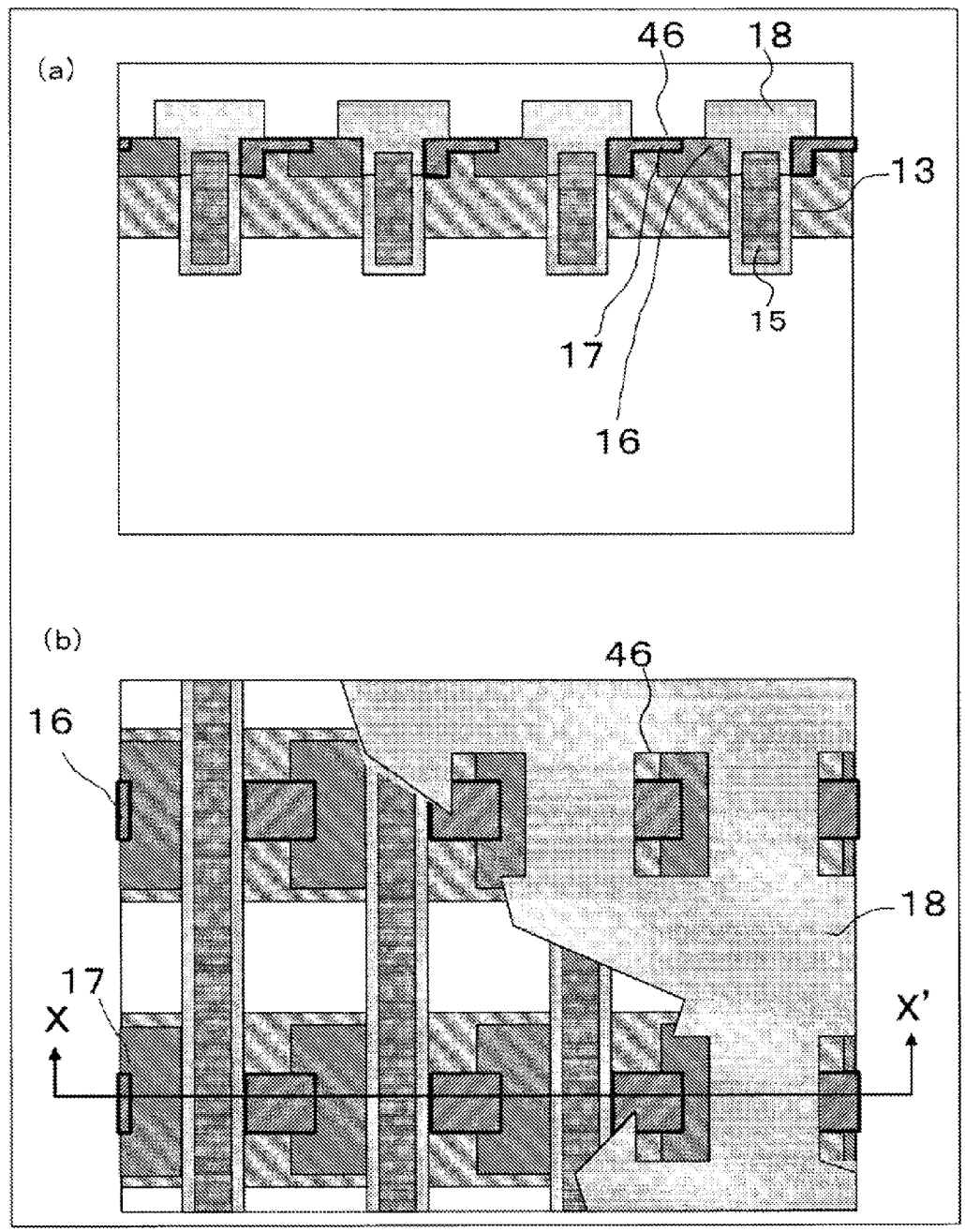
FIG. 18 is an explanatory diagram showing main portions of a sectional structure partway through the manufacturing of the semiconductor device according to Working Example 3 of the invention.

Next, a description will be given of a method of manufacturing the IGBT according to Working Example 3. FIG. 14 is sectional views showing main portions of a sectional structure partway through the manufacturing of the semiconductor device according to Working Example 3 of the invention. FIGS. 15 to 18 are explanatory diagrams showing main portions of a sectional structure partway through the manufacturing of the semiconductor device according to Working Example 3 of the invention. A large number of the manufacturing steps for the IGBT according to the invention are basically the same as those for the heretofore known IGBT. Firstly, as shown in FIG. 14(*a*), there is prepared a semiconductor substrate formed of an n-type semiconductor silicon with a resistivity of, for example, approximately 50 Ωcm. The semiconductor substrate subsequently becomes the n-type drift region 11 of the IGBT. The surface orientation of the front surface of the semiconductor substrate is, for example, (100) surface orientation.

Then, a heretofore known guard ring layer (one kind of termination structure, formed on the periphery of the cell region, that has a function of reducing an electrical field on the front surface of the substrate), omitted from the drawing, is formed on the front surface of the semiconductor substrate.

When carrying out heat treatment in order to form the guard ring layer, an oxide film 30 is formed, as shown in FIG. 14(b). Then, an aperture portion is formed in the oxide film 30 in a photolithography step.

Next, the gate trench 13 is formed by etching the semiconductor substrate (the subsequent n-type drift region 11) to a predetermined depth, with the oxide film 30 as a mask. In the fabrication (manufacture) of the IGBT according to Working Example 3, the gate trench 13 is formed by, for example, providing aperture portions with an aperture width of 0.8 μm at intervals of 5 μm in the oxide film 30, and carrying out an anisotropic RIE (Reactive Ion Etching).

Next, as shown in FIG. 14(c), an unshown sacrificial oxide film is formed in the interior of the gate trench 13 using an oxidation process. The sacrificial oxide film is formed in order to remove an inner surface defect layer formed along with the formation of the gate trench 13 in the semiconductor substrate. Next, the inner surface defect layer formed as a result of the formation of the gate trench 13 is removed by removing the sacrificial oxide film. Then, all oxide films in the active region are once removed, after which the formation of the gate oxide film 14 is carried out. The gate oxide film 14, with a thickness of 80 to 120 nm, is formed in the interior of the gate trench 13 in this oxidation step.

Next, a multi-crystalline silicon film that forms the gate electrode 15 is formed over the whole surface on the semiconductor substrate using a low pressure CVD method. The thickness of the multi-crystalline silicon film is, for example, 0.5 to 1 μm. When growing the multi-crystalline silicon film, the electrical resistance of the multi-crystalline silicon film is reduced by doping with impurity atoms of phosphorus (P), boron (B), or the like. As a result of forming the multi-crystalline silicon film, the gate electrode 15 is embedded in the interior of the gate trench 13.

Next, the multi-crystalline silicon film (gate electrode 15) is etched back using an anisotropic or isotropic gas etching. The etching of the multi-crystalline silicon film is stopped at a stage at which the gate oxide film 14 is exposed on the surface of the semiconductor substrate (n-type drift region 11). The gate electrode 15 embedded in the interior of the gate trench 13 is formed by the etch back of the multi-crystalline silicon film, as shown in FIG. 14(c).

As an amount comparable to the thickness of the multi-crystalline silicon film deposited on the semiconductor substrate is etched back when etching back the multi-crystalline silicon film, the gate electrode 15 is etched back to a depth of in the region of 100 to 150 nm from the apex portion (aperture portion) of the gate trench 13. Next, as shown in FIG. 14(d), only the gate oxide film 14 on the front surface side of the semiconductor substrate (n-type drift region 11) is removed, thereby exposing the front surface of the semiconductor substrate. At this time, for example, an anisotropic etching is used as a method of removing the gate oxide film 14.

Removing the gate oxide film 14 on the front surface of the semiconductor substrate using an anisotropic etching is preferable as the gate oxide film 14 on the upper portion of the side wall portion of the gate trench 13 is not etched, and the gate oxide film 14 remains in the original thick state. Furthermore, as well as the ion implantation surfaces of the p-type base region, p-type contact region, and n-type emitter region formed in subsequent steps, but omitted from the drawing, being the same surface, the formation of the p-type base region is carried out after the formation of the gate trench 13. As a result of this, it is possible for the diffusion depth of the p-type base region to be less than that of the gate trench 13. Furthermore, the anisotropic etching is also advantageous as it is possible to prevent boron being introduced into the oxide film during the formation of the thermal oxide film.

Next, as shown in FIG. 15(a), a screen oxide film 14a with a thickness of 20 to 50 nm is formed on the front surface of the semiconductor substrate. The thickness of the screen oxide film 14a is a thickness through which boron ions or arsenic (As) ions may sufficiently permeate when implanting ions. Herein, FIG. 15(a) is a sectional view showing a sectional structure along a section line X-X' in the plan view of the IGBT partway through manufacturing shown in FIG. 15(b).

Next, the front surface of the semiconductor substrate is covered with a resist (not shown). Next, the resist is patterned using a photolithography technique, forming a resist mask (not shown) in which is exposed a region in which the p-type base region 12 of the semiconductor substrate is formed. Then, with the resist mask as a mask, a boron ion implantation is carried out under ion implantation conditions of an acceleration voltage in the region of, for example, 50 keV, and a dose in the region of, for example, $1 \times 10^{13}/cm^2$ to $5 \times 10^{14}/cm^2$. Next, after removing the resist mask, a thermal diffusion process is carried out at in the region of 1,100° C.

As a result of the thermal diffusion process, the p-type base region 12 is formed in a stripe form, in a pattern perpendicular to the gate trench 13, as shown in FIG. 15(b). With regard to the dimensions of the p-type base region 12 of the IGBT according to Working Example 3, the width in the longitudinal direction of the gate trench 13 on the front surface of the semiconductor substrate into which boron ions are implanted may be, for example, approximately 6 μm, while the width into which boron ions are not implanted (the width after diffusion caused by heat treatment) may be, for example, approximately 14 μm. The p-type base region 12 shown by hatching in FIG. 15(b) is a p-type base region having the width after thermal diffusion.

Next, as shown in FIG. 16(a), the p-type contact region 17 is formed in the surface layer of the p-type base region 12. FIG. 16(a) is a sectional view showing a sectional structure along a section line X-X' in the plan view of the IGBT partway through manufacturing shown in FIG. 16(b). Specifically, the p-type contact region 17 is formed in the following way. The front surface of the semiconductor substrate is covered with a resist (not shown). Next, the resist is patterned using a photolithography technique, forming a resist mask 25 in which is opened a region in which the p-type contact region 17 of the mesa region 47 is formed.

Then, with the resist mask 25 as a mask, a boron ion implantation is carried out under ion implantation conditions of an acceleration voltage in the region of, for example, 100 keV, and a dose in the region of, for example, $1 \times 10^{15}/cm^2$ to $5 \times 10^{15}/cm^2$. Next, after removing the resist mask 25, a thermal diffusion process is carried out at in the region of 1,000° C. As a result of this, the p-type contact region 17 in contact with the gate trench 13 on, for example, the right side in the plane of the drawing is selectively formed in the surface layer of the p-type base region 12 formed between neighboring gate trenches 13, as shown in FIGS. 16(a) and 16(b).

Herein, the dimension of the p-type contact region 17 in the longitudinal direction of the gate trench 13 may be such that the width on the front surface of the semiconductor substrate into which boron ions are implanted is, for example, approximately 5.5 μm. Also, the dimension of the p-type contact region 17 in the lateral direction of the gate trench 13 may be such that the width on the front surface of the semiconductor substrate into which boron ions are implanted is, for example, approximately 2 μm.

Next, as shown in FIG. 17(a), the n-type emitter region 16 is formed in the surface of the p-type base region 12. FIG.

17(a) is a sectional view showing a sectional structure along a section line X-X' in the plan view of the IGBT partway through manufacturing shown in FIG. 17(b). Specifically, the n-type emitter region 16 is formed in the following way. The front surface of the semiconductor substrate is covered with a resist (not shown). Next, the resist is patterned using a photolithography technique, forming the resist mask 25 in which is opened a region in which the n-type emitter region 16 of the surface of the mesa region 47 is formed.

Then, with the resist mask 25 as a mask, an arsenic ion implantation is carried out under ion implantation conditions of an acceleration voltage in the region of, for example, 100 to 200 keV, and a dose in the region of, for example, $1 \times 10^{15}/cm^2$ to $5 \times 10^{15}/cm^2$. Next, after removing the resist mask 25, a thermal diffusion process is carried out at in the region of 1,000° C. As a result of this, the n-type emitter region 16 in contact with the gate trench 13 on the left side in the plane of the drawing, with which the p-type contact region 17 is not in contact, is formed from one portion of the p-type contact region 17 to the surface layer of the p-type base region 12, as shown in FIGS. 17(a) and 17(b).

Next, as shown in FIG. 18(a), the insulating film 18 is formed on the front surface of the semiconductor substrate, and the contact aperture portion 46 is formed in the insulating film 18. FIG. 18(a) is a sectional view showing a sectional structure along a section line X-X' in the plan view of the IGBT partway through manufacturing shown in FIG. 18(b). Specifically, after the insulating film 18 of BPSG (Boron Phospho Silicate Glass) or the like is deposited over the whole of the substrate, the contact aperture portion 46 is formed by a photolithography step and an anisotropic etching.

The object of forming the contact aperture portion 46 is to bring the n-type emitter region 16 and p-type contact region 17 formed on the front surface side of the semiconductor substrate into contact with the metal electrode (emitter electrode) 19 formed on the front surface of the semiconductor substrate. By forming the contact aperture portion 46 in the insulating film 18, the n-type emitter region 16 and p-type contact region 17 and the emitter electrode 19 are brought into contact, and the gate electrode 15 inside the gate trench 13 is covered with the insulating film 18.

At this time, the aperture width in the longitudinal direction of the gate trench 13 of the contact aperture portion 46 is greater than the length of the n-type emitter region 16. The dimension of the contact aperture portion 46 may be such that, for example, the aperture width in the longitudinal direction of the gate trench 13 of the contact aperture portion 46 is 4.5 µm with respect to a 5.0 µm length of the n-type emitter region 16. The length in the lateral direction of the gate trench 13 of the contact aperture portion may be 2 µm.

Subsequently, by depositing an unshown metal film of aluminum or the like on the front surface of the semiconductor substrate using sputtering, or the like, patterning in a photolithography step, and alloying, a metal electrode layer that forms the emitter electrode is formed over the whole of the active region. Furthermore, it is also preferable that a passivation film (not shown) is deposited over the whole of the chip surface as necessary.

As well as the heretofore described formation steps on the front surface of the semiconductor substrate, processing of the rear surface side of the semiconductor surface is necessary. Formation steps on the semiconductor substrate rear surface may be carried out in heretofore known steps. For example, the steps are as follows (omitted from the drawing). The semiconductor substrate is ground from the rear surface side of the semiconductor substrate to a predetermined thickness (for example, in the region of 80 to about 120 µm) determined in accordance with breakdown voltage. Next, an n-type buffer layer (or n-type field stop layer) and a p-type collector layer are formed, using an ion implantation and heat treatment, on the rear surface of the semiconductor substrate. Subsequently, a wafer stage vertical IGBT is completed by forming a collector electrode.

Figure 19:
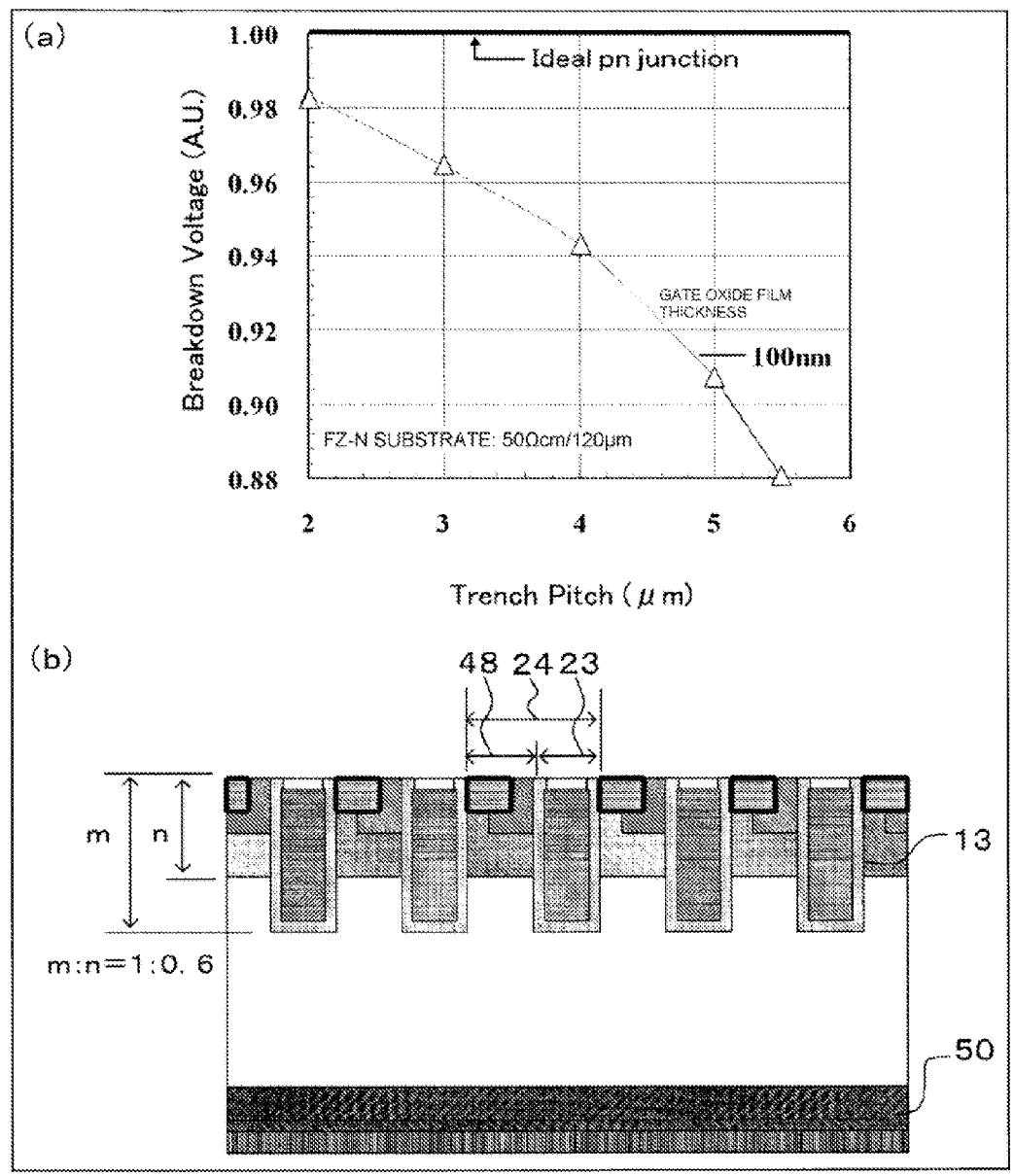
FIG. 19 is an explanatory diagram showing electrical characteristics of the semiconductor device according to Working Example 3 of the invention.
Figure 20:
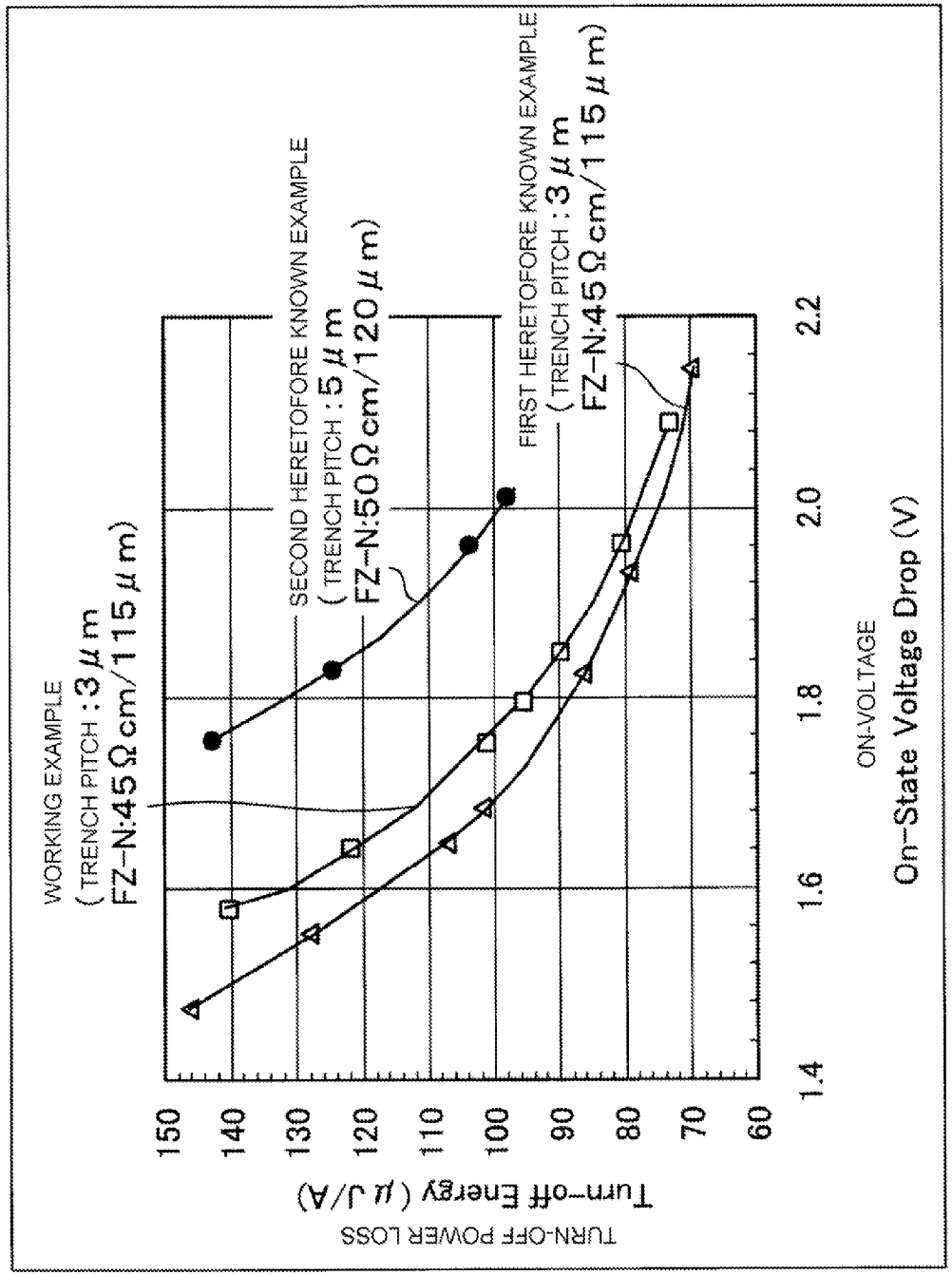
FIG. 20 is a characteristic diagram showing electrical characteristics of the semiconductor device according to Working Example 3 of the invention.
Figure 21:
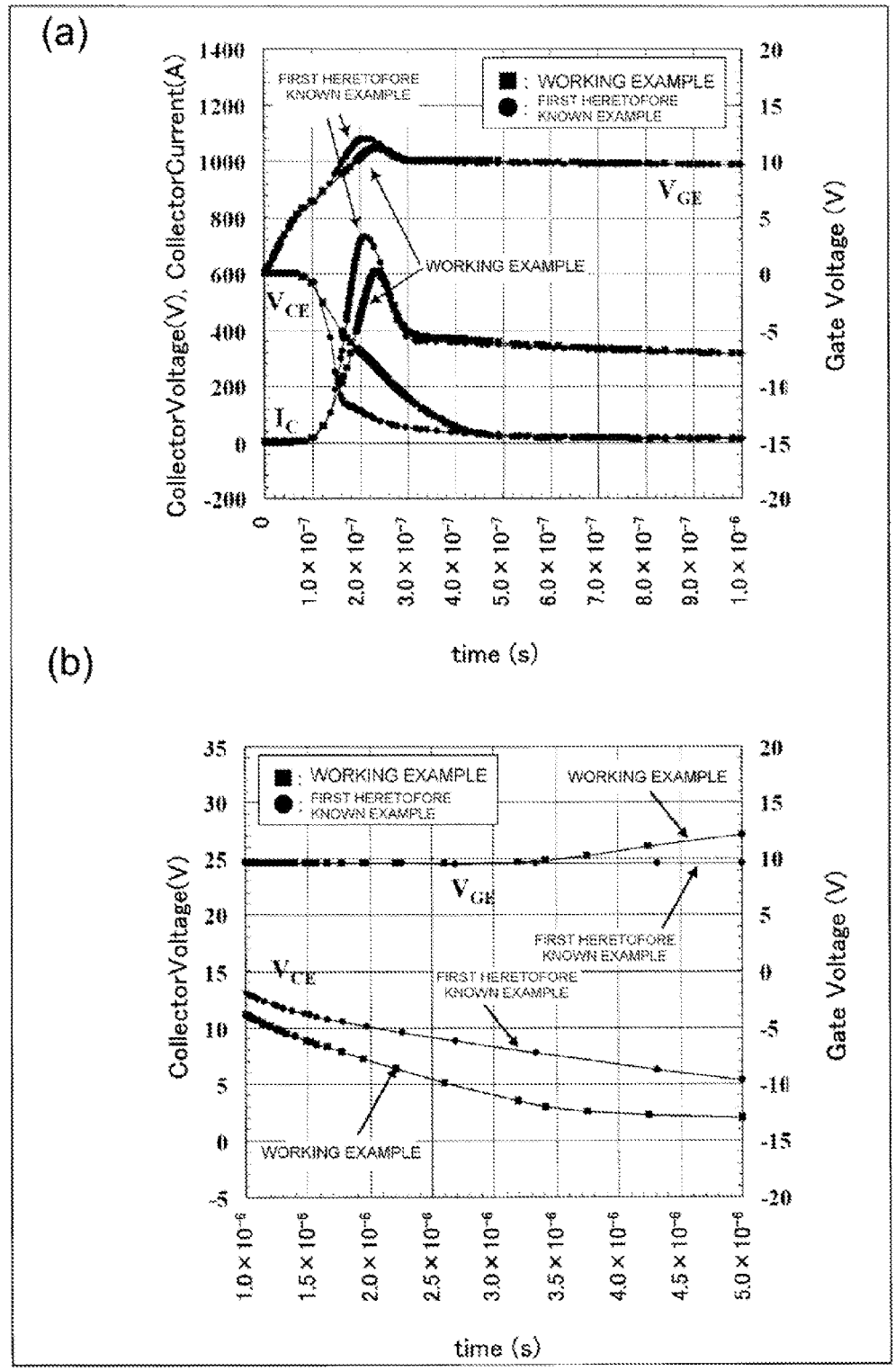
FIG. 21 is a characteristic diagram showing electrical characteristics of the semiconductor device according to Working Example 3 of the invention.

Next, using FIGS. 19 to 21, a description will be given of advantages obtained owing to characteristics of the IGBT according to Working Example 3. FIG. 19 is an explanatory diagram showing electrical characteristics of the semiconductor device according to Working Example 3 of the invention. FIGS. 20 and 21 are characteristic diagrams showing electrical characteristics of the semiconductor device according to Working Example 3. FIG. 19(a) shows the result of investigating the relationship between the trench pitch and breakdown voltage of the trench gate type IGBT according to Working Example 3. The vertical axis is the breakdown voltage normalized at the ideal breakdown voltage value of the p-n junction (ideal p-n junction=1). An FZ (floating zone)-N substrate with a resistivity of 50 Ωcm and a thickness of 120 µm is applied as the semiconductor substrate (n-type drift region 11).

FIG. 19(b) schematically shows the sectional structure of the IGBT applied in order to obtain the result of FIG. 19(a). The IGBT shown in FIG. 19(b) is an FS-IGBT structure having the n-type field stop region 50 on the collector layer side of the semiconductor substrate. In FIG. 19(a), a trench pitch 24 is variously changed between, for example, 2 and 6 µm by fixing a width 23 of the gate trench 13 in the lateral direction at 0.8 µm, and variously changing a width 48 of the mesa region 47 in the gate trench lateral direction. Also, a ratio m:n between the depth of the gate trench 13 and the depth of a portion of the gate trench 13 inside the p-type base region 12 is taken to be 1:0.6.

As is clear from the result shown in FIG. 19(a), it is found that the breakdown voltage rises as the trench pitch 24 becomes narrower, nearing the p-n junction ideal breakdown voltage value (when the vertical axis of FIG. 19(a) is 1). With the actual IGBT, there being no need to increase the breakdown voltage to the ideal breakdown voltage when the resistivity of the semiconductor substrate is 50 Ωcm and the thickness 120 µm, the IGBT can withstand practical use provided that it is possible to provide a certain predetermined breakdown voltage or higher. Because of this, the difference between a breakdown voltage that can be higher than a certain predetermined breakdown voltage and the predetermined breakdown voltage can be passed on to lowering the resistivity of the semiconductor substrate or reducing the thickness of the final semiconductor substrate.

Lowering the resistivity of the semiconductor substrate achieves the advantage of suppressing IGBT turn-off vibration. Also, reducing the thickness of the final semiconductor substrate achieves the advantage of enabling a reduction of one or both of the on-voltage and turn-off power loss, thus enabling an improvement in the trade-off relationship between the two. In particular, with a 1,200V class FS-IGBT, it is possible to use in the same way a semiconductor substrate with a resistivity of 45 Ωcm and a thickness of 115 µm, instead of a semiconductor substrate with a resistivity of 50 Ωcm and a thickness of 120 µm, by applying a front surface structure with a configuration wherein the trench pitch 24 is 3 µm or less.

Reducing the trench pitch 24 is difficult with the heretofore known IGBT. For example, as the width 23 of the gate trench 13 in the lateral direction is 0.8 µm, the width of the mesa region 47 in the gate trench lateral direction needs to be 2.2 µm when arranging that the trench pitch 24 is 3 µm. However, in order to reduce the width of the mesa region 47 in the gate trench lateral direction in the front surface structure of the heretofore known IGBT, it is necessary to apply a more expensive exposure device with which microfabrication is possible, or to apply a complicated processing step (for example, the previously described trench contact), as previously described in the problems to be solved. That is, the heretofore known IGBT is such that, as the minimum value of the trench pitch 24 is 5 μm when there is no change in the design rules, the minimum value of the width of the mesa region 47 in the gate trench lateral direction is 4.2 μm.

Meanwhile, as it is sufficient in the case of the IGBT according to Working Example 3 that the n-type emitter region is in contact with only one gate trench, it is possible to reduce the width of the mesa region 47 in the gate trench lateral direction. Specifically, the width in the gate trench lateral direction of the mesa region 47 of the IGBT according to Working Example 3 is, for example, 2.7 μm, which is in the region of one-third the width in the gate trench lateral direction of the mesa region of the heretofore known IGBT, and it is possible to reduce the trench pitch 24 to 3.5 μm.

Actually, as it is also possible for the width in the gate trench lateral direction of the p-type contact region 17 to be slightly less than the width in the gate trench lateral direction of the p-type contact region 17 of the heretofore known IGBT, it is possible to further reduce the width in the gate trench lateral direction of the mesa region 47 beyond one-third the width in the gate trench lateral direction of the mesa region of the heretofore known IGBT. Because of this, a trench pitch 24 of 3 μm is possible with the IGBT according to Working Example 3, even when there is no change in the design rules. With the IGBT according to Working Example 3, although a description has been carried out using an example wherein the trench pitch 24 is 3 μm, the trench pitch 24 may be 4 μm or less.

The reason that it is preferable for the trench pitch 24 to be 4 μm or less is that, in the drawing showing the relationship between the trench pitch 24 and breakdown voltage shown in FIG. 19, the degree of rise of the breakdown voltage in the region in which the trench pitch 24 is 4 μm or less is gentle. By the trench pitch 24 being 4 μm or less, not only is the breakdown voltage high, but it is also possible for variation of the breakdown voltage in response to the finished length of the trench pitch 24 to be weak, meaning that it is possible to prevent a large change in the breakdown voltage due to an error in the finished length of the trench pitch 24, which is advantageous.

Furthermore, the trench pitch 24 can also change appropriately in accordance with the width 23 of the gate trench in the lateral direction. For example, it is taken that the width 23 of the gate trench 13 in the lateral direction is 0.8 μm when the trench pitch 24 is 4 μm in the IGBT according to Working Example 3. At this time, when taking a value of the width 23 of the gate trench 13 in the lateral direction divided by the trench pitch 24 to be γ, γ is 0.2. When it is possible to make the width 23 of the gate trench 13 in the lateral direction less than 0.8 μm using a manufacturing device such as an exposure device, it is also necessary to reduce the width 48 of the mesa region 47 in the gate trench lateral direction.

The reason that it is necessary to reduce the width 48 of the mesa region 47 in the gate trench lateral direction in this way is that, in the event that the ratio of the width 48 of the mesa region 47 in the gate trench lateral direction with respect to the trench pitch 24 increases, and γ becomes greater than 0.2, the strength of the electrical field in the bottom portion of the gate trench 13 is liable to increase. Consequently, it being sufficient that at least γ is 0.2 or more, it is possible to maintain, or to reduce, the width 48 of the mesa region 47 in the gate trench lateral direction with respect to the trench pitch 24 by also appropriately changing the trench pitch 24 in accordance with the width 23 of the gate trench in the lateral direction, and therefore possible to prevent a drop in the breakdown voltage.

For example, in the event that the width 23 of the gate trench 13 in the lateral direction is 1.5 μm, it is sufficient for the trench pitch 24 to be 7.5 μm or less in order that γ is 0.2 or more. Also, in the event that the width 23 of the gate trench 13 in the lateral direction is 0.5 μm, it is sufficient for the trench pitch 24 to be 2.5 μm or less in order that γ is 0.2 or more. Further still, it is also possible for the trench pitch 24 to be 4 μm or less, preferably 3 μm or less, as previously described.

Next, a description will be given of trade-off characteristics of the IGBT according to Working Example 3. FIG. 20 is a characteristic diagram showing the relationship between the on-voltage and turn-off power loss of the semiconductor device according to Working Example 3. FIG. 20 shows a characteristic diagram wherein trade-off characteristics of a well-known on-voltage (an on-state voltage drop) and turn-off power loss (turn-off energy) are compared for the IGBT according to Working Example 3 and two kinds of heretofore known IGBT. The structure of the IGBT according to Working Example 3 is such that the trench pitch is 3 μm, while the resistivity and thickness of the semiconductor substrate are 45 Ωcm and 115 μm respectively (shown as the working example in FIG. 20. It is also shown in the same way as the working example in FIGS. 21 and 40).

With regard to the heretofore known IGBTs, one heretofore known IGBT is such that the trench pitch is 3 μm, while the resistivity and thickness of the semiconductor substrate are 45 Ωcm and 115 μm respectively (hereafter referred to as the IGBT of a first heretofore known example, and shown as the first heretofore known example in FIG. 20. It is also shown in the same way as the first heretofore known example in FIGS. 21 and 40). The other heretofore known IGBT is such that the trench pitch is 5 μm, while the resistivity and thickness of the semiconductor substrate are 50 Ωcm and 120 μm respectively (hereafter referred to as the IGBT of a second heretofore known example, and shown as the second heretofore known example in FIG. 20).

As is clear from FIG. 20, firstly, the IGBT of the second heretofore known example with the trench pitch of 5 μm has a turn-off loss with respect to the same on-voltage in the region of 30 to 40% higher in comparison with the other two IGBTs (the IGBT according to Working Example 3 and the IGBT of the first heretofore known example). That is, the trade-off characteristic curve is the farthest from the coordinate origin, and the trade-off characteristics are the worst. Meanwhile, it can be seen that with the IGBT according to Working Example 3, the trade-off characteristic curve is in the region of 10% nearer the origin for turn-off loss than the IGBT of the first heretofore known example with the same trench pitch (3 μm). That is, the IGBT according to the invention achieves the advantage of reducing the electrical loss more than the heretofore known IGBTs.

Furthermore, in the case of the same trench pitch (3 μm), it is necessary to apply a more expensive semiconductor device, semiconductor processing, and the like, in order to manufacture the IGBT of the first heretofore known example than for the IGBT according to the invention (for example, the IGBT according to Working Example 3). That is, the processing cost of the IGBT of the first heretofore known example increases. Meanwhile, according to the IGBT according to the invention, an advantage is obtained in that electrical loss is reduced without increasing the processing cost. For the heretofore described reasons, not only is electrical loss in the IGBT according to the invention less than in the heretofore known IGBTs, but it is also possible to provide the IGBT according to the invention with a low chip cost.

Next, a description will be given of turn-on characteristics of the IGBT according to Working Example 3. FIG. 21 is a characteristic diagram showing turn-on characteristics of the semiconductor device according to Working Example 3. FIG. 21(a) and FIG. 21(b) show turn-on waveform examples under inductance load conditions for the IGBT according to Working Example 3 (the working example) and the heretofore known IGBT with the trench pitch of 3 μm (the first heretofore known example). FIG. 21(a) shows turn-on waveforms at an earlier turn-on stage, while FIG. 21(b) shows turn-on waveforms at a later turn-on stage.

Also, in FIG. 21(a), a collector voltage $V_{CE}$ (Collector Voltage) and a collector current $I_C$ (Collector Current) are shown on the left side vertical axis, while a gate voltage $V_{GE}$ (Gate Voltage) is shown on the right side vertical axis. In FIG. 21(b), the collector voltage $V_{CE}$ (Collector Voltage) is shown on the left side vertical axis, while the gate voltage $V_{GE}$ (Gate Voltage) is shown on the right side vertical axis.

With the IGBT according to Working Example 3, a turn-on current change rate (di/dt) when turning on is kept small, as shown in FIG. 21(a). Because of this, the turn-on peak current is also small, and there is a soft turn-on waveform. Herein, a soft turn-on indicates that the turn-on current change rate (di/dt) and turn-on peak current are small. Meanwhile, with the IGBT of the first heretofore known example, the turn-on current change rate (di/dt) when turning on increases sharply, and the turn-on peak current is also high, forming a so-called hard turn-on waveform.

These kinds of IGBT turn-on characteristics have an effect on the characteristics of an opposing arm free wheeling diode (FWD). That is, when applying the IGBT according to Working Example 3, the FWD has a soft recovery, while when applying the IGBT of the first heretofore known example, the FWD has a hard recovery. Herein, a soft recovery indicates that a reverse recovery peak current (whose absolute value is virtually the same as that of the turn-on peak current) is small, and a temporal current change rate when the current subsequently decreases is also small. Furthermore, a soft recovery indicates that an overshoot of the diode anode-cathode voltage is also small.

A hard recovery is a reverse recovery phenomenon indicating tendencies the reverse of these tendencies. Generally, the harder the FWD recovery, the more likely the occurrence of destruction or a waveform oscillation phenomenon, meaning that a soft recovery is desirable. Bearing this point in mind, it can be seen that it is preferable that the IGBT according to Working Example 3 is applied. Of course, the same FWD soft recovery effect has been confirmed for the IGBTs according to the other working examples of the invention, as well as for the IGBT according to Working Example 3.

Next, a description will be given of reasons for the improvement in the turn-on characteristics of the IGBT according to the invention. The reason the turn-on waveform of the IGBT according to the invention (for example, the IGBT according to Working Example 3) is a softer waveform than that of the heretofore known IGBT (for example, the IGBT of the first heretofore known example) lies in the difference between the ratios (hereafter referred to as a Cies/Cres ratio) of the area (Cies) of the p-type base region in contact with the gate trench side wall and the area (Cres) of the n-type region (mainly the n-type drift region), excluding the emitter region, in contact with the gate trench side wall.

In a period of the earlier turn-on stage for which the collector current $I_C$ increases, a hole current flows into the region in which the n-type region (mainly the n-type drift region), excluding the n-type emitter region, is in contact with the gate trench side wall. As a result of this, the potential of the region into which the holes flow rises. The amount by which the potential rises is greater than the amount by which the gate potential rises. As a result of this, a charge quantity Q with which the gate electrode is charged owing to the increase in gate potential is expressed by the following Equation (1).

(Expression 1)

$$Q = C_{OX} V \qquad (1)$$

Herein, $C_{OX}$ represents the gate oxide film volume, while V represents the voltage. Bearing in mind that $C_{OX}$ is temporally constant, when differentiating both sides of Equation (1) with time, and substituting I=dQ/dt and $d(C_{OX}V)/dt = C_{OX}(dV/dt)$ into the differentiated equation, the following Equation (2) is obtained.

(Expression 2)

$$I = C_{OX}(dV/dt) \qquad (2)$$

That is, a displacement current caused by the potential change flows into the gate electrode. As the displacement current acts in such a way as to open an MOS channel, the smaller the Cies/Cres ratio of the IGBT, the more liable the gate voltage $V_{GE}$ is to rise. As a result of this, dV/dt increases in Equation (2). That is, when the Cies/Cres ratio decreases, the rise of the gate voltage $V_{GE}$ is suppressed. Meanwhile, an IGBT commonly utilizes the current limiting function of the MOS gate, controlling the saturation current value of the IGBT, in order to satisfy short circuit capability. A saturation current value $I_{sat}$ is expressed by the following Equation (3).

(Expression 3)

$$I_{sat} = [\mu_{ns} C_{OX} Z / \{2(1 - \alpha_{pnp}) L_{CH}\}](V_G - V_{th})^2 \qquad (3)$$

Herein, $\mu_{ns}$ represents the electron surface mobility, Z the total emitter width, $\alpha_{pnp}$ the current amplification rate, $L_{CH}$ the total channel length, $V_G$ the gate voltage, and $V_{th}$ a threshold value. In order to have a constant saturation current so as not to cause a change in other electrical characteristics (on-voltage, turn-off power loss, and the like), it is necessary that the total channel length $L_{CH}$ and gate threshold value $V_{th}$ are constant, and that the total emitter width Z is constant.

When applying the conditions for Equation (3) to the IGBT according to the invention, and not causing a change in the electrical characteristics of the heretofore known IGBT, the area of the n-type emitter region (approximately equal to the area of the inversion layer channel) in the whole of the active region is twice that in the heretofore known IGBT. Because of this, when the ratio (Cies/Cres ratio) between the input capacitance (Cies) and feedback capacitance (Cres) is taken to be β, β in the IGBT according to the invention is approximately twice as high compared with β in the heretofore known IGBT, and it is effectively possible to virtually reduce Cres by half.

Reducing β, which is the Cies/Cres ratio, has good effects on the turn-on waveform. One is that, as it is possible to suppress the current flowing into the gate electrode in Equation (2), the rise of the gate voltage $V_{GE}$ is suppressed. One more is that it is possible to accelerate the trough of the collector voltage $V_{CE}$ in the later turn-on stage. As shown in FIG. 21(b), the collector voltage $V_{CE}$ of the IGBT according to Working Example 3 decreases more quickly, swiftly nearing a steady on-condition. The reason for this is that, as expressed by the gate voltage ($V_{GE}$) shown in FIG. 21(b), the mirror period of the IGBT according to Working Example 3 finishes more quickly than that of the IGBT of the first heretofore known example, and the gate voltage $V_{GE}$ nears 15V, which is the drive voltage.

The mirror period depends on the Cres of the IGBT. Therefore, the quick finish of the turning on is an advantage owed to β in the IGBT according to the invention being smaller than β in the heretofore known IGBT. That is, the advantage of reducing β in the IGBT according to the invention is an advantage achieved by it being possible to reduce the area of the contact region in the region in which the n-type region (mainly the n-type drift region), excluding the n-type emitter region, is in contact with the gate trench side wall.

Figure 40:
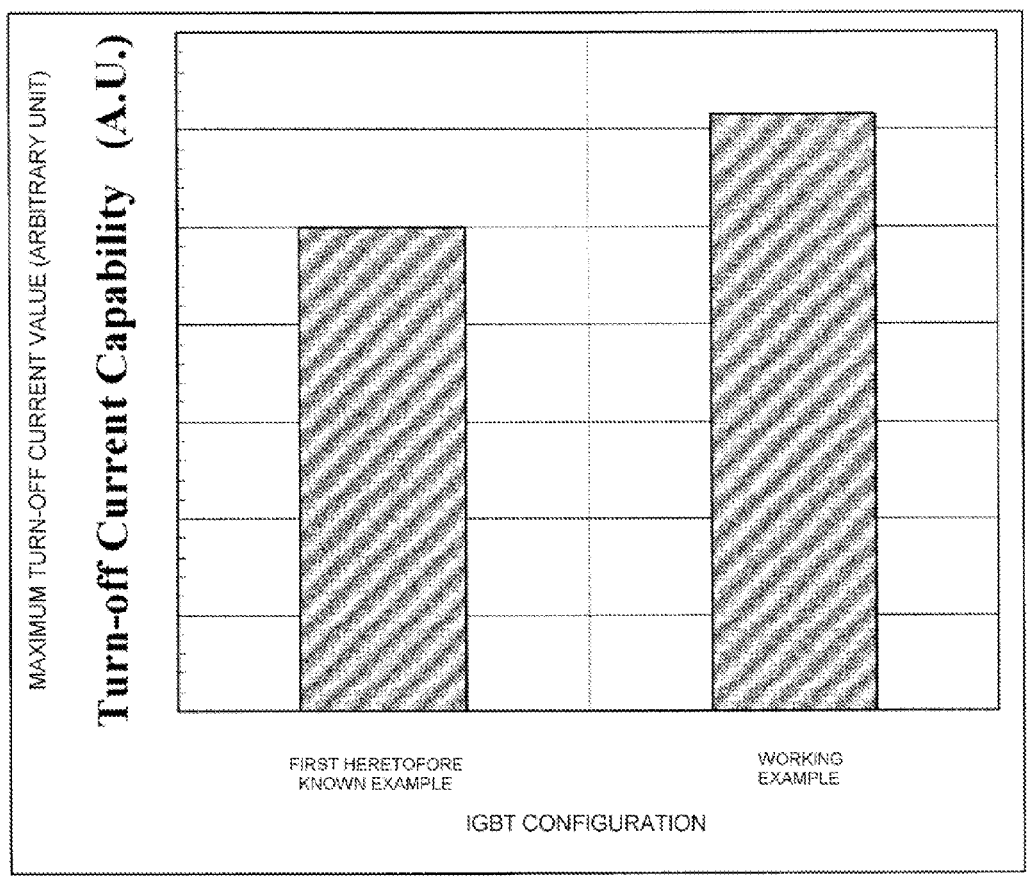
FIG. 40 is a characteristic diagram showing electrical characteristics of the semiconductor device according to Working Example 3 of the invention.

Next, a description will be given of the turn-off capability of the IGBT according to Working Example 3. FIG. 40 is a characteristic diagram showing electrical characteristics of the semiconductor device according to Working Example 3 of the invention. FIG. 40 shows a comparison of turn-off capability under inductance load conditions for the IGBT according to Working Example 3 (the working example) and the heretofore known IGBT with the trench pitch of 3 μm (the first heretofore known example). The turn-off capability is the maximum collector current value at which turn-off is possible at a certain power source voltage (shown in FIG. 40 as maximum turn-off current value: Turn-off Current Capability).

With both the IGBT according to Working Example 3 and the IGBT of the first heretofore known example, the gate voltage is 15V, the power source voltage is 600V, and the floating inductance is 80 nH. As shown in FIG. 40, it is found that the IGBT according to Working Example 3 can cut 1.2 times or more more current than the IGBT of the first heretofore known example. The advantage of the IGBT according to Working Example 3, as previously described, is an advantage achieved by a hole current concentrated in the bottom portion of the gate trench being dispersed, thus suppressing an increase in the electrical field strength when turning off.

Working Example 4

Figure 22:
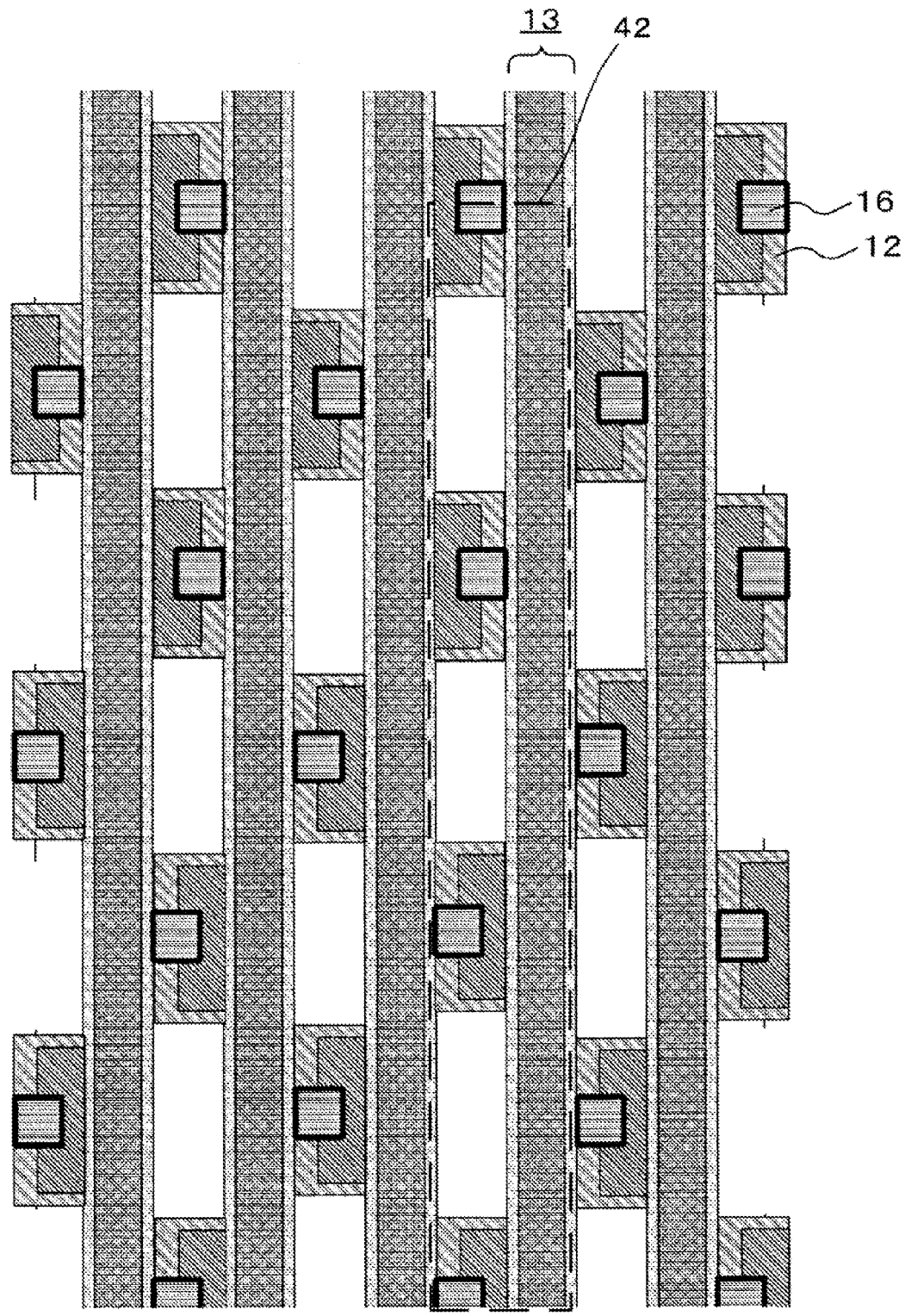
FIG. 22 is a plan view showing main portions of the semiconductor device according to Working Example 4 of the invention.

Next, a description will be given, using FIG. 22, of the IGBT according to Working Example 4 of the invention. FIG. 22 is a plan view showing main portions of the semiconductor device according to Working Example 4 of the invention. A change in the IGBT according to Working Example 4 with respect to the previously described basic structure of the invention is that there are double the number of p-type base regions 12 in the cycle of the n-type emitter region 16 being alternately in contact with the left and right side gate trenches 13. That is, of four p-type base regions 12 aligned in the gate trench longitudinal direction across the n-type drift region 11 in one mesa region, the n-type emitter region 16 in a first p-type base region 12 is caused to be in contact with the left side gate trench 13, and the n-type emitter region 16 in a second p-type base region 12 neighboring the p-type base region 12 in the longitudinal direction is caused to be in contact with the left side gate trench 13. Furthermore, the n-type emitter region 16 in a third p-type base region 12 neighboring the second p-type base region 12 is caused to be in contact with the right side gate trench 13, and the n-type emitter region 16 in a fourth p-type base region 12 neighboring the third p-type base region 12 is caused to be in contact with the right side gate trench 13. Because of this, the long cycle of the unit cell of the IGBT according to Working Example 4 is a dimension wherein four times the length in the gate trench longitudinal direction of the p-type base region 12 and three times the length in the gate trench longitudinal direction of the n-type drift region 11 between p-type base regions 12 neighboring each other in the trench longitudinal direction are added together. The short cycle of the unit cell of the IGBT according to Working Example 4 is the same as the short cycle of that of the IGBT according to Working Example 3.

Consequently, the four p-type base regions 12 aligned in the gate trench longitudinal direction in one mesa region 47 being included in the unit cell 42 of the IGBT according to Working Example 4, the total number of p-type base regions 12 in the unit cell 42 of the IGBT according to Working Example 4 is four. With this kind of configuration of the unit cell 42 too, it is possible to achieve the same advantage as with the IGBT according to Working Example 1. Furthermore, there may be three or more p-type base regions 12 in the cycle of the n-type emitter region 16 being alternately in contact with the left and right side gate trenches 13.

Working Example 5

Figure 23:
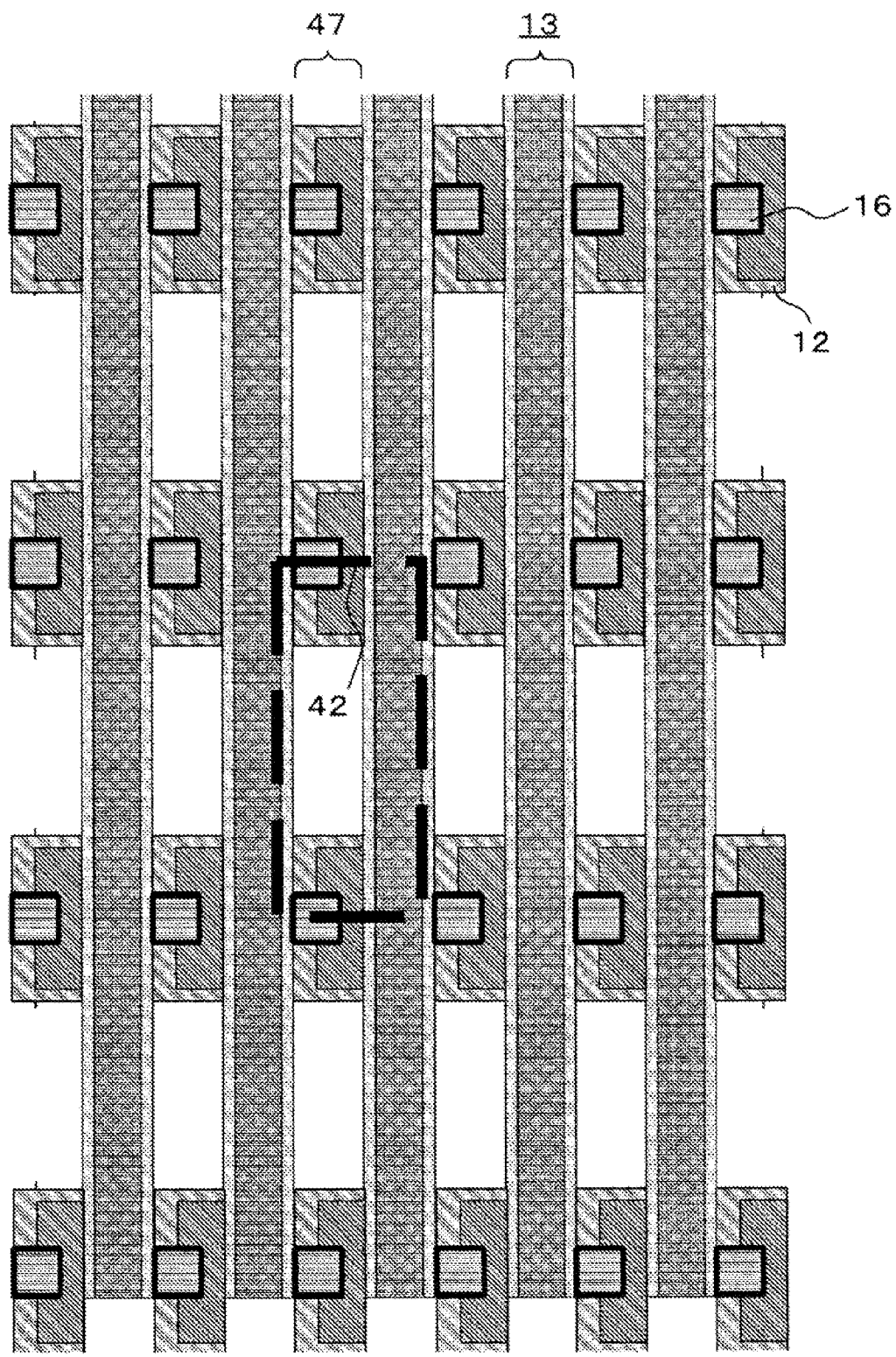
FIG. 23 is a plan view showing main portions of the semiconductor device according to Working Example 5 of the invention.

Next, a description will be given of the IGBT according to Working Example 5 of the invention as a preferred embodiment. FIG. 23 is a plan view showing main portions of the semiconductor device according to Working Example 5 of the invention. FIG. 23 is a plan view of a case in which one side disposition structures shown in FIG. 3(a) are cyclically disposed. As shown in FIG. 23, the IGBT according to Working Example 5 is an IGBT with a one side disposition structure. By using an IGBT with a one side disposition structure, the long cycle of the unit cell 42 of the IGBT according to Working Example 5 is a dimension wherein one each of the length in the gate trench longitudinal direction of the p-type base region 12 and the distance between p-type base regions 12 neighboring each other in the trench longitudinal direction are added together. The short cycle of the unit cell 42 of the IGBT according to Working Example 5 is the same as the short cycle of that of the IGBT according to Working Example 3. Because of this, there is one p-type base region 12 in the unit cell 42. As the n-type emitter region 16 is not in contact with one side wall of the two side walls of the gate trench 13 sandwiched by mesa regions 47, there always exists a side wall in each gate trench 13 in which no inversion layer channel is formed.

Figure 24:
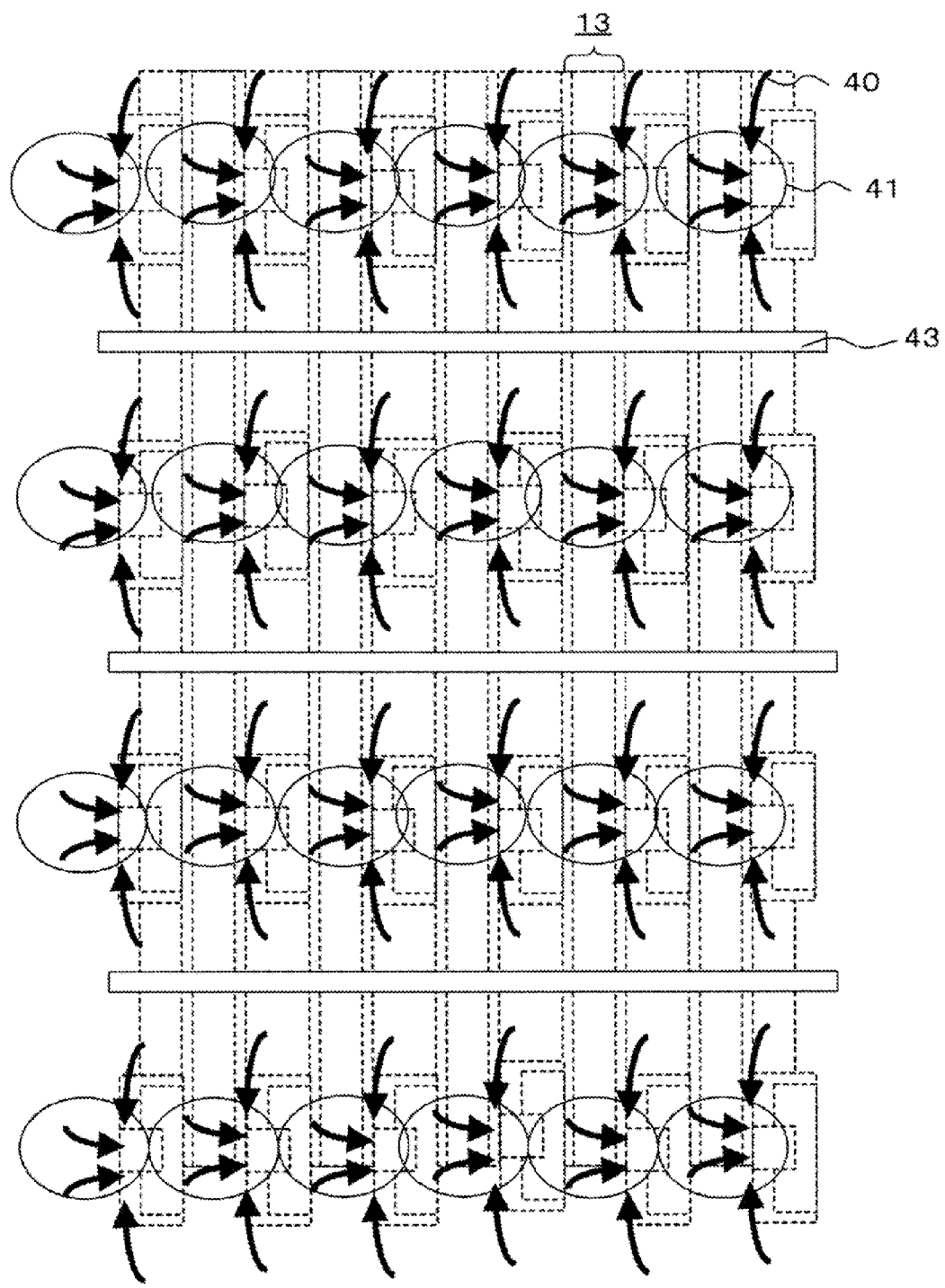
FIG. 24 is a plan view schematically showing current paths of the semiconductor device shown in FIG. 23.

FIG. 24 is a plan view schematically showing current paths of the semiconductor device shown in FIG. 23. FIG. 24 is a plan view wherein the flow 40 of a hole current flowing in a condition in which the gate electrode is on, the region 41 in which hole currents collect, and the region 43 in which the hole current is sparse, are schematically shown in the plan view of the IGBT according to Working Example 5 shown in FIG. 23. As shown in FIG. 24, in the IGBT according to Working Example 5, the region 41 in which hole currents collect is divided by the region 43 in which the hole current is sparse in the longitudinal direction of the gate trench 13, but the region 41 in which hole currents collect is formed continuously in the gate trench lateral direction, in the same way as in the IGBT according to Working Example 3. Because of this, the same advantages (augmentation of the IE effect, distribution of the electrical field strength when turning off and suppression of positive feedback thereof, and the like) as with the IGBT according to Working Example 3 are achieved.

Working Example 6

Figure 25:
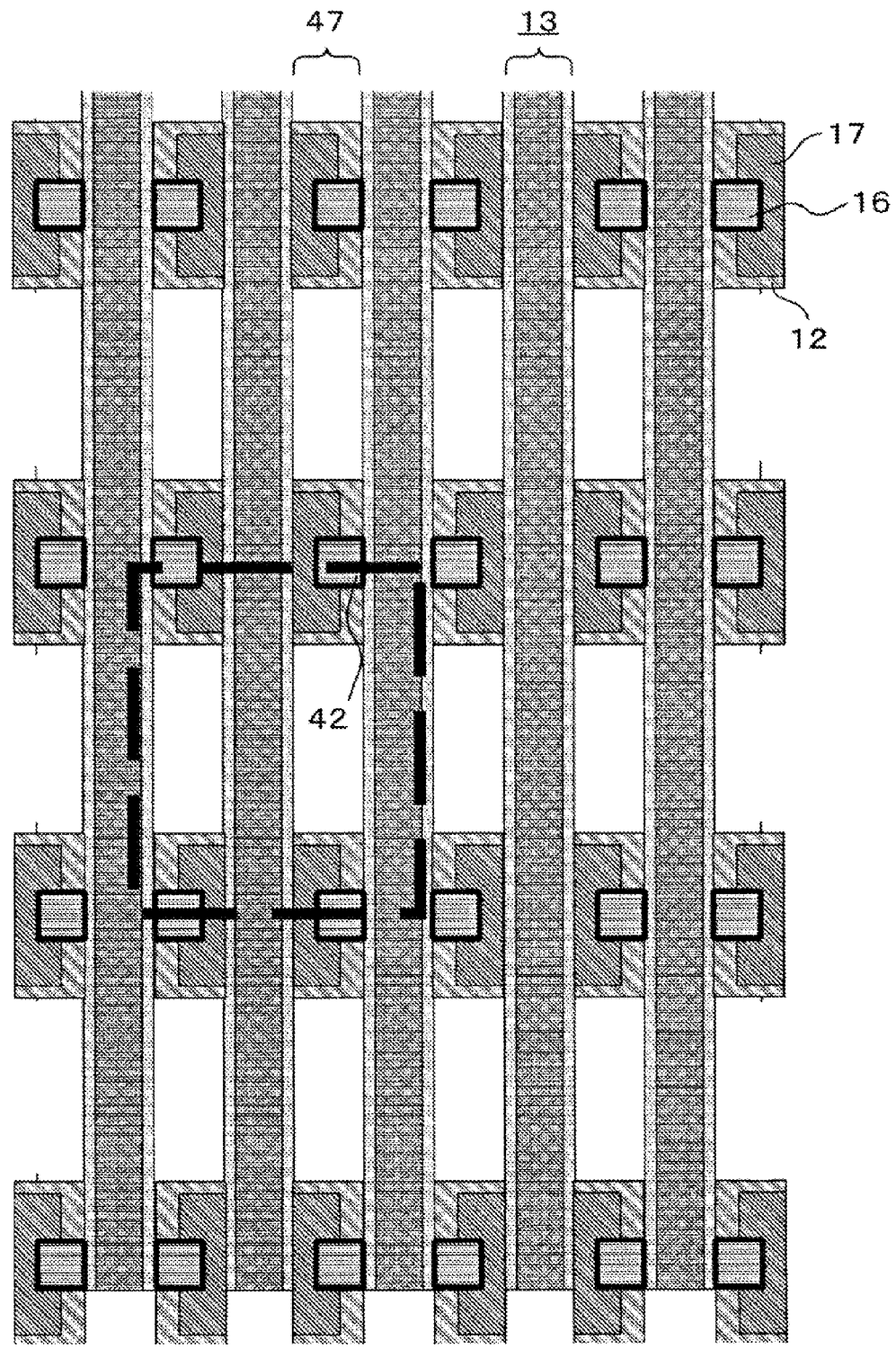
FIG. 25 is a plan view showing main portions of the semiconductor device according to Working Example 6 of the invention.

Next, a description will be given, using FIGS. 25 and 26, of the IGBT according to Working Example 6, which is a modification example of the IGBT according to Working Example 5 of the invention. FIG. 25 is a plan view showing main portions of the semiconductor device according to Working Example 6 of the invention. A difference from the IGBT according to Working Example 5 of the IGBT according to Working Example 6 is that the left and right in the plane of the drawing of the gate trench 13 with which the n-type emitter region 16 is in contact in neighboring mesa regions 47 is reversed.

As shown in FIG. 25, the short cycle of the unit cell 42 of the IGBT according to Working Example 6 is a length wherein two each of the width in the gate trench lateral direction of the p-type base region 12 and the lateral direction width of the gate trench 13 are added together. The long cycle of the unit cell 42 of the IGBT according to Working Example 6 is the same as the long cycle of that of the IGBT according to Working Example 5. That is, the unit cell 42 of the IGBT according to Working Example 6 has, as a unit structure, a structure wherein two of the unit cell of the IGBT according to Working Example 5 are caused to be adjacent in the gate trench lateral direction. Because of this, a total of two p-type base regions 12 are included in the unit cell 42 of the IGBT according to Working Example 6.

Figure 26:
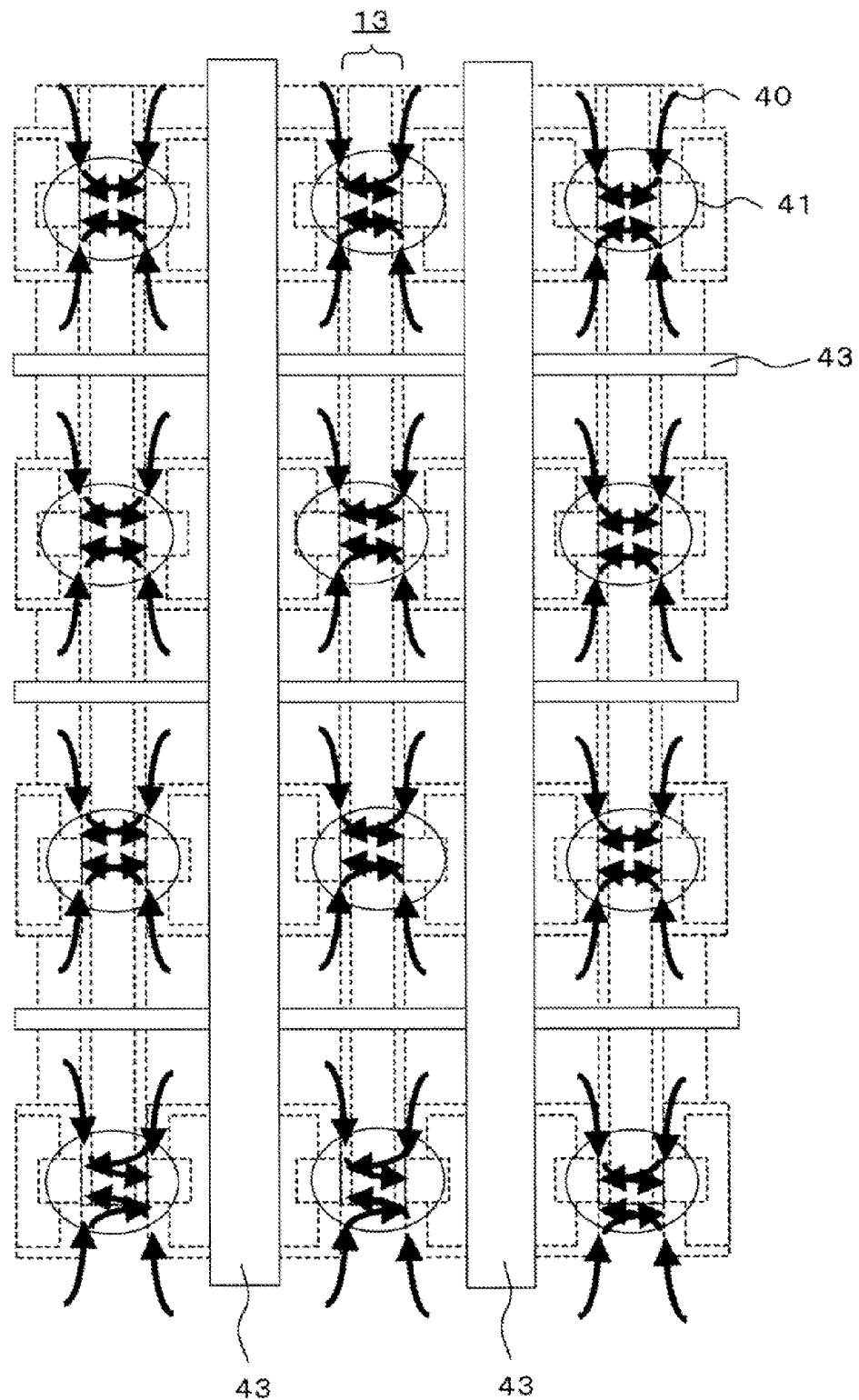
FIG. 26 is a plan view schematically showing current paths of the semiconductor device shown in FIG. 23.

FIG. 26 is a plan view schematically showing current paths of the semiconductor device shown in FIG. 25. FIG. 26 is a plan view wherein the flow 40 of a hole current flowing in a condition in which the gate electrode is on, the region 41 in which hole currents collect, and the region 43 in which the hole current is sparse, are schematically shown in the plan view of the IGBT according to Working Example 6 shown in FIG. 25. As shown in FIG. 26, in the IGBT according to Working Example 6, the region 41 in which hole currents collect is divided by the region 43 in which the hole current is sparse in both the longitudinal direction and lateral direction of the gate trench 13. Because of this, the degree of augmentation of the IE effect is slightly weaker in the IGBT according to Working Example 6 in comparison with that in the IGBT according to Working Example 5. However, in the IGBT according to Working Example 6, the trench pitch of the gate trench 13 is short in comparison with that in the heretofore known IGBT, and the area of the inversion layer channel in the active region is also in the region of twice as large. As a result of this, the on-voltage is lower than in the heretofore known IGBT. Also, the advantages of dispersing the electrical field strength when turning off and suppressing positive feedback with the IGBT according to Working Example 6 are the same as with the IGBT according to Working Example 5.

Working Example 7

Figure 27:
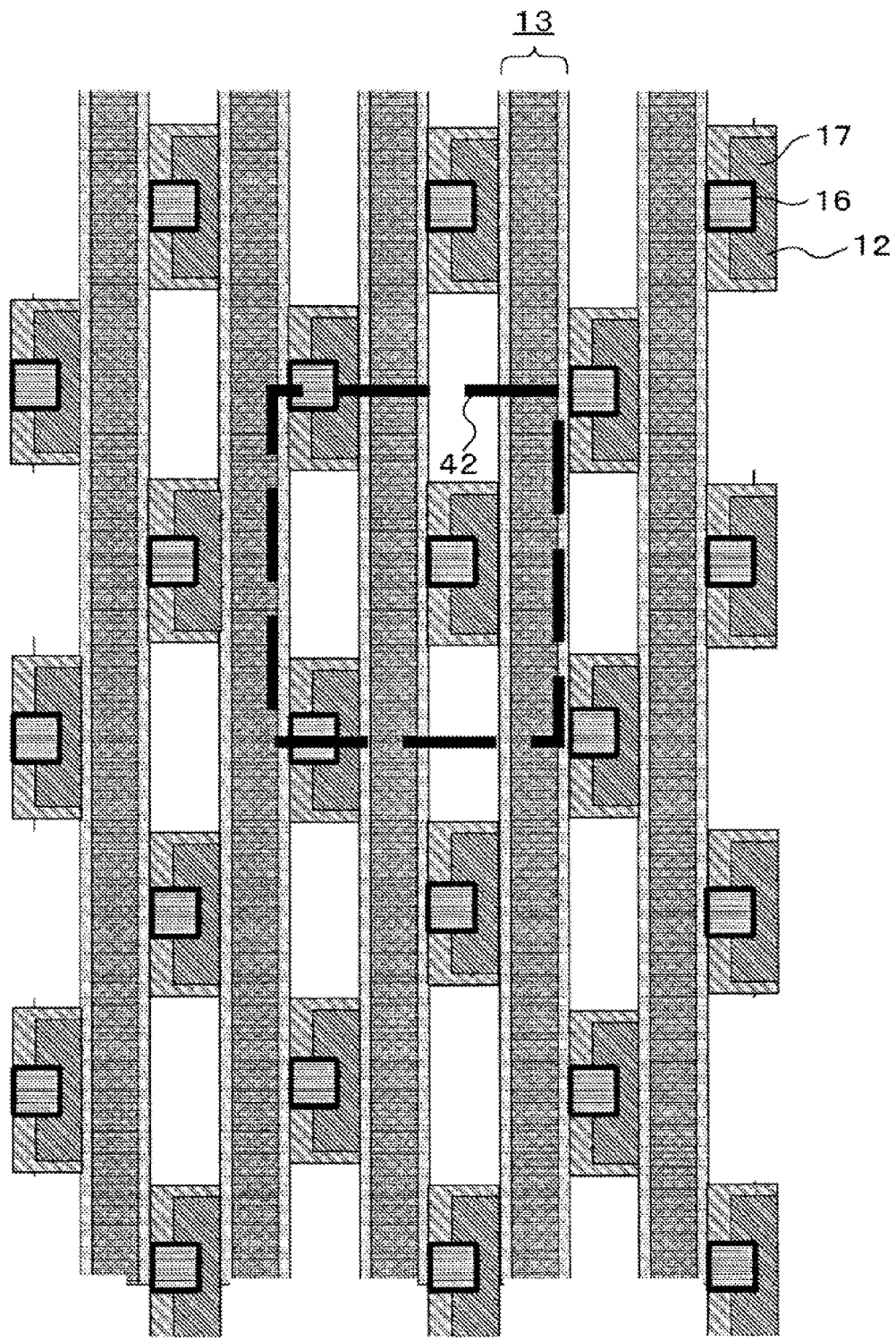
FIG. 27 is a plan view showing main portions of the semiconductor device according to Working Example 7 of the invention.

Next, a description will be given, using FIGS. 27 and 28, of the IGBT according to Working Example 7, which is a modification example of the IGBT according to Working Example 5 of the invention. FIG. 27 is a plan view showing main portions of the semiconductor device according to Working Example 7 of the invention. A difference from the IGBT according to Working Example 5 of the IGBT according to Working Example 7 is that the p-type base regions 12 are disposed in a check pattern form in which the p-type base regions 12 are alternately disposed in neighboring mesa regions 47. Because of this, in the unit cell 42 of the IGBT according to Working Example 7, the p-type base region 12 disposed in a certain mesa region 47 is disposed so as to neighbor the n-type drift region 11 of the mesa region 47 neighboring the mesa region 47 across the gate trench 13, as shown in FIG. 27.

Figure 28:
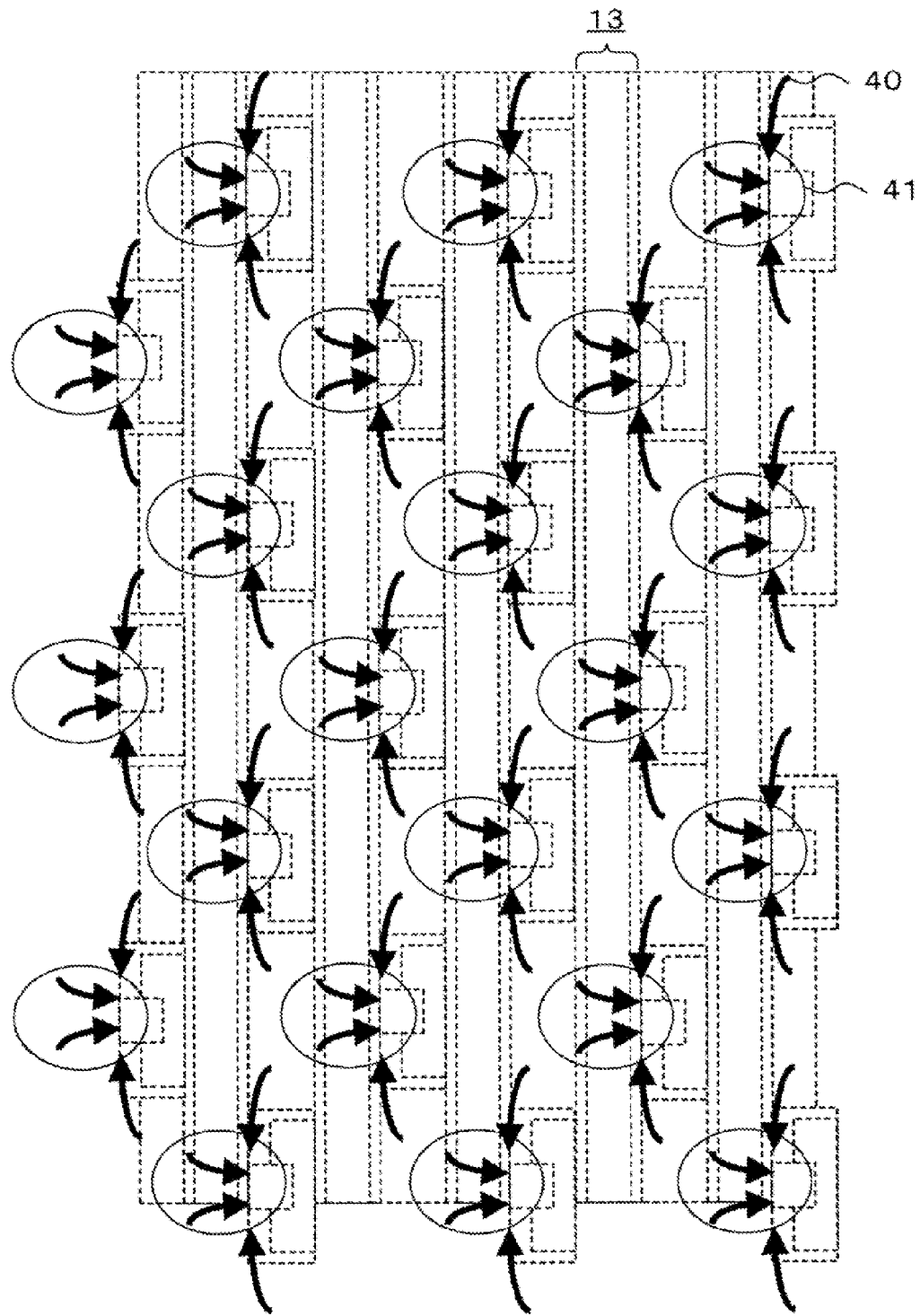
FIG. 28 is a plan view schematically showing current paths of the semiconductor device shown in FIG. 27.

FIG. 28 is a plan view schematically showing current paths of the semiconductor device shown in FIG. 27. FIG. 28 is a plan view wherein the flow 40 of a hole current flowing in a condition in which the gate electrode is on, and the region 41 in which hole currents collect, are schematically shown in the plan view of the IGBT according to Working Example 7 shown in FIG. 27. As shown in FIG. 28, the region 41 in which hole currents collect is evenly disposed in both the longitudinal direction and lateral direction of the gate trench 13.

That is, as no region in which the hole current is sparse is formed in the IGBT according to Working Example 7, the region 41 in which hole currents collect is not divided by a region in which the hole current is sparse. Because of this, the same advantage of augmenting the IE effect is obtained with the IGBT according to Working Example 7 as with the IGBT according to Working Example 1, as a result of which, a sufficiently small on-voltage is obtained. Also, the advantages of dispersing the electrical field strength when turning off and suppressing positive feedback with the IGBT according to Working Example 7 are the same as with the IGBT according to Working Example 1.

Working Example 8

Figure 29:
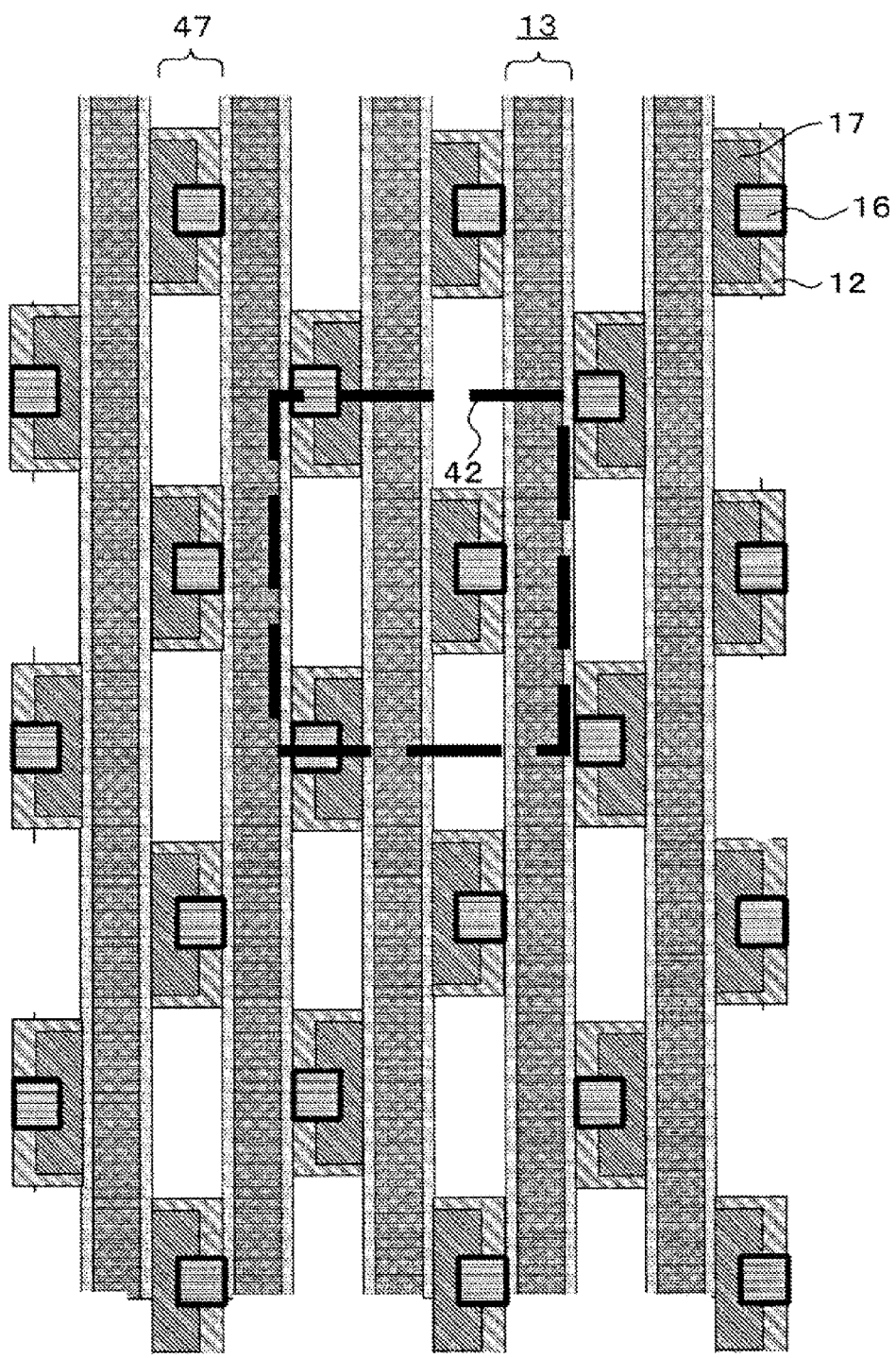
FIG. 29 is a plan view showing main portions of the semiconductor device according to Working Example 8 of the invention.

Next, a description will be given, using FIGS. 29 and 30, of the IGBT according to Working Example 8, which is a modification example of the IGBT according to Working Example 7 of the invention. FIG. 29 is a plan view showing main portions of the semiconductor device according to Working Example 8 of the invention. A difference from the IGBT according to Working Example 7 of the IGBT according to Working Example 8 is that the left and right in the plane of the drawing of the gate trench 13 with which the n-type emitter region 16 is in contact in neighboring mesa regions 47 is reversed. As shown in FIG. 29, in the unit cell 42 of the IGBT according to Working Example 8, the n-type emitter regions 16 disposed in mesa regions 47 neighboring each other across the gate trench 13 are in contact with the left side gate trench 13 in one mesa region 47 and the right side gate trench 13 in the other mesa region 47.

Figure 30:
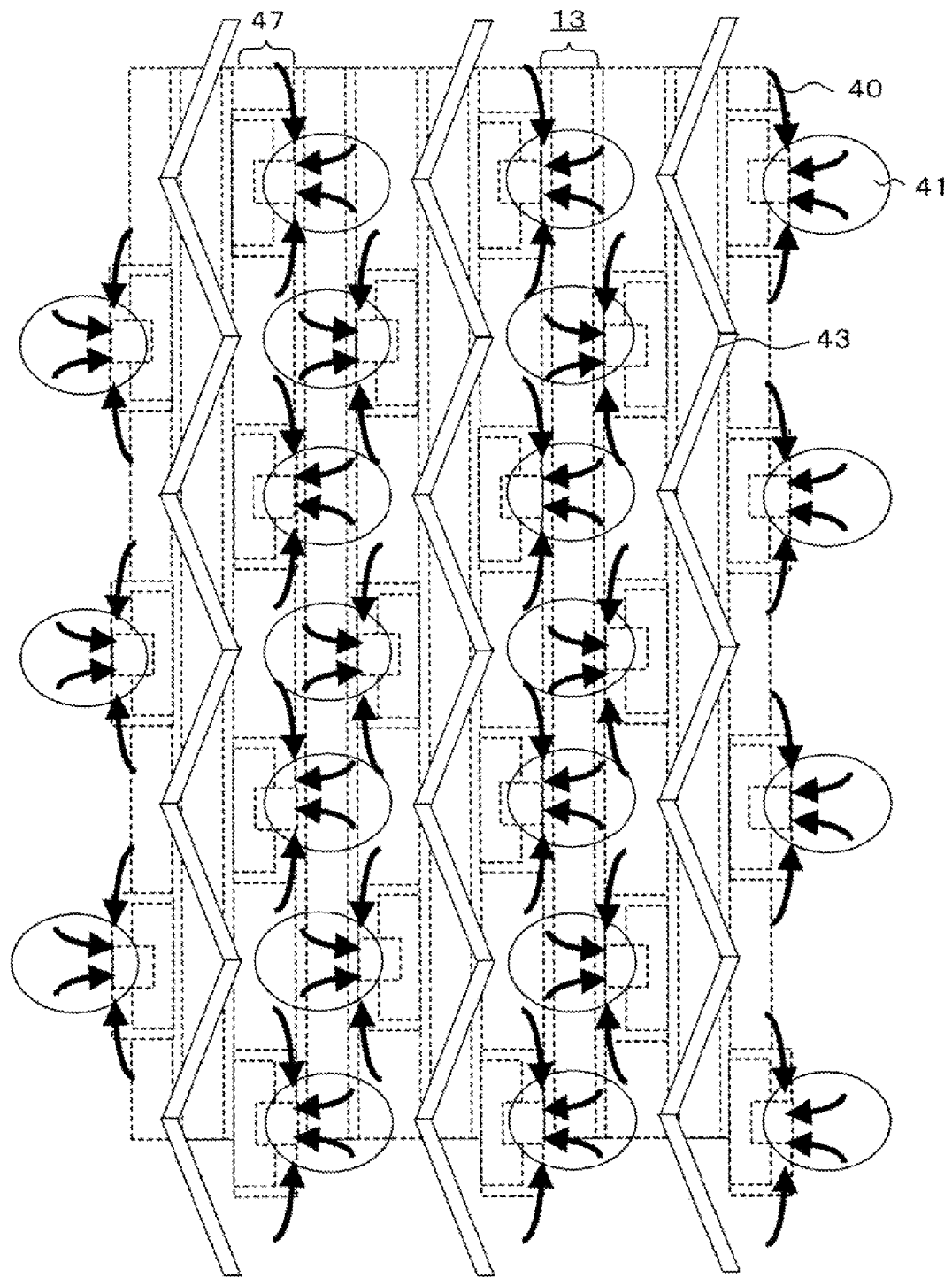
FIG. 30 is a plan view schematically showing current paths of the semiconductor device shown in FIG. 29.

FIG. 30 is a plan view schematically showing current paths of the semiconductor device shown in FIG. 29. FIG. 30 is a plan view wherein the flow 40 of a hole current flowing in a condition in which the gate electrode is on, the region 41 in which hole currents collect, and the region 43 in which the hole current is sparse, are schematically shown in the plan view of the IGBT according to Working Example 8 shown in FIG. 29. As shown in FIG. 30, in the IGBT according to Working Example 8, the region 41 in which hole currents collect is divided by the region 43 in which the hole current is sparse in the lateral direction of the gate trench 13. Meanwhile, the region 41 in which hole currents collect is formed continuously in the longitudinal direction of the gate trench 13.

This kind of distribution of the region 41 in which hole currents collect and region 43 in which the hole current is sparse in the IGBT according to Working Example 8 is similar to that in the heretofore known IGBT. However, in the IGBT according to Working Example 8, the trench pitch of the gate trench 13 is short in comparison with that in the heretofore known IGBT, and the area of the inversion layer channel in the active region is also in the region of twice as large. As a result of this, the on-voltage is lower than in the heretofore known IGBT.

Also, the advantages of dispersing the electrical field strength when turning off and suppressing positive feedback with the IGBT according to Working Example 8 are more markedly suppressed than with the heretofore known IGBT. The reason for this is that the region 43 in which the hole current is sparse is formed in the gate trench 13 (every other one), rather than in the p-type base region. That is, whereas the region 41 in which hole currents collect is formed in every gate trench 13 in the heretofore known IGBT, the region 41 in which hole currents collect is formed in every other gate trench 13 in the IGBT according to Working Example 8. As a result of this, hole concentration is reduced in the IGBT according to Working Example 8, and the augmentation by the holes of the electrical field strength in the bottom portion of the gate trench 13 is suppressed.

Figure 31:
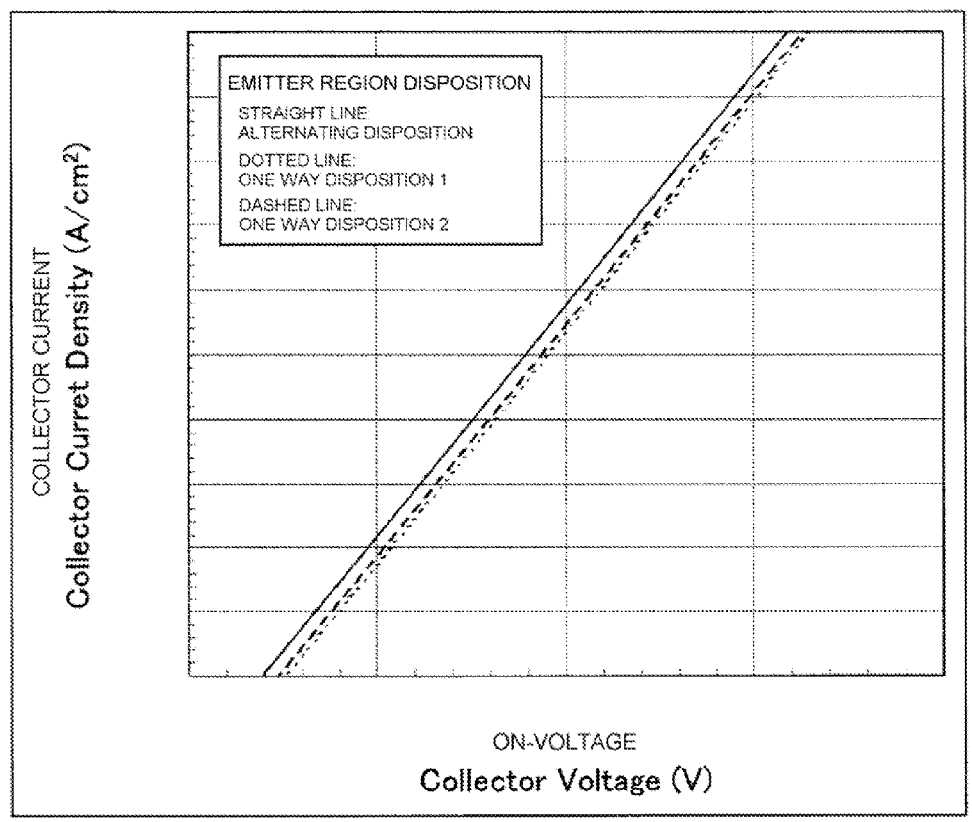
FIG. 31 is a characteristic diagram showing electrical characteristics of the semiconductor devices according to Working Examples 1, 7, and 8 of the invention.

Herein, a description will be given of differences between the on-voltage in the IGBT according to Working Example 8 and those in the IGBT according to Working Example 7 and IGBT according to Working Example 1. FIG. 31 is a characteristic diagram showing electrical characteristics of the semiconductor devices according to Working Examples 1, 7, and 8 of the invention. FIG. 31 is a curve (I-V curve) of the on-voltage (Collector Voltage) and collector current (Collector Current Density) in the IGBTs according to the three Working Examples 1, 7, and 8. In FIG. 31, the I-V curve of the IGBT according to Working Example 1 is indicated by a straight line (alternating disposition). The I-V curve of the IGBT according to Working Example 7 is indicated by a dashed line (one way disposition 2). The I-V curve of the IGBT according to Working Example 8 is indicated by a dotted line (one way disposition 1).

Of the IGBTs according to Working Examples 1, 7, and 8, the one with the lowest on-voltage is the IGBT according to Working Example 1. Also, although the on-voltages of the IGBT according to Working Example 7 and IGBT according to Working Example 8 are similar, the on-voltage of the IGBT according to Working Example 7 is lower than the on-voltage of the IGBT according to Working Example 8. The reason that the on-voltage of the IGBT according to Working Example 7 is higher than that of the IGBT according to Working Example 1 is that no inversion layer channel is formed on one side wall of the side walls of the gate trench 13 in every gate trench 13.

That is, the degree of hole collection in the distribution of the region 41 in which hole currents collect of the IGBT according to Working Example 7 schematically shown in FIG. 28 is weaker than in the distribution of the region in which hole currents collect of the IGBT according to Working Example 1. Because of this, if anything, it is preferable that the way in which the n-type emitter region 16 is in contact with the gate trench 13 is that it is alternately in contact with the left and right gate trenches 13 (for example, the IGBT according to Working Example 1). Of course, when the n-type emitter region 16 is in contact with the gate trench 13 on one side too, as in the IGBTs according to Working Examples 7 and 8, a more preferable operational advantage than with the heretofore known IGBT arises.

Working Example 9

Figure 32:
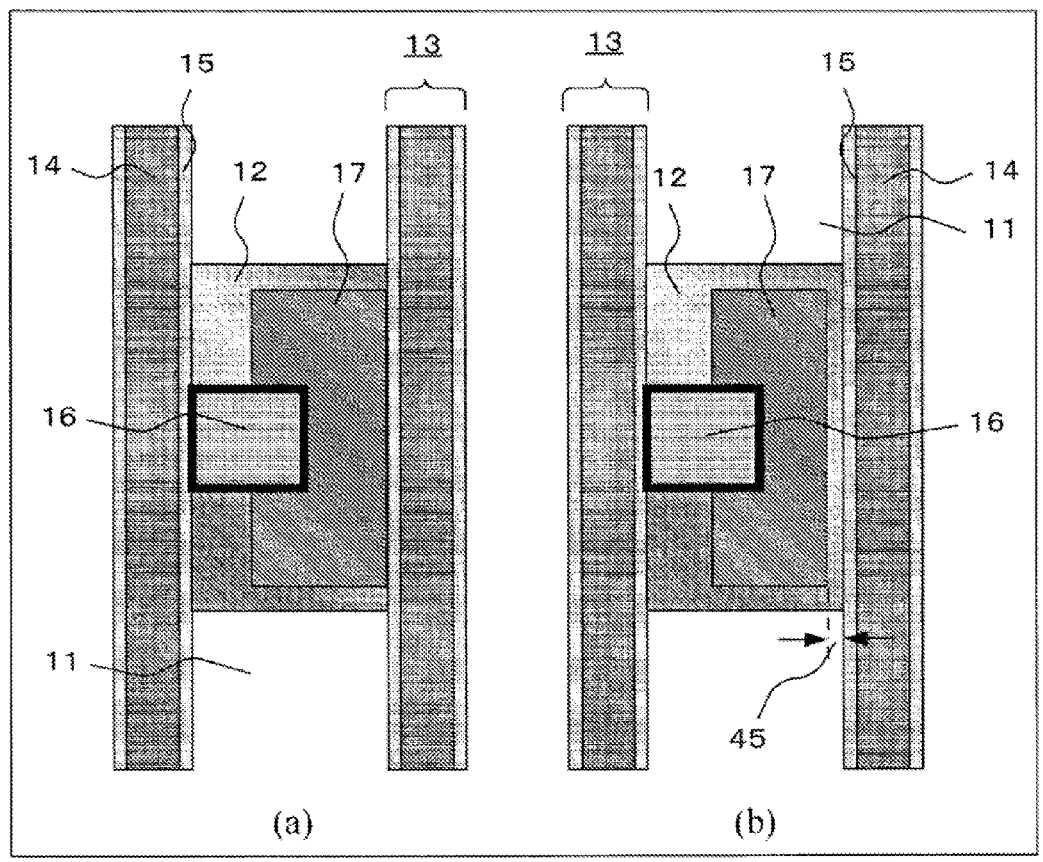
FIG. 32 is a plan view showing main portions of the semiconductor device according to Working Example 9 of the invention.

Next, a description will be given, using FIG. 32, of the IGBT according to Working Example 9. FIG. 32 is a plan view showing main portions of the semiconductor device according to Working Example 9 of the invention. The IGBT according to Working Example 9 is applied to the IGBTs according to all the working examples of the invention described thus far. The IGBT according to Working Example 9 may have a structure wherein the p-type contact region 17 is in contact with the gate trench 13b, as shown in FIG. 32(a), or may have a structure wherein the p-type contact region 17 is distanced from the gate trench 13b across a slight distancing region 45, as shown in FIG. 32(b).

With either structure of the structures of the IGBT according to Working Example 9 shown in FIGS. 32(a) and 32(b), the kinds of various advantage heretofore described using the IGBTs according to the working examples of the invention are achieved. In particular, with the structure wherein the p-type contact region 17 is in contact with the gate trench 13b, as shown in FIG. 32(a), the advantage of withdrawing holes when turning off (the holes passing out from the p-type base region to the emitter electrode through the p-type contact region 17) is easily achieved.

That is, as a slight amount of resistance is generated in the distancing region 45 of the p-type contact region 17 and the gate trench 13b with the structure wherein the p-type contact region 17 is distanced from the gate trench 13b, as shown in FIG. 32(b), the ratio of holes heading toward the gate trench 13b decreases slightly. The structure shown in FIG. 32(a) wherein the p-type contact region 17 is in contact with the gate trench 13b is preferable because, as the amount of resistance generated in the distancing region 45 of the p-type contact region 17 and the gate trench 13b does not exist, the latch-up capability increases a little.

For the IGBTs according to the working examples thus far, a description has been given of a case wherein the rated voltage is 1,200V but, not being limited to this, the same advantages are also achieved with other rated voltages, for example, 600V, 1,700 V, 3,300V, or 6,500V. In particular, as the resistivity of the semiconductor is high (100 Ωcm or more) with a so-called high breakdown voltage class of 3,300V or more, an increase in hole concentration when turning off directly causes an increase in electrical field strength. Therefore, using the IGBT according to the invention is more preferable as regions in which hole currents collect are evenly dispersed, and it is possible, particularly in the bottom portion of the gate trench, to suppress the increase in electrical field strength when turning off.

INDUSTRIAL APPLICABILITY

As heretofore described, the semiconductor device according to the invention is particularly useful in an insulated gate semiconductor device (IGBT) used in a power conversion device, or the like.

REFERENCE NUMERALS AND SIGNS 11 n-type drift region
12, 12a, 12b, 12c p-type base region
13, 13a, 13b, 13c Gate trench
14 Gate oxide film
14a Screen oxide film
15 Gate electrode
16, 16a, 16b, 16c n-type emitter region
17, 17a, 17b p-type contact region
18 Insulating film
19 Emitter electrode
22 Collector electrode
23 Gate trench width
24 Trench pitch
25 Resist mask
30 Oxide film
40, 40a Hole current flow
41, 41a Region in which hole currents collect
42 Unit cell
43 Region in which hole current is sparse
45 Distancing region
46 Contact aperture portion
47, 47a, 47b, 47c Mesa region 48 Mesa region width
50 n-type field stop region
51 p-type collector region

The invention claimed is:

1. A semiconductor device, characterized by including:
a first semiconductor layer formed of a first conductivity type semiconductor substrate;
at least two trenches, formed in one main surface of the first semiconductor layer, arranged in parallel to each other in stripe form;
a gate electrode formed across an insulating film in the trenches;
a plurality of second conductivity type second semiconductor layers selectively formed in the longitudinal direction of the trench of the surface layer of the first semiconductor layer sandwiched between the trenches;
a first conductivity type third semiconductor layer selectively formed in the surface layer of the second semiconductor layer;
a second conductivity type fourth semiconductor layer, with an impurity concentration higher than that of the second semiconductor layer, selectively formed in the surface layer of the second semiconductor layer;
an emitter electrode, formed on the one main surface of the first semiconductor substrate, in contact with the third semiconductor layer;
a second conductivity type fifth semiconductor layer provided on the other main surface of the first semiconductor substrate; and
a collector electrode in contact with the fifth semiconductor layer, wherein
the third semiconductor layer is in contact with one trench of neighboring trenches, and distanced from the other trench, at least one portion of the edge portion on the other trench side of the third semiconductor layer terminates inside the fourth semiconductor layer, and
the length of the fourth semiconductor layer in the longitudinal direction of the trench is greater than the length of the third semiconductor layer in the longitudinal direction of the trench.

2. The semiconductor device according to claim 1, characterized in that each of the third semiconductor layers formed in each of the second semiconductor layers neighboring each other in the longitudinal direction of the trench between the neighboring trenches is in contact with the same one of either the one trench or the other trench.

3. The semiconductor device according to claim 1, characterized in that each of the third semiconductor layers formed in each of the second semiconductor layers neighboring each other in the longitudinal direction of the trench between the neighboring trenches is in contact with a differing one of the neighboring trenches.

4. The semiconductor device according to claim 2, characterized in that there are at least three or more trenches, and the second semiconductor layers and first semiconductor layers are alternately disposed across the trench in the lateral direction of the trench.

5. The semiconductor device according to claim 3, characterized in that there are at least three or more trenches, and the second semiconductor layers and first semiconductor layers are alternately disposed across the trench in the lateral direction of the trench.

6. The semiconductor device according to claim 2, characterized in that there are at least three or more trenches, and the second semiconductor layers are disposed aligned across the trench in the lateral direction of the trench.

7. The semiconductor device according to claim 3, characterized in that there are at least three or more trenches, and the second semiconductor layers are disposed aligned across the trench in the lateral direction of the trench.

8. The semiconductor device according to claim 1, characterized in that the fourth semiconductor layer is in contact with the other one of the neighboring trenches.

9. The semiconductor device according to claim 1, characterized in that a value of the width in the lateral direction of the trench divided by a pitch length, wherein the width in the lateral direction of the trench and the width of a semiconductor region from the trench to a side wall of a neighboring trench are added together, is 0.2 or more.

10. The semiconductor device according to claim 9, characterized in that the pitch length is 4 μm or less.

11. The semiconductor device according to claim 10, characterized in that the pitch length is 3 μm or less.

* * * * *